US 6,572,732 B2

(12) United States Patent
Collins

(10) Patent No.: US 6,572,732 B2
(45) Date of Patent: Jun. 3, 2003

(54) PARALLEL-PLATE ELECTRODE PLASMA REACTOR HAVING AN INDUCTIVE ANTENNA COUPLING POWER THROUGH A PARALLEL PLATE ELECTRODE

(75) Inventor: Kenneth S. Collins, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/002,940

(22) Filed: Nov. 27, 2001

(65) Prior Publication Data

US 2002/0092618 A1 Jul. 18, 2002

Related U.S. Application Data

(62) Division of application No. 08/936,028, filed on Sep. 23, 1997, now Pat. No. 6,361,644, which is a continuation of application No. 08/521,668, filed on Aug. 31, 1995, now abandoned, which is a continuation-in-part of application No. 08/289,336, filed on Aug. 19, 1994, now abandoned, which is a continuation of application No. 07/984,045, filed on Dec. 1, 1992, now abandoned.

(51) Int. Cl.[7] ............................ H01L 21/00; H05H 1/00
(52) U.S. Cl. ............................... 156/345.48; 118/723 I
(58) Field of Search .................. 156/345.48; 118/723 I, 118/723 IR

(56) References Cited

U.S. PATENT DOCUMENTS

| 4,123,316 A | 10/1978 | Tsuchimoto |
| 4,261,762 A | 4/1981 | King |
| 4,350,578 A | 9/1982 | Frieser et al. |
| 4,368,092 A | 1/1983 | Steinberg et al. |
| 4,371,412 A | 2/1983 | Nishizawa |
| 4,427,516 A | 1/1984 | Levinstein et al. |
| 4,427,762 A | 1/1984 | Takahashi et al. |
| 4,430,547 A | 2/1984 | Yoneda et al. |
| 4,457,359 A | 7/1984 | Holden |
| 4,512,391 A | 4/1985 | Harra |
| 4,565,601 A | 1/1986 | Kakehi et al. |
| 4,572,759 A | 2/1986 | Benzing |
| 4,579,080 A | 4/1986 | Martin et al. |

(List continued on next page.)

FOREIGN PATENT DOCUMENTS

| DE | 39 42964 A1 | 6/1991 |
| EP | 0 403 418 A2 | 12/1990 |
| EP | 0 413 282 A2 | 2/1991 |

(List continued on next page.)

OTHER PUBLICATIONS

Coburn, W.J., "Increasing the Etch Rate Ratio oSiO2/Si in Fluorocarbon Plasma Etching," *IBM Technical Disclosure*, vol. 19, No. 10, Mar. 1997.

Cook, J.M., Ibbatson, D.E., and Flamm, D.L., "Application of a low–pressure radio frequency discharge source to polysilicon gate etching," *J. Vac. Sci. Technol.*, vol. B8, No. 1, Jan./Feb. 1990, pp. 1–5.

Horike, Y., Kubota, K., Shindo, H., and Fukasawa, T., "High rate and highly selective $SiO_2$ etching employing inductively coupled plasma and discussion on reaction kinetics," *J. Vac. Sci. Technol.*, vol. 13, No. 3, May/Jun. 1995, pp. 801–809.

(List continued on next page.)

*Primary Examiner*—Thi Dang
(74) *Attorney, Agent, or Firm*—Robert M. Wallace; Joseph Bach

(57) ABSTRACT

The invention is embodied by a plasma reactor for processing a workpiece, including a reactor enclosure defining a processing chamber, a semiconductor window, a base within the chamber for supporting the workpiece during processing thereof, a gas inlet system for admitting a plasma precursor gas into the chamber, and an inductive antenna adjacent a side of the semiconductor window opposite the base for coupling power into the interior of the chamber through the semiconductor window electrode.

83 Claims, 31 Drawing Sheets

U.S. PATENT DOCUMENTS

| | | |
|---|---|---|
| 4,711,698 A | 12/1987 | Douglas |
| 4,755,345 A | 7/1988 | Baity, Jr. et al. |
| 4,756,810 A | 7/1988 | Lamont, Jr. et al. |
| 4,786,352 A | 11/1988 | Benzing |
| 4,786,359 A | 11/1988 | Stark et al. |
| 4,793,897 A | 12/1988 | Dunfield et al. |
| 4,793,945 A | 12/1988 | Siren |
| 4,807,016 A | 2/1989 | Douglas |
| 4,810,935 A | 3/1989 | Boswell |
| 4,828,369 A | 5/1989 | Hotomi |
| 4,842,683 A | 6/1989 | Cheng et al. |
| 4,844,775 A | 7/1989 | Keeble |
| 4,849,675 A | 7/1989 | Muller |
| 4,859,908 A | 8/1989 | Yoshida et al. |
| 4,870,245 A | 9/1989 | Price et al. |
| 4,918,031 A | 4/1990 | Flamm et al. |
| 4,948,458 A | 8/1990 | Ogle |
| 4,948,750 A | 8/1990 | Kausche et al. |
| 4,990,229 A | 2/1991 | Campbell et al. |
| 5,000,113 A | 3/1991 | Wang et al. |
| 5,006,220 A | 4/1991 | Hijikata et al. |
| 5,015,330 A | 5/1991 | Okumura et al. |
| 5,032,202 A | 7/1991 | Tsai et al. |
| 5,074,456 A | 12/1991 | Degner et al. |
| 5,085,727 A | 2/1992 | Steger |
| 5,122,251 A | 6/1992 | Campbell et al. |
| 5,169,487 A | 12/1992 | Langley et al. |
| 5,173,412 A | 12/1992 | Kiener et al. |
| 5,187,454 A | 2/1993 | Collins et al. |
| 5,203,956 A | 4/1993 | Hansen |
| 5,210,466 A | 5/1993 | Collins et al. |
| 5,226,154 A | 7/1993 | Kondoh |
| 5,241,245 A | 8/1993 | Barnes et al. |
| 5,249,251 A | 9/1993 | Egalon et al. |
| 5,258,824 A | 11/1993 | Carlson et al. |
| 5,271,788 A | 12/1993 | Hasegawa et al. |
| 5,275,683 A | 1/1994 | Arami et al. |
| 5,276,693 A | 1/1994 | Long et al. |
| 5,277,751 A | 1/1994 | Ogle |
| 5,326,404 A | 7/1994 | Sato |
| 5,346,578 A | 9/1994 | Benzing et al. |
| 5,349,313 A | 9/1994 | Collins et al. |
| 5,392,018 A | 2/1995 | Collins et al. |
| 5,399,237 A | 3/1995 | Keswick et al. |
| 5,401,350 A | 3/1995 | Patrick et al. |
| 5,414,246 A | 5/1995 | Shapona |
| 5,421,891 A | 6/1995 | Campbell et al. |
| 5,423,945 A | 6/1995 | Marks et al. |
| 5,449,432 A | 9/1995 | Hanawa |
| 5,468,341 A | 11/1995 | Samukawa |
| 5,477,975 A | 12/1995 | Rice et al. |
| 5,518,547 A | 5/1996 | Barnes et al. |
| 5,529,657 A | 6/1996 | Ishii |
| 5,556,501 A | 9/1996 | Collins et al. |
| 5,607,542 A | 3/1997 | Wu et al. |
| 5,683,538 A | 11/1997 | O'Neill et al. |
| 5,928,528 A | 7/1999 | Kubota et al. |
| 5,935,373 A | 8/1999 | Koshimizu |
| 6,024,826 A | 2/2000 | Collins et al. |
| 6,027,606 A | 2/2000 | Mohn et al. |
| 6,054,013 A | 4/2000 | Collins et al. |
| 6,063,233 A | 5/2000 | Collins et al. |
| 6,074,512 A | 6/2000 | Collins et al. |
| 6,077,384 A | 6/2000 | Collins et al. |
| 6,090,303 A | 7/2000 | Collins et al. |
| 6,095,083 A | 8/2000 | Rice et al. |
| 6,095,084 A | 8/2000 | Shamouilian |
| 6,165,311 A | 12/2000 | Collins et al. |
| 6,193,836 B1 | 2/2001 | Mohn et al. |
| 6,217,785 B1 | 4/2001 | Collins et al. |

FOREIGN PATENT DOCUMENTS

| | | |
|---|---|---|
| EP | 0 520 519 A1 | 12/1992 |
| EP | 0 552 490 A1 | 7/1993 |
| EP | 0 552 491 A1 | 7/1993 |
| EP | 0 596 551 A1 | 5/1994 |
| EP | 0 601 468 A1 | 6/1994 |
| EP | 0 641 013 A2 | 3/1995 |
| EP | 0 702 391 A2 | 3/1995 |
| EP | 0 651 434 A2 | 5/1995 |
| EP | 0 680 072 A2 | 11/1995 |
| EP | 0 710 055 A1 | 5/1996 |
| EP | 0 727 807 A1 | 8/1996 |
| EP | 0 727 923 A1 | 8/1996 |
| EP | 0 742 577 A2 | 11/1996 |
| EP | 0 756 309 A1 | 1/1997 |
| EP | 0 807 952 A2 | 11/1997 |
| EP | 0 837 489 A2 | 4/1998 |
| EP | 0 892 422 A2 | 1/1999 |
| GB | 231197 | 11/1990 |
| JP | 55-9464 | 1/1980 |
| JP | 55-154582 | 12/1980 |
| JP | 57-155732 | 9/1982 |
| JP | 61-147531 | 12/1984 |
| JP | 61-91377 | 5/1986 |
| JP | 61-142744 | 6/1986 |
| JP | 62-7268 | 1/1987 |
| JP | 62-12129 | 1/1987 |
| JP | 62-249422 | 10/1987 |
| JP | 62-254428 | 11/1987 |
| JP | 63-9120 | 1/1988 |
| JP | 63-155728 | 6/1988 |
| JP | 64-15928 | 1/1989 |
| JP | 4-94121 | 3/1992 |
| WO | WO 91/10341 | 7/1991 |
| WO | WO 92/20833 | 11/1992 |
| WO | WO 97/08734 | 3/1997 |

OTHER PUBLICATIONS

Lee, H., Dong–II, Y., and Whang, J., "The effects of magnetic fields on a planar inductively coupled argon plasma," *Plasma Sources Sci. Technol.*, 5(1996), pp. 383–388.

Lieberman, M.A., and Ashida, S., "Global models of pulse–power–modulated high–density, low pressure discharges," *Plasma Sources Sci. Technol.*, 5(1996), pp. 145–158.

Matsuo, Seitaro, "Selective Etching of siO2 Relative to Si by Plasma Reactive Sputter Etching," *J. Vac. Sc. Technology*, vol. 17, No. 2, Mar.–Apr. 1980.

Oerhlein, G., and Lee, Y., "Reactive ion etching related Si surface residues and subsurface damage: Their relationship to fundamental etching mechanisms", *J. Vac. Sci. Technol.*, vol. 5, No. 4, Jul./Aug. 1987, pp. 1585–1594.

Perry, A.J., Vender, D., and Boswell, R.W., "The application of the helicon source to plasma processing," *J. Vac. Sci. Technol.*, vol. 9, No. 2, Mar./Apr. 1991, pp. 310–317.

Samukawa, S., and Ohtake, H., "Pulse–time Modulated Plasma Etching for Precise ULSI Patterning," Abstract No. 162, *Microelectrics Research Laboratories*, NEC Corporation, Japan, May 1996, pp. 217–218.

Shibano, T., Fujiwara, N., Hirayama, M., Nagata, H., and Demizu, K., "Etching of $SiO_2$ by low energy $CF+x$ and $F^+$ ions," *Appl. Phys. Lett.*, vol. 63, No. 17, Oct. 25, 1993, pp. 2336–2338.

Suagi, H., and Nakamura, K., "Diagnostics and control of radicals in an inductively coupled etching reactor," *J. Vac. Sci. Technol.*, vol. 13, No. 3, May/Jun. 1995, pp. 8878–893.

Tynan, GR., Bailey III, A.D., Campbell, G.A., Charatan, R., de Chambrier, A., Gibson, G., Hemker, D.J., Jones, K., Kuthi, A., Lee, C., and Wilcoxson, M., "Characterization of an Azimuthally Symmetric Helicon Wave High Density Plasma Source," *Trikon Technologies*, Inc., Japan, Jul. 1997.

European Patent Office Communication Pursuant to Article 96(2) and Rule 51(2) EPC for Application No. 94307307.2–2208, mailed Jan., 1996.

Patent Abstracts of Japan, Publication No. 410079372 A, Mar. 24, 1998 (Matsushita Electric Ind Co Ltd).

Patent Abstracts of Japan, Publication No. 11026433, Jan. 29, 1999 (Matsushita Electron Corp).

Patent Abstracts of Japan, Publication No. 57045927 A, Mar. 16, 1982 (Fujitsu Ltd).

Patent Abstracts of Japan, Publication No. 620562714 A, Mar. 7, 1987 (Olympus Optical Co. Ltd; Toagosei Chem Ind Co Ltd).

Patent Abstracts of Japan, Publication No. 06196446 A, Jul. 15, 1994 (NEC Corp).

Patent Abstracts of Japan, Publication No. 07288196 A, Oct. 31, 1995 (Tokyo Electron Ltd).

Patent Abstracts of Japan, Publication No. 08017799 A, Jan. 19, 1996 (Plasma Syst: KK).

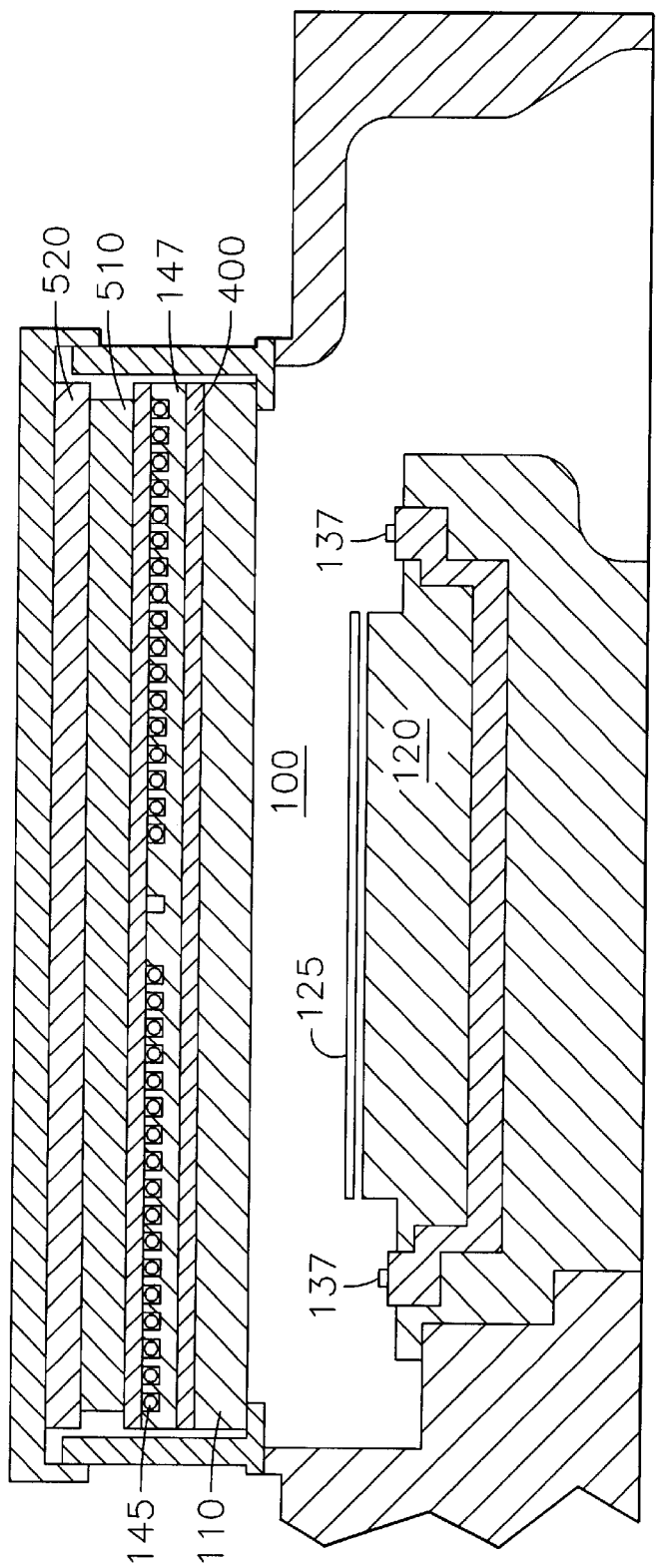
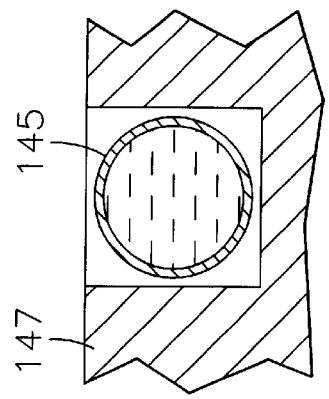
FIG. 39A
FIG. 39B

PARALLEL-PLATE ELECTRODE PLASMA REACTOR HAVING AN INDUCTIVE ANTENNA COUPLING POWER THROUGH A PARALLEL PLATE ELECTRODE

RELATED APPLICATIONS

This application is a divisional of U.S. application Ser. No. 08/936,028, filed Sep. 23, 1997, now U.S. Pat. No. 6,361,644 which is a continuation of U.S. application Ser. No. 08/521,668, filed Aug. 31, 1995 (now abandoned), which is a continuation-in-part of U.S. application Ser. No. 08/289,336, filed Aug. 9, 1994 (now abandoned), which is a continuation of U.S. application Ser. No. 07/984,045, filed Dec. 1, 1992 (now abandoned).

BACKGROUND OF THE INVENTION

1. Technical Field

The invention relates to a plasma reactor having parallel plates for interposition therebetween of a workpiece to be processed, such as a semiconductor wafer, and an inductive coil antenna coupling RF power through one of the parallel plates into the interior of the reactor.

2. Background Art

Inductively coupled plasma reactors for processing microelectronic semiconductor wafers, such as the type of reactor disclosed in U.S. Pat. No. 4,948,458 to Ogle, enjoy important advantages over parallel-plate capacitively coupled plasma reactors. For example, inductively coupled plasma reactors achieve higher plasma ion densities (e.g., on the order of $10^{11}$ ions/cm$^3$). Moreover, plasma ion density and plasma ion energy can be independently controlled in an inductively coupled plasma reactor by applying bias power to the workpiece or wafer. In contrast, capacitively coupled reactors typically provide relatively lower plasma ion densities (e.g., on the order of only $10^{10}$ ions/cm$^3$) and generally cannot provide independent control of ion density and ion energy. The superior ion-to-neutral density ratio provided by an inductively coupled plasma etch reactor used to etch silicon dioxide, for example, provides superior performance at small etch geometries (e.g., below 0.5 micron feature size) including better etch anisotropy, etch profile and etch selectivity. In contrast, parallel plate capacitively coupled plasma reactors typically stop etching at feature sizes on the order of about 0.25 microns, or at least exhibit inferior etch selectivity and etch profile due to an inferior ion-to-neutral density ratio.

The inductively coupled plasma reactor disclosed in U.S. Pat. No. 4,948,458 referred to above has a planar coil overlying the chamber ceiling and facing the semiconductor wafer being processed, thereby providing an optimally uniform RF induction field over the surface of the wafer. For this purpose, the ceiling, which seals the reactor chamber so that it can be evacuated, must be fairly transmissive to the RF induction field from the coil and is therefore a dielectric, such as quartz. It should be noted here that such a ceiling could be made from dielectric materials other than quartz, such as aluminum oxide. However other materials such as aluminum oxide tend produce greater contamination than quartz due to sputtering.

An advantage of capacitively coupled plasma reactors is that the chamber volume can be greatly reduced by reducing the space between the parallel plate electrodes, thereby better confining or concentrating the plasma over the workpiece, while the reactor can be operated at relatively high chamber pressure (e.g., 200 mTorr). In contrast, inductively coupled plasma reactors require a larger volume due to the large skin depth of the RF induction field, and must be operated at a lower chamber pressure (e.g., 10 mTorr) to avoid loss of plasma ions due to recombination and higher pumping speed. In commercial embodiments of the inductively coupled reactor of U.S. Pat. No. 4,948,458 referred to above, the requirement of a large chamber volume is met by a fairly large area side wall. The lack of any other RF ground return (due to the requirement of a dielectric window to admit the RF induction field from the overhead coil) means that the chamber side wall should be conductive and act as the principal ground or RF return plane. However, the side wall is a poor ground plane, as it has many discontinuities, such as a slit valve for wafer ingress and egress, gas distribution ports or apparatus and so forth. Such discontinuities give rise to non-uniform current distribution, which distort plasma ion distribution relative to the wafer surface. The resulting sideways current flow toward the side wall contributes to non-uniform plasma ion distribution relative to the wafer surface.

One approach for combining capacitive and inductive coupling is to provide a side coil wound around the side wall of a parallel plate plasma reactor, as disclosed in European Patent Document Publication No. 0 520 519 A1 by Collins et al. For this purpose, the cylindrical chamber side wall must be a nonconductor such as quartz in order to admit the RF induction field of the side coil into the chamber. The main problem with this type of plasma reactor is that it is liable to exhibit processing non-uniformity across the wafer surface. For example, the etch rate is much greater at the wafer periphery and much slower at the wafer center, thereby constricting the process window. In fact, the etch process may actually stop near the wafer center while continuing at the wafer periphery. The disposition of the induction coil antenna along the side wall of the reactor chamber, the relatively short (e.g., 2 cm) skin depth (or depth within which most of the RF power is absorbed) toward the chamber center, and the introduction of the etch precursor gas into the reactor chamber from the side, confine most of the etchant ion and radical production to the vicinity of the chamber side wall or around the wafer periphery. The phrase "etchant ion and radical" as employed in this specification refers to the various chemical species that perform the etch reaction, including fluorocarbon ions and radicals as well as fluoro-hydrocarbon ions and radicals. The population of free fluorine ions and radicals is preferably minimized by well-known techniques if a selective etch process is desired. Energetic electrons generated by the plasma source power interact with the process precursor gas and thereby produce the required etchant ions and radicals and, furthermore, produce molecular or atomic carbon necessary for polymerization employed in sophisticated etch processes. The etch process near the wafer center is dependent upon such energetic electrons traveling from the vicinity of the chamber side wall and reaching the wafer center before recombining along the way by collisions with neutral species or ions, so that the etch process is not uniform across the wafer surface. These problems are better understood in light of the role polymerization plays in the etch process.

Polymerization employing fluorocarbon ($C_xF_x$) or fluoro-hydrocarbon chemistry is employed in a typical silicon dioxide etch process, for example, to enhance etch anisotropy or profile and etch selectivity, as described in Bariya et al., "A Surface Kinetic Model for Plasma Polymerization with Application to Plasma Etching," *Journal of the Electrochemical Society*, Volume 137, No. 8 (August 1990), pp. 2575–2581 at page 1. An etch precursor gas such as a fluoro-carbon like $C_2F_6$ or a fluoro-hydrocarbon introduced into the reactor chamber dissociates by inelastic collisions with energetic electrons in the plasma into etchant ions and radicals as well as carbon. As noted above, such etchant ions and radicals include fluoro-carbon or fluoro-hydrocarbon ions and radicals, for example, and free fluorine ions and radicals. The free fluorine ions and radicals are preferably minimized through scavenging, for example, if the etch process is to be selective with respect to a certain material such as polysilicon. The carbon and at least some of the fluoro-carbon or fluoro-hydrocarbon ions and radicals are polymer-forming. Also present in the plasma are excited neutrals or undissociated species and etch by-products. The polymer-forming radicals and carbon enhance etch profile as follows: By forming only on the side-walls of etch features (formation on the horizontal surfaces being prevented by the energetic downward ion flux from the plasma), polymers can block lateral etching and thereby produce anisotropic (narrow and deep) profiles. The polymer-forming ions and radicals also enhance silicon oxide etch selectivity because polymer generally does not form on the silicon oxide under favorable conditions but does form on silicon or other materials which are not to be etched but which may underlie a silicon oxide layer being etched. Thus, as soon as an overlying silicon oxide layer has completely etched through to expose an underlying polysilicon layer, the polymer-forming ions and radicals in the plasma that contact the exposed polysilicon layer immediately begin to form a polymer layer, inhibiting further etching.

Such polymerization during the etch process requires a careful balance of etchant and polymer, the etchant concentration typically being at a depletion level to avoid inhibition of appropriate polymer formation. As a result, a significant proportion of etchant ions and radicals formed near the wafer periphery are consumed before reaching the wafer center, further depleting the etch ion concentration over the wafer center. This leads to a lower etch rate or etch stopping near the wafer center.

One reason that there are more ions at the wafer periphery is that the location of the inductive coil at the side wall causes hotter ion-producing electrons to be generated in the vicinity of the side wall, such electrons cooling off and/or being consumed by recombination before reaching the center so that less production of etchant ions and radicals occurs over the wafer center. Moreover, introduction of the etchant precursor gas from the side and coupling of plasma source power from the side produces a non-uniform etchant ion/radical distribution favoring the side. Many of the ions and radicals formed near side (over the wafer periphery) are consumed by etching the quartz side wall and are not available to etch the wafer center, while etchant ion/radical-forming energetic electrons generated near the side are lost to collisions with other species before reaching the wafer center, thus reducing the etchant ion concentration at the wafer center. (It should be noted that the etching of the quartz side wall greatly increases the cost of operating the reactor because it consumes a very expensive item - - - the quartz side wall, which must be periodically replaced.) The relative lack of etchant ions near the wafer center permits faster formation of polymer at the wafer center, so much so that in some cases the polymer formation overwhelms the etch process and stops it, particularly at feature sizes less than 0.5 microns. Such etch stopping may occur either at larger etch features, at shallower etch depths or at shorter etch times.

The converse of the foregoing is that the relative plentitude of etchant ions and radicals near the wafer periphery can, under selected processing conditions, so impede polymerization as to impair etch selectivity, possibly leading to punchthrough of the underlying layer near the wafer periphery, in addition to causing a much higher etch rate at the wafer periphery. A related problem is that the hotter electrons near the chamber side wall/wafer periphery providing more energetic plasma ions in that vicinity, coupled with the oxygen released by the etching of the quartz side wall mentioned above, erodes the edges of the photoresist mask near the wafer periphery. Such erosion leads to faceting, in which the corners defined by the photoresist mask are etched, giving rise to an undesirable tapered etch profile.

From the foregoing, it is clear that there is a trade-off between avoiding punchthrough and faceting at the wafer edge and avoiding etch stopping at the wafer center, dictating a very narrow window of processing parameters within which a successful etch process may be realized across the entire wafer surface. To avoid the overetching the wafer periphery, the concentration of etchant ions and radicals in the plasma relative to other particles (e.g., polymer-forming ions or radicals and carbon) may be decreased, which risks etch-stopping at the wafer center. Conversely, to avoid etch-stopping at the wafer center, the concentration of etchant ions in the plasma may be increased, which risks punchthrough or faceting near the wafer periphery. Thus, the process window for successfully etching the entire wafer is very narrow.

In the parallel plate plasma reactor, the concentration of free fluorine in the plasma can be controlled by introducing a scavenging article, such as silicon, near or at the top of the reactor chamber. Silicon atoms physically etched (sputtered), chemically etched or reactive ion etched from the scavenging article combine with the fluorine ions and radicals, thereby reducing fluorine ion and radical concentration in the plasma. By controlling the rate at which silicon atoms are physically or chemically etched from the scavenging article, the amount of free fluorine ions and radicals in the plasma may be regulated (e.g., reduced) as desired to meet the narrow processing window mentioned above. The physical or chemical etch rates can be controlled by controlling the temperature of the scavenging article and/or by controlling the rate of ion-bombardment on the scavenging article. The surface of the scavenging article may be activated (to release silicon atoms into the plasma) either by RF power or by heating. By holding the scavenging article's temperature below the temperature at which polymerization occurs, the polymers accumulate on the scavenging article surface and block any release therefrom of silicon atoms. By raising the scavenging article's temperature above the condensation temperature, the surface is free from polymers, thus permitting the release of silicon atoms into the plasma. Further increasing the temperature increases the rate at which silicon atoms are released from the scavenging surface into the plasma. As for activating the scavenging article by RF power, the rate of ion bombardment of the scavenging article is affected by the RF potential or bias applied to the top parallel plate electrode adjacent the scavenging article. Reducing the free fluorine concentration in this manner has the effect of not only decreasing etch rate but also enriching the carbon content of the polymer, thus increasing the effect of the polymer on the etch process to guard against punch through at the wafer periphery, but increasing the risk of etch stopping at the wafer center. Conversely, increasing the free fluorine concentration not only increases the etch rate but also depletes the carbon content of the polymer, thus decreasing the effect of polymerization on the etch process, thus decreasing the risk of etch stopping at the wafer center but weakening the protection against punch through at the wafer periphery.

The narrow processing window is also met by regulating the polymer-forming ion and radical concentration in the plasma. This is accomplished by regulating the rate at which such polymer-forming radicals and ions are lost from the plasma by polymerization onto the chamber ceiling or sidewalls (or a scavenging article) or the rate at which polymer deposits are sputtered from the ceiling or sidewalls (or scavenging article). The polymerization rate at the ceiling is affected by regulating the ceiling temperature above or below the polymerization temperature. The rate at which such polymer deposits on the ceiling are etched and released into the plasma is affected by the following factors: the RF power applied to the ceiling electrode, temperature, chamber pressure, gas flow rate, inductive source power and other parameters. Thus, Thus, in order to meet the narrow processing window, in general the relative concentrations of free fluorine and polymer-forming ions and radicals in the plasma may be controlled by regulating the temperature of the chamber ceiling or side walls or a scavenging article (if any) and/or by regulating the RF power applied to the to overhead/ceiling parallel plate electrode.

Thus, it is seen that the parallel-plate plasma reactor with the induction coil wound around its cylindrical side wall has the advantage of providing its ceiling electrode as a uniform ground plane over the entire wafer surface, but confines plasma ion production to the vicinity of the chamber side wall, so that plasma processing is weaker at the wafer center and stronger at the wafer periphery. The overhead planar coil plasma reactor has the advantage of a more uniform RF induction field relative to the wafer surface, so that ion production is not confined to the wafer periphery, but suffers from the lack of any uniform ground plane over the wafer, so that plasma ion current flow to the side walls distorts the plasma.

It is an object of the invention to combine the advantages of an inductively coupled plasma reactor having an overhead planar induction coil antenna with the advantages of a parallel plate electrode capacitively coupled plasma reactor in a single reactor without suffering the disadvantages or problems described above. Specifically, it is an object of the invention to provide an inductively coupled parallel plate electrode plasma reactor which exhibits uniform plasma processing across the entire wafer surface, so as to widen the plasma processing window, thus permitting a wider range in processing parameters, such as chamber pressure for example.

It is an object of the invention to provide an induction coil antenna whose physical disposition and/or power distribution pattern is relatively uniform with reference to the entire wafer surface so that plasma ion production is not predominantly at the vicinity of the chamber side wall, while at the same time providing a uniform ground plane in close proximity to the entire wafer surface so as to avoid plasma current flow to the chamber side wall. It is a further object of the invention to employ such a ground plane in a manner that effectively confines the plasma closer to the top surface of the wafer so as to minimize interaction with the chamber side wall.

It is another object of the invention to eliminate or reduce consumable materials such as quartz or ceramics in the chamber walls, so as to avoid depletion of plasma ions near the chamber walls and consumption of expensive reactor components through etching of such materials.

It is a further object of the invention to enhance processing uniformity at the wafer center relative to the wafer periphery in such a reactor by providing a uniform etch and polymer precursor gas distribution. Specifically, it is an object of the invention to introduce such gas from an optimum radial location of the chamber, such as from the chamber center and/or from the chamber periphery, whichever optimizes process uniformity across the wafer surface. For example, where etch rate is low at the wafer center and high at the wafer periphery, the gas is preferably introduced from the center of the ceiling rather than from near the periphery of the ceiling.

It is an additional object of the invention to enhance processing uniformity at the wafer center relative to the wafer periphery in such a reactor by enhancing (or reducing, if desired) the RF induction field over the wafer center relative to the RF induction field over the wafer periphery. Specifically, it is an additional object of the invention to provide separate or independent control of the strength of the RF induction field over the wafer center and independent control of the strength of the RF induction field over the wafer periphery, so that the radial distribution of the RF induction field across the wafer surface is adjustable to optimize plasma processing uniformity across the wafer surface.

SUMMARY OF THE INVENTION

The invention is embodied in a plasma reactor for processing a workpiece, including a reactor enclosure defining a processing chamber, a semiconductor window, a base within the chamber for supporting the workpiece during processing thereof, a gas inlet system for admitting a plasma precursor gas into the chamber, and an inductive antenna adjacent a side of the semiconductor window opposite the base for coupling power into the interior of the chamber through the semiconductor window. The workpiece may be a planar substrate, the semiconductor window (and the inductive antenna) may be either inside the chamber or outside of the chamber. In the latter case the semiconductor window may be a ceiling portion of the reactor enclosure generally parallel to and overlying the planar substrate, and the inductive antenna may overlie the ceiling portion to face the planar substrate through the semiconductor window. Alternatively, the semiconductor window may be a sidewall portion of the reactor enclosure generally perpendicular to and surrounding a periphery of the substrate, the inductive antenna being adjacent the sidewall portion. Preferably, the inductive antenna overlying the ceiling portion includes an arcuately extending elongate conductor disposed generally parallel to the plane of the planar substrate and may be either planar or dome-shaped. The inductive antenna adjacent the sidewall portion may be a conductive coil wound around the sidewall portion.

In one embodiment, the semiconductor window, in addition to shielding the inductive antenna, may also be an electrode, in which case an electrical terminal is connected thereto. In this case the semiconductor window is referred to as a semiconductor window electrode.

In one embodiment, a bias RF power source is coupled to the substrate, and the electrical terminal of the semiconductor window electrode is connected so as to enable the semiconductor window electrode to be a counter electrode to the bias RF power source coupled to the substrate, by being grounded, for example, thereby providing a uniform ground plane over the workpiece.

Another embodiment includes a power splitter having one output coupled to the semiconductor window electrode and another output coupled to the substrate and an input for receiving power from a common source. Yet another embodiment includes a first power source coupled to the semiconductor window electrode and a second power source coupled to the planar substrate.

The inductive antenna may include an inner antenna portion overlying a center of the planar substrate and an outer antenna portion overlying a periphery of the planar substrate and electrically separated from the inner antenna portion. This embodiment may include a power splitter having one output coupled to the semiconductor window electrode and another output coupled to the inductive antenna and an input for receiving power from a common source. Alternatively, an RF power splitter may split RF power between the inner and outer inductive antenna portions.

In accordance with one feature of the invention, a power splitter has one output coupled to the planar substrate and another output coupled to the inductive antenna and an input for receiving power from a common source. In this case, the electrical terminal of the semiconductor window electrode may be connected to RF ground. Alternatively, an independent RF power generator may be coupled to the electrical terminal of the semiconductor window.

The ceiling semiconductor window electrode with the overhead inductive antenna and the sidewall semiconductor window electrode with the side inductive antenna element may be combined in a single reactor. In this case, a power splitter may be employed having one output coupled to the inductive antenna overlying the ceiling portion and another output coupled to the inductive antenna element adjacent the sidewall portion, and an input for receiving power from a common source.

The semiconductor window and the workpiece may be separately driven with RF power, while the workpiece may be a counter electrode for the semiconductor window electrode, and the semiconductor window electrode may be a counter electrode for the workpiece. This may be accomplished by employing a first RF power source of a first frequency coupled to the semiconductor window electrode, a second RF power source of a second frequency coupled to the workpiece, a first ground pass filter connected between RF ground and the semiconductor window electrode, the first ground pass filter blocking RF power around the first frequency and passing RF power around the second frequency, and a second ground pass filter coupled between RF ground and the workpiece, the second ground pass filter blocking RF power around the second frequency and passing RF power around the first frequency. Furthermore, a first isolation filter may be connected between the first RF power source and the semiconductor window electrode for blocking RF power near the second frequency, and a second isolation filter may be connected between the second RF power source and the workpiece for block RF power near the first frequency.

In accordance with another feature, a conductive backplane lies on an external surface of the semiconductor window electrode, the conductive backplane being connected directly to the electrical terminal, the conductive electrode including plural apertures therein for admitting an induction field of the inductive antenna through the conductive backplane. Preferably, the conductive backplane includes plural conductive radial arms separated by the apertures, and the apertures have a characteristic width on the order of approximately a thickness of the semiconductor window electrode.

In accordance with a further feature, a structurally supportive substrate may be bonded to an exterior surface of the semiconductor window electrode The conductive backplane may be inserted between the window electrode and the supportive substrate if desired, the conductive backplane being connected directly to the electrical terminal. The structurally supportive substrate may be an antenna holder supporting the inductive antenna. The antenna holder may be an insulator or a conductor (insulated from the inductive antenna, however). The conductive antenna holder may serve as a conductive backplane on an exterior surface of the semiconductor window electrode. In one embodiment, the inductive antenna includes an elongate conductor extended in an arcuate path, and the conductive antenna holder includes a elongate groove extending in the arcuate path and holding the elongate conductor, the groove being open at a surface of the conductive antenna holder facing the semiconductor window electrode. In another embodiment, the conductive antenna holder includes an recess in a surface of the conductive antenna holder facing the semiconductor window electrode, and the inductive antenna includes plural elongate conductive turns held within the recess.

In accordance with one implementation, the inductive antenna is a non-concentrically arcuately extending elongate conductor. In one case, the non-concentrically arcuately extending elongate conductor includes a center conductive element and plural spirals radiating outwardly from the center conductive element. In another case, the non-concentrically arcuately extending elongate conductor includes a circumferential conductive element and plural spirals radiating inwardly from the circumferential conductive element.

In accordance with another implementation, the inductive antenna has a non-planar path such as a three-dimensional helix or dual concentric three-dimensional helical paths or stacked spiral paths.

The gas inlet system preferably includes a set of gas inlet ports through the semiconductor window electrode over the planar substrate. These gas inlet ports may be concentrated over the wafer center and/or may be distributed to overlie the wafer periphery. A center gas feed top may be sealed onto an exterior surface of the semiconductor window electrode, forming a gas manifold between the center gas feed top and the semiconductor window electrode, the gas manifold encompassing the gas inlet ports. In one embodiment, a semiconductor baffle extends across the manifold and dividing the manifold into a pair of sub-manifolds, one of the sub-manifolds being adjacent the center gas feed top and the other of the sub-manifolds being adjacent the gas inlet ports, and plural gas feed passages through the semiconductor baffle offset from the gas inlet ports.

BRIEF DESCRIPTION OF THE DRAWINGS

FIGS. 35A through 35E illustrate one embodiment of a center gas feed silicon ceiling, of which FIG. 35A is a bottom perspective view of the gas feed top, FIG. 35B is a bottom perspective view of an annular seal therefor, FIG. 35C is a cross-sectional view of the seal of FIG. 35B, FIG. 35D is a top perspective view of the silicon ceiling showing the gas feed holes and FIG. 35E is a partial cross-sectional view of the silicon ceiling of FIG. 35D.

FIG. 39A is a detailed cross-sectional side view of a preferred implementation of the invention.

FIG. 39B is an axial cross-sectional view of the conductor employed in the overhead inductive antenna.

DETAILED DESCRIPTION OF THE PREFERRED EMBODIMENTS

Basic Concept of the Invention

Figure 1:
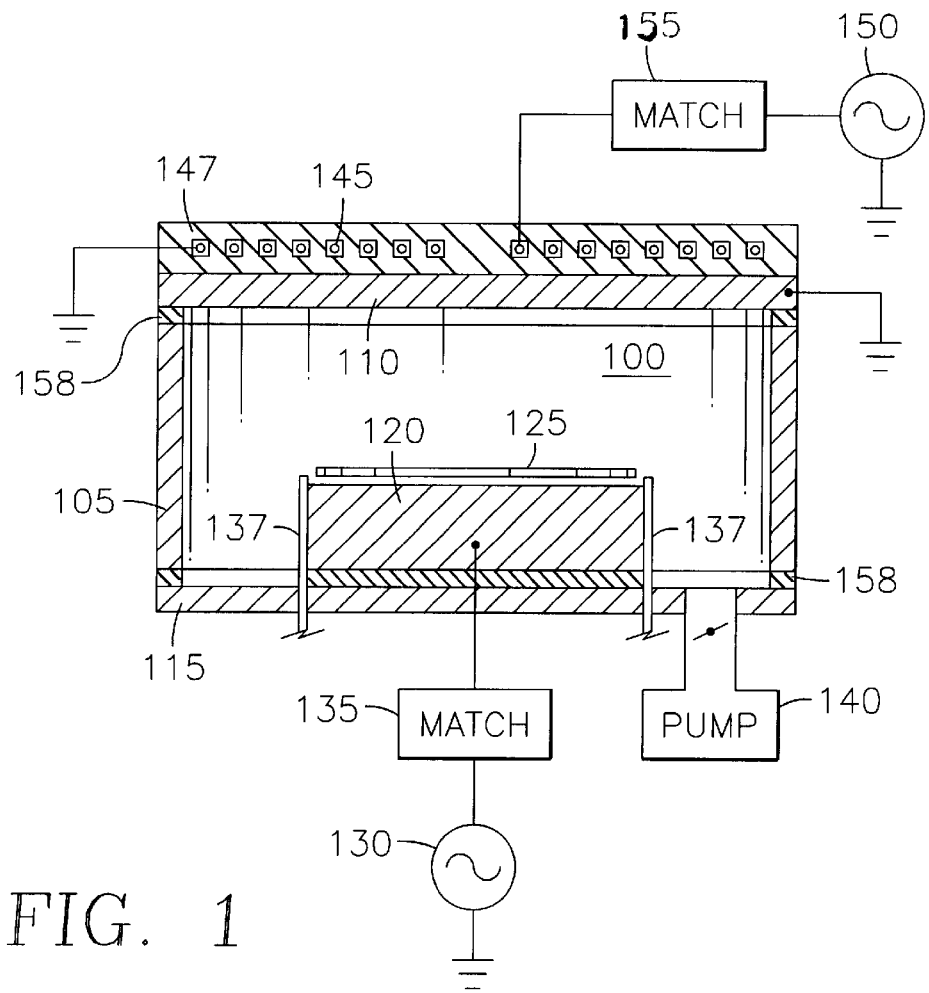
FIG. 1 illustrates a first embodiment of the plasma reactor invention having a planar coil antenna overlying a planar silicon ceiling.

Referring to FIG. 1, a plasma reactor includes a sealed cylindrical chamber 100 enclosed by a cylindrical side wall 105, a disk-shaped ceiling 110 and a base 115. A wafer pedestal 120 supports a semiconductor wafer or workpiece 125 to be processed by the reactor. The wafer pedestal 120 may be an electrostatic chuck assembly, as disclosed in co-pending U.S. Patent Application Ser. No. 08/507,726 filed Jul. 26, 1995 by Kenneth S. Collins et al. entitled "PLASMA SOURCE WITH AN ELECTRONICALLY VARIABLE DENSITY PROFILE" and assigned to the assignee of the present application, the disclosure of which is incorporated herein by reference. A bias RF power generator 130 applies a bias potential to the wafer pedestal 120 through an impedance match circuit 135 of the type well-known in the art. Impedance match circuits are disclosed, for example, in U.S. Pat. No. 5,392,018 to Collins et al. and U.S. Pat. No. 5,187,454 to Collins et al. Gas inlets 137 adjacent the pedestal 120 admit a processing gas such as an etchant precursor gas such as a $C_xF_x$ gas. A vacuum pump 140 evacuates the chamber 100 to a desired pressure. An overhead inductive coil antenna 145 held over the ceiling 110 in an insulating antenna holder 147 is connected to a plasma source RF power generator 150 through another conventional impedance match circuit 155 and inductively couples RF power into the chamber through the ceiling 110.

In order to provide a uniform ground return for the bias RF power over the entire surface of the wafer 125 and in order to minimize current flow toward the side wall 105, the ceiling 110 is grounded. However, this feature requires the ceiling 110 to perform two functions: (a) act as a conductor that can be grounded and (b) act as a non-conductor so that the RF induction field from the overhead coil antenna 145 can pass therethrough. In order to fulfill its dual-function role, the ceiling 110 is a semiconductor such as silicon. The silicon ceiling 110 may be insulated from conductive member of the chamber by insulators 158. It is felt that the silicon ceiling 110, as a semiconductor, has sufficient conductive properties to act as an electrode or ground plane. In order to vertically confine the plasma closer to the wafer 125 and bring the uniform overhead ground plane into closer proximity to the wafer 125 (i.e., closer than the side wall 105) to minimize sideways plasma current flow to the side wall 105, the silicon ceiling 110 preferably is placed within a distance of the wafer 125 less than the wafer diameter and as close as only a fraction of the wafer diameter (e.g, within a few centimeters for a 20 cm diameter wafer). This distance can be as great as 20 cm and as little as 1 cm although a preferable range is 2–10 cm.

The ceiling 110 is a semiconductor window of a semiconductor material which is preferably silicon. However, other well-known semiconductor materials may be employed, such as silicon carbide, germanium, III-V compound semiconductors such as gallium arsenide or indium phosphide and II-III-V compound semiconductors such as mercury cadmium telluride. The requisite dopant impurity level at room temperature given a desired resistivity value of the silicon window electrode may be obtained from the graph of FIG. 4.14 of Grove, *Physics of Semiconductors*, page 113. The temperature of the silicon window 110 must be maintained within a range above which it does not act like a dielectric and below which it does not act like a conductor. The requisite temperature range may be obtained from the graph of FIG. 4.8 of Grove, *Physics of Semiconductors* illustrating the electron concentration in n-type silicon as a function of temperature. This graph shows that below about 100°K, the silicon begins to act like a dielectric while above about 600°K the silicon begins to act like a conductor. It is therefore preferable to maintain the temperature of the silicon ceiling 110 in a range where the carrier electron concentration is fairly constant with respect to temperature, which is within the range between 100°K and 600°K.

The advantages of the plasma reactor of FIG. 1 include the even distribution across the entire wafer surface of the plasma source power generated by the overhead coil antenna 145 in comparison with the conventional type of reactor having a coil wound around the side wall. Thus, plasma ion generation is not confined to the vicinity of the side wall but is uniformly distributed over the wafer surface. Plasma ion uniformity is enhanced because the grounded ceiling electrode 110 reduces or eliminates plasma current flow to the side wall 105, in contrast to the sideways current flow in the plasma reactor having an overhead coil antenna over a dielectric ceiling as disclosed in U.S. Pat. No. 4,948,458 referred to above. Also, the close vertical proximity between wafer and ceiling reduces the distance between the wafer and the region in which plasma ions are generated, thereby reducing recombination losses and permitting the chamber pressure to be increased (e.g., to be in the range of 50–200 mTorr, for example). Such an increase in chamber pressure can be desirable for enhancing certain processing performance parameters, such as etch selectivity. The uniformity of plasma ion generation in the embodiment of FIG. 1 (achieved by the overhead coil antenna 145) coupled with the reduction in current flow to the chamber side wall (achieved with the grounded silicon ceiling 110 in close proximity to the wafer 125) reduces or eliminates differences in processing (e.g., etching) at the wafer center and processing at the wafer periphery, thereby widening the processing window. Specifically, the tendency to overetch or punch through at the wafer periphery is reduced while at the same time the tendency to etch stop at small feature sizes at the wafer center is also reduced. Also, the tendency near the wafer periphery to facet the photoresist mask edges and to generally etch the photoresist giving rise to poor etch profile is reduced or eliminated. Thus, the plasma reactor of FIG. 1 can provide at very small feature sizes aggressive etch performance across the entire wafer surface with superior etch profile and superior etch selectivity with little or no microloading. Moreover, since there is little or no participation of the side wall 105, consumption of reactor components and the associated operating cost is significantly reduced. Accordingly, the invention provides a revolutionary advance in the art.

There are, however, a number of potential problems which, if not resolved, could render the reactor of FIG. 1 impractical. First, there is the problem of whether the silicon ceiling 110 will block the RF induction field of the overhead coil antenna 145 from ever reaching the chamber 100. For example, the impedance of the silicon ceiling 110 to the RF induction field may be too great to permit transmission therethrough. This may be affected by the dopant impurity concentration in the silicon ceiling 110 or by the temperature of the silicon ceiling 110. Alternatively, the RF induction field skin depth through the silicon ceiling 110 may not exceed the ceiling thickness, thus preventing transmission therethrough. Also, the RF induction field skin depth through the plasma in the chamber 100 may be greater than the chamber height (i.e., the wafer-top electrode gap), so that the RF induction power may not 28. be efficiently coupled to the plasma. Another problem is that the close proximity of the ceiling 110 to the wafer 125 may be insufficient to separate the plasma sheath near the ceiling 110 from the plasma sheath near the underlying wafer 125, thereby shorting out the plasma from top to bottom. Also, insertion of the silicon material of the ceiling 110 into the RF return path of the bias RF power generator 130 may occasion significant RF bias power losses. Finally, there may not exist a suitable or practical range of resistivity values for the semiconductor window within which an RF inductive field can be coupled without undue loss or attenuation. These problems are solved or otherwise disposed of in the analyses that follows immediately below.

The Induction Field's Skin Depth Through the Plasma is Sufficiently Short so that Power is Efficiently Absorbed in the Plasma The skin depth of the RF induction field from the overhead coil antenna 145 is less than the ceiling-to-wafer height (e.g., on the order of the wafer diameter or less), so that the power from the coil antenna 145 is inductively coupled to the plasma efficiently. This may be shown for two cases, namely a collisional skin depth in which the plasma source RF angular frequency is much less than the plasma momentum transfer elastic collision frequency, and a collisionless skin depth in which the plasma source RF angular frequency is much greater than the plasma momentum transfer elastic collision frequency..

The collisional skin depth $\delta_c$ of the RF induction field through the plasma is computed as follows:

$$\delta^c = (2\tau^m/\omega)^{1/2} c[(e^2 n_e)/(\epsilon_0 m_e)]^{-1/2}, \quad (1)$$

where:

$\tau_m = 1.4 \cdot 10^7$ sec$^{-1}$ is the electron-to-neutral momentum transfer collision frequency for an Argon plasma at a temperature of 300°K and a chamber pressure of 5 mTorr, $f = 12.57 \cdot 10^6$ radians/sec is the angular frequency of the induction field RF power source applied to the coil antenna, $c = 3 \cdot 10^8$ meters/sec is the speed of light, $e = 1.6022 \cdot 10^{-19}$ coulomb is the electron charge, $n_e = 5 \cdot 10^{-17}$ meters$^{-3}$ is the applicable electron density, $\epsilon_0 = 8.85 \cdot 10^{-12}$ farads/meter is the electrical permittivity of free space, and $m_e = 9.1095 \cdot 10^{-31}$ kg is the electron mass.

Substituting the foregoing values into Equation 1 yields:

$$\delta_c = 1.1 \text{ cm} \quad (2)$$

as the collisional skin depth.

The collisionless skin depth $\delta_p$ of the RF induction field through the plasma is computed as follows:

$$\delta_p = c[(e^2 n_e)/(\epsilon_0 m_e)]^{-1/2} \quad (3)$$

Substituting the foregoing values into Equation 3 yields:

$$\delta_p = 0.8 \text{ cm} \quad (4)$$

as the collisionless skin depth. Thus, in either case the skin depth of the RF induction field is significantly less than the wafer-to-ceiling height, so that the RF source power is efficiently absorbed by the plasma.

The Induction Field's Skin Depth Through the Silicon Ceiling is Greater Than the Ceiling Thickness, So That It Can Extend Through the Ceiling The RF induction field of the coil antenna 145 has a skin depth in silicon that far exceeds the one-inch (2.54 cm) thickness of the silicon ceiling. Therefore, the RF induction field is sufficiently deep to penetrate the silicon ceiling 110, provided the resistive losses are sufficiently small. This may be closely estimated by computing the skin depth $\delta$ of a uniform plane wave incident on an infinite planar silicon slab:

$$\delta = [\pi f \sigma \mu]^{-1/2}$$

where:

f=2 MHz is the frequency of the RF power source 130 connected to the coil antenna 145, $\mu = 4\pi 10^{-7}$ Henries/meter is the magnetic permeability of the silicon slab, and $\sigma = 3.33 \ \Omega^{-1}\text{meters}^{-1}$ is the conductance of the 30 Ω-cm resistivity silicon slab.

Substituting the foregoing values into the equation for $\delta$ yields:

$$\delta = 0.195 \text{ m},$$

so that the skin depth is about eight times the thickness of the silicon ceiling 110 and therefore the RF induction field has a penetration depth well into the chamber 10, provided the silicon ceiling 110 does not pose a high impedance to the RF induction field.

The Silicon Ceiling Poses a Low Impedance to the RF Induction Field

Figure 2:
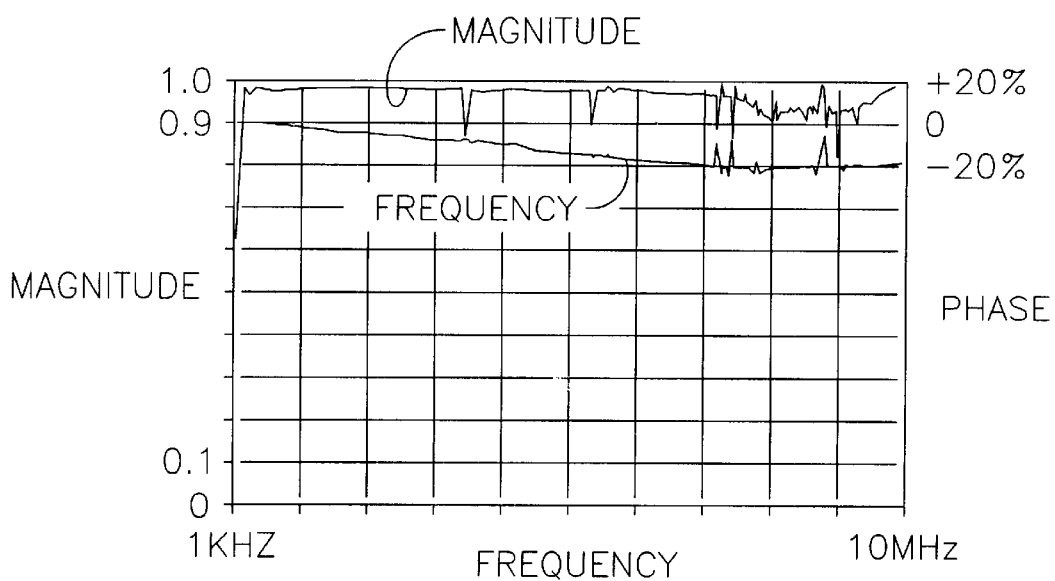
FIG. 2 is a graph illustrating the normalized forward voltage transmission coefficient from a transmitting RF coil to a receiving RF coil with a planar silicon window of FIG. 1 in between the transmitting and receiving RF coils.

Transmission of an RF induction field through an embodiment of the silicon ceiling 110 consisting of a disc-shaped silicon slab of 30 Ω-cm resistivity at room temperature measuring 13.5 inches in diameter and 1 inch in thickness was tested at room temperature by placing induction coils on opposite sides of the slab, connected the coil on one side of the slab to a variable frequency RF source and connecting the coil on the other side to a multichannel analyzer and then sweeping the frequency of the RF source from 1 kHz to 10 MHz. The resulting output of the multichannel analyzer is illustrated in FIG. 2. For the curve labelled "magnitude", the vertical axis is the ratio of the magnitudes of the received and transmitted signals and extends from a value of unity at the top of the scale and falls in 0.1 unitless increments, while the horizontal axis is frequency and extends from 1 kHz on the left to 10 MHz on the right. For the curve labelled "phase", the vertical axis is the difference between the phase angles of the received and transmitted signals and extends from a value of 20° at the top of the scale and falls in 20° increments. The graph of FIG. 2 clearly indicates that there virtually is no loss of RF power through the silicon slab out to 2 MHz and that there is relatively little loss above 2 MHz.

Figure 3:
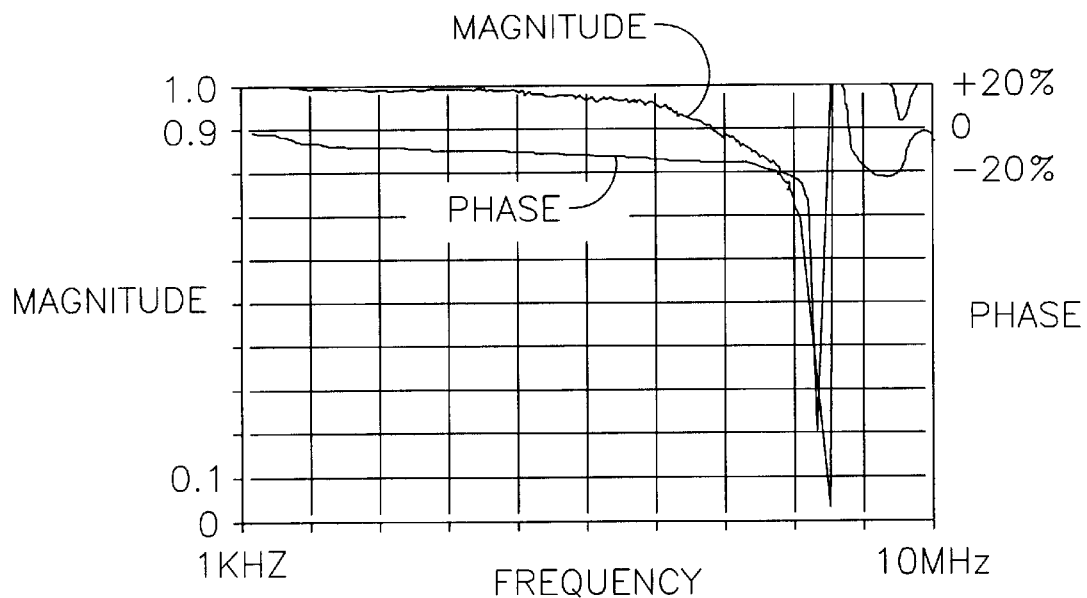
FIG. 3 is a graph illustrating the normalized forward voltage transmission coefficient from a transmitting RF coil to a receiving RF coil with a cylindrical version of the silicon window in between the transmitting and receiving RF coils.

While FIG. 2 illustrates the results obtained with a discoid silicon slab, FIG. 3 illustrates results obtained at room temperature with a cylindrical silicon slab having a 12.3 inch outside diameter, a 1 cm wall thickness. A 5-turn transmission coil was wound around the outside of the cylindrical slab for transmitting RF power into the interior volume surrounded by the cylindrical silicon slab. Measurements were taken at the center of the interior volume from an 8-turn receiver coil having a 2.3 inch outside diameter and a 3 inch length. For the curve labelled "magnitude", the vertical axis is the ratio of the magnitudes of the received and transmitted signals and extends from a value of unity at the top of the scale and falls in 0.1 unitless increments, while the horizontal axis is frequency and extends from 1 kHz on the left to 10 MHz on the right. For the curve labelled "phase", the vertical axis is the difference between the phase angles of the received and transmitted signals and extends from a value of 0° at the top of the scale and falls in 20° increments. The graph of FIG. 2 clearly indicates that there virtually is no loss of RF power through the silicon slab out to 2 MHz and that there is relatively little loss above 2 MHz. Thus, the silicon ceiling 110 is nearly transparent to the RF induction field.

The Silicon Ceiling Poses a Low Impedance to the RF Induction Field Over A Wide Temperature Range The tests described above with reference to FIGS. 2 and 3 were repeated at silicon temperatures of 200° and 250° and similar results were obtained, demonstrating that the temperature of the silicon ceiling 110 may be varied over a wide range to adjust the polymerization and fluorine scavenging processes as desired. However, at temperatures well above 300° C. the silicon ceiling 110 becomes intrinsic and therefore cuts off the RF induction field of the overhead coil antenna 145 from reaching the chamber 100. It is preferable to employ a high resistivity silicon (e.g., 30 Ω-cm at room temperature) in the ceiling 110. Otherwise, using, for example, 0.01 Ω-cm resistivity silicon in the ceiling 110 would require reducing the frequency of the RF induction field to the kHz range or below in order to couple through the silicon ceiling. Another option is to reduce the ceiling thickness.

The Silicon Ceiling Adds Virtually No Losses in the Return Path of the Bias RF Power Source That the RF power loss occasioned by insertion of the silicon ceiling 110 in the RF return path for the bias power generator 130 is low may be seen by computing the resistance of a silicon slab to a current flux normal to the slab's flat surface assuming a skin depth much greater than the slab thickness and assuming the presence of a perfect conductor ground plane on the back of the silicon slab. This resistance is shown to be far less than the measured driving point RF impedance at the wafer pedestal 120, so that the insertion of the silicon ceiling causes only a fractional increase in the overall bias RF power loss.

The resistance $R_{slab}$ of the silicon slab to a current flux normal to the surface is computed as follows:

$$R_{slab} = \Gamma t \, (d/2)^{-2}/\pi,$$

where:

t=0.0254 m is the slab thickness, d=0.318 m is the slab effective diameter exposed to the current flux, and δ=0.30 Ω-m is the resistivity of the 30 Ω-cm resistivity silicon at room temperature.

Substituting the foregoing values into the equation for $R_{slab}$ yields for the slab resistance:

$$R_{slab} = 0.096 \, \Omega.$$

The driving point impedance Z at the wafer pedestal 120 has been measured in typical parallel electrode plasma reactor of the type illustrated in FIG. 1 (with a 2.0 MHz plasma power source RF induction field from a coil antenna and an applied RF bias on the pedestal of 1.8 MHz) as 38.7 Ω at an angle of 50.1°. The real part of this driving point impedance is:

$$Re(Z) = 38.7 \, \Omega \, cos(50.1° \, (180/\pi)) \approx 24 \, \Omega.$$

The fractional increase in RF power loss occasioned by the insertion of the silicon ceiling is:

$$R_{slab}/Re(z) = 0.096/24 = 0.004,$$

which is a very small fraction. Thus, the insertion of a silicon slab into the RF return path of the RF bias power generator 130 adds only a negligible amount of resistance.

The Plasma DC Sheath Thickness is Sufficiently Short to Avoid Shorting Between the Ceiling and the Wafer There is a sheath at the edge of the plasma across which the ion density falls from the plasma ion density value to zero. If the sheath at the wafer surface meets the sheath at the chamber ceiling, there is no plasma in the chamber. The high voltage plasma DC sheath thickness, s, is computed as follows:

$$s = (2^{1/2}/3)[(\epsilon_0 . T_e)/(e . n_e)]^{1/2}(2.V_0/T_e)^{3/4},$$

where:

$\epsilon = 8.85 \cdot 10^{-14}$ farads/cm is the electrical permittivity of free space, $T_e = 5$ eV is the mean electron temperature assuming a Maxwellian distribution, $e = 1.6022 \cdot 10^{-19}$ coulombs is the electron charge, $n_e = 5 \cdot 10^{11} cm^{-3}$ is the average electron density in the bulk plasma adjacent the sheath, and $V_O = 300$ Volts is the DC voltage across the plasma sheath.

Substituting the foregoing values into the equation for s yields:

$$s = 0.04 \, cm,$$

so that the plasma sheath thickness is only a small fraction of the wafer-to-ceiling distance and therefore there is no risk of the top and bottom sheaths intersecting.

There is a wide range of resistivity values for a semiconductor window electrode through which RF power may be coupled with low attenuation losses In order to ascertain a range of resistivity values of a semiconductor window through which an inductive RF field is to be coupled or transmitted with low attenuation losses, a thickness of the window must be selected, the frequency of the RF inductive field must be selected and a minimum ratio r of RF skin depth to window thickness must be specified. In a first example, the window thickness is T=0.0254 meter, the RF frequency f is $2.10^6$ s$^{-1}$ and the minimum ratio of RF skin depth to window thickness is r=5. For this first example, the minimum resistivity for the semiconductor window is calculated assuming:

$\mu = 4\pi.10^{-7}$ Henries/meter is the magnetic permeability of the semiconductor window, S=r.T is the skin depth of the RF induction field in the semiconductor window. The minimum resistivity $\gamma_{min}$ is then computed by the following equation:

$$\gamma_{min} = S^2.\pi.f.\mu$$

Substituting the values given above into this equation, the minimum resistivity for this first example is:

$$\gamma_{min} = 12.735 \ \Omega\text{-cm.}$$

Next, the maximum resistivity must be computed for this first example. For purposes of the following analysis, it will be assumed that there is a ground plane transmissive to the RF induction field behind the semiconductor window. The real part of the RF bias plasma load impedance must be defined, the acceptable loss L must be defined and the effective plasma interaction diameter d of the semiconductor window must be defined. In this first example, the real part R of the RF bias plasma impedance is:

R=−25, the acceptable loss (normalized at 100%=1) is L=0.01, the effective plasma interaction diameter of the semiconductor window is d=0.318, from which the effective plasma interaction area A is computed as A=$\pi(d/2)^2$.

The maximum resistivity $\gamma_{max}$ is given by the following equation:

$$\gamma_{max} = L.R.A/T.$$

Substituting the foregoing values into this equation yields:

$$\gamma_{max} = 78.172 \ \Omega\text{-cm.}$$

Therefore, in this first example, the resistivity of the semiconductor may lie anywhere within the range between 12.735 Ω-cm and 78.172 Ω-cm.

In a second example, the semiconductor window thickness is reduced by a factor of ten so that T=0.00254 meters. In this case, $\gamma_{min}$ is reduced to 0.127 Ω-cm, while $\gamma_{max}$ increases to 781.719 Ω-cm.

In a third example, the parameters of the second example are repeated except that the frequency of the RF induction field is reduced to 100 kHz (f=$0.1.10^6$ s$^{-1}$) In this case, $\gamma_{min}$ is reduced to 0.006 Ω-cm, while $\gamma_{max}$ is unchanged (from the second example) at 781.719 Ω-cm.

In a fourth example, the parameters of the first example are adopted except that the frequency of the RF induction field is increased to 10 MHz (f=$10.10^6$ s$^{-1}$) In this case, $\gamma_{min}$ is increased to 63.675 Ω-cm, while $\gamma_{max}$ is decreased to 78.172 Ω-cm, thus narrowing the range somewhat relative to the other examples.

Thus, the useful range of resistivity values is broad. If the semiconductor window is a 2.54 cm-thick silicon slab and the RF frequency of the induction field is 2 MHz, then the preferred resistivity is 30 Ω-cm.

Other Preferred Embodiments of the Invention

Figure 4:
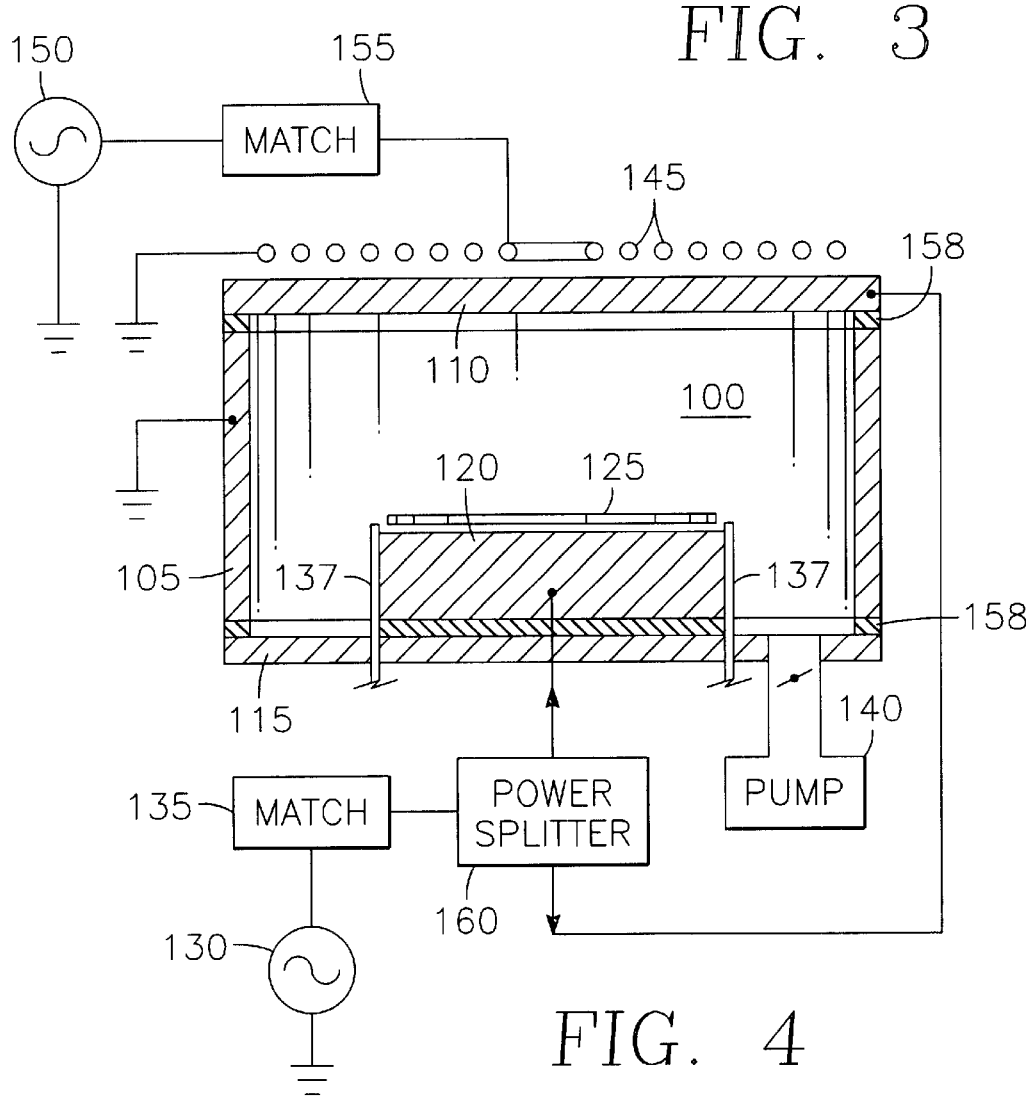
FIG. 4 illustrates an embodiment of the invention employing power splitting between the silicon ceiling and the wafer pedestal
Figure 5:
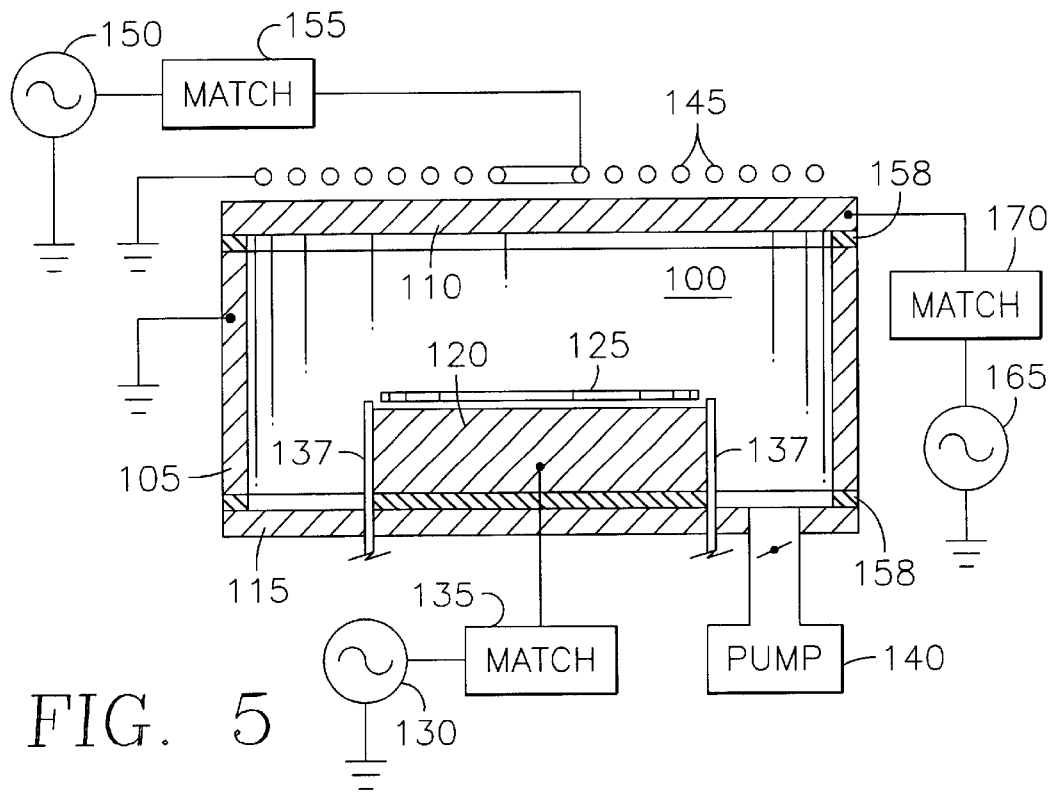
FIG. 5 illustrates an embodiment of the invention employing separate RF power sources to drive the wafer pedestal, the overhead induction coil and the silicon ceiling.
Figure 6:
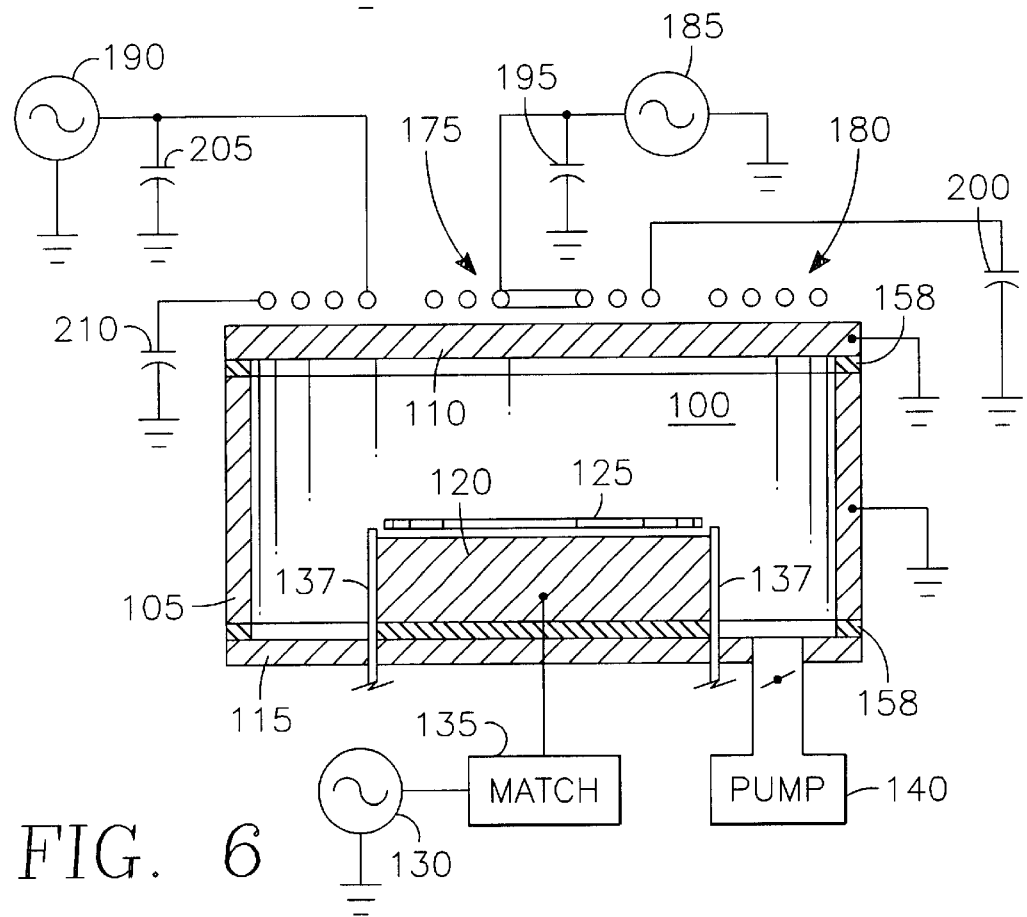
FIG. 6 illustrates an embodiment of the invention in which the overhead inductive antenna is divided into separately powered concentric inner and outer windings.

While the silicon ceiling 110 is grounded in the preferred embodiment of FIG. 1, in the embodiment FIG. 4 power from the RF generator 130 is split by a power splitter 160 between the pedestal 120 and the silicon ceiling 110. In order to provide a ground return path, the side wall 105 may be a grounded conductor. In FIG. 5, the silicon ceiling 110 is driven independently from the wafer pedestal 120 by a separate RF power generator 165 through a conventional impedance match circuit 170. While the embodiment of FIG. 1 employs a single coil as the inductor antenna 145, in the embodiment of FIG. 6 the inductor antenna 145 is comprised of plural (in this case, two) independently driven coils, namely an inner coil 175 overlying the wafer center and an outer coil 180 overlying the wafer periphery. In the implementation of FIG. 6, the inner and outer coils 175, 180 are planar concentric coils driven by separate plasma source power generators 185, 190. The advantage is that plasma variations along the radius of the chamber 100 can be compensated by selecting different power levels from the two RF generators 185, 190. In a prototype of the embodiment of FIG. 6, the inner and outer coils consisted of nine turns each. A fixed impedance match was realized using parallel and series capacitors 195, 200 connected to the input and return ends, respectively, of the inner coil 175 and parallel and series capacitors 205, 210 connected to the input and return ends, respectively, of the outer coil 180.

In a working example, the plasma source RF power generator 155 produced 2600 Watts at 2.0 MHz, the bias RF power generator 130 produced 1600 Watts at 1.8 MHz, $C_2F_6$ gas was pumped into the chamber 100 at a rate of 30 sccm with 100 cc of Argon, the chamber pressure was maintained at 6.5 mTorr and the temperature of the silicon ceiling 110 was maintained at 200° C. Under these conditions, the parallel and series capacitors 195, 200 of the inner coil 175 had capacitances of 8.19699 nanoFarads and 2.12631 nanoFarads, respectively, while the parallel and series capacitors 205, 210 of the outer coil 180 had capacitances of 4.45572 nanoFarads and 1.09085 nanoFarads, respectively. By shorting one of the inner and outer coils 175, 180, the input impedance of the other could be measured. Indeed, with the foregoing capacitances being selected, the complex impedance of the inner coil 175 was measured as 51 Ω at a complex plane angle of −12° and the complex impedance of the outer coil 180 was measured as 51.8 Ω at a complex plane angle of −8.6°. Thus, their impedance nearly matched the standard 50 Ω output of the RF generators 185 and 190.

Figure 7:
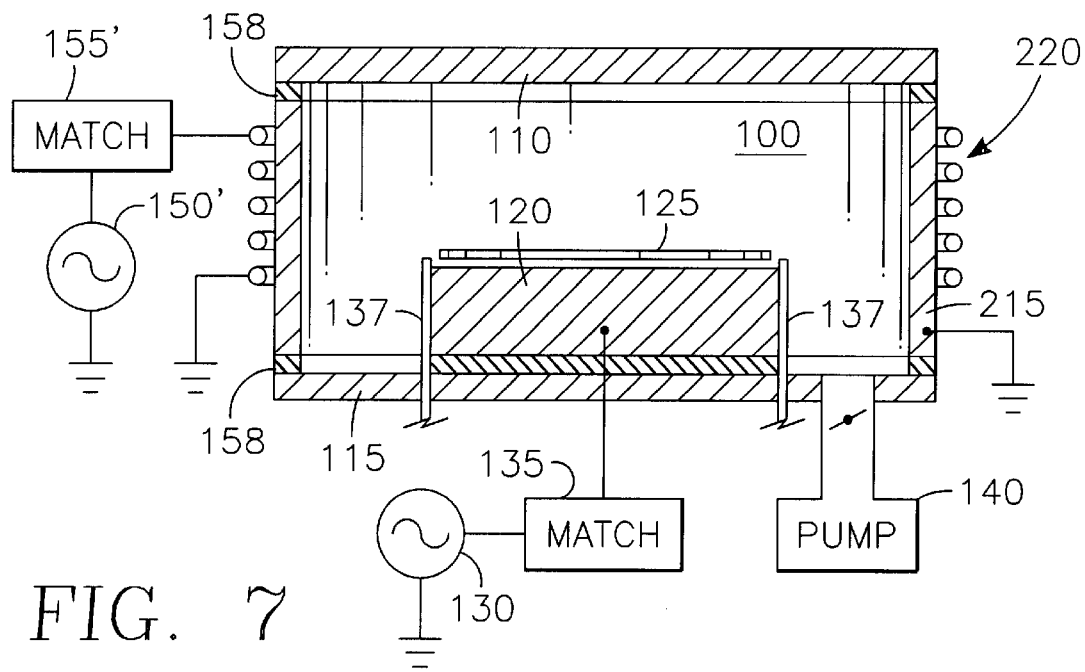
FIG. 7 illustrates an embodiment employing a side inductive antenna wound around a cylindrical silicon side wall.
Figure 8:
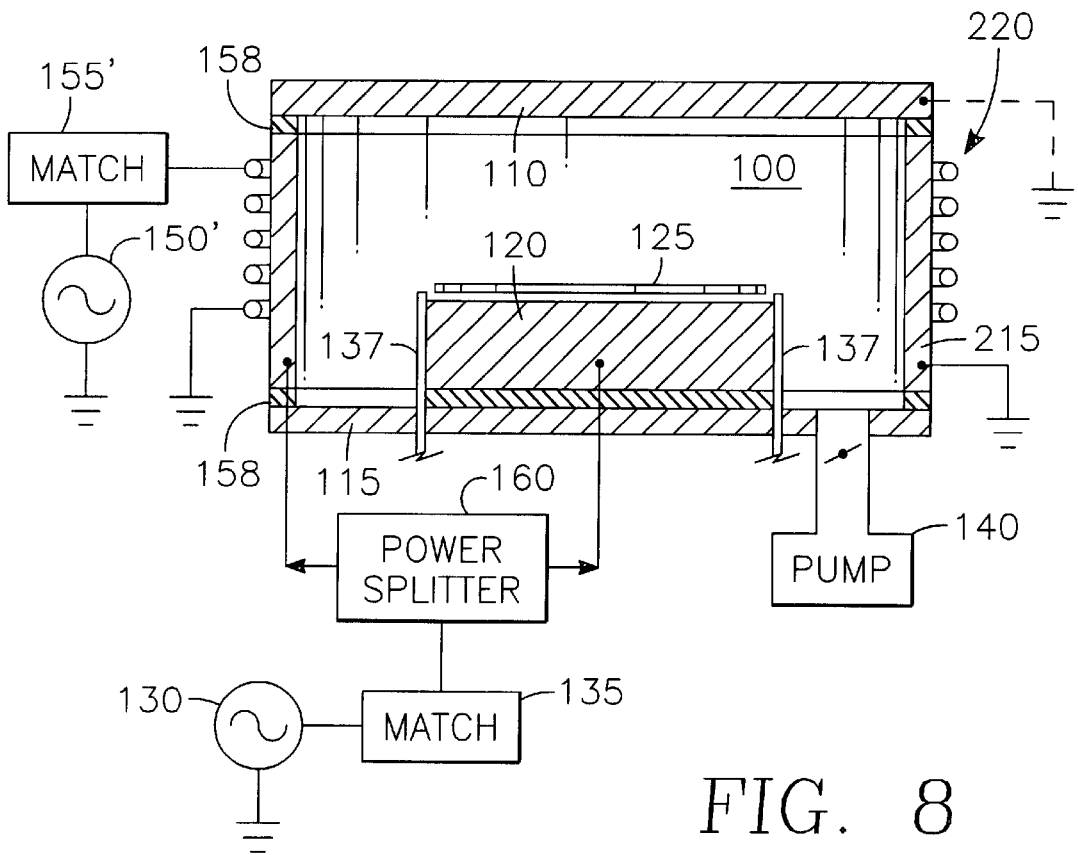
FIG. 8 illustrates an embodiment corresponding to that of FIG. 7 in which power from a single RF power source is split between the silicon side wall and the wafer pedestal.
Figure 9:
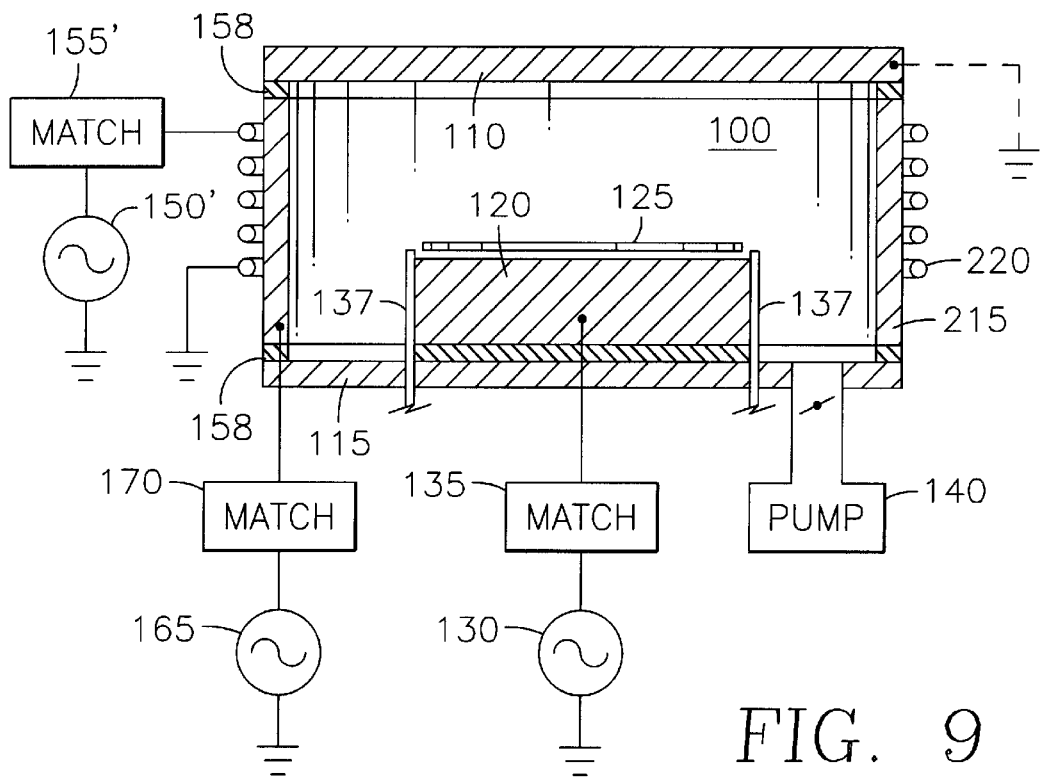
FIG. 9 illustrates and embodiment employing separate RF generators driving the silicon side wall, the wafer pedestal and the inductive side antenna.
Figure 10:
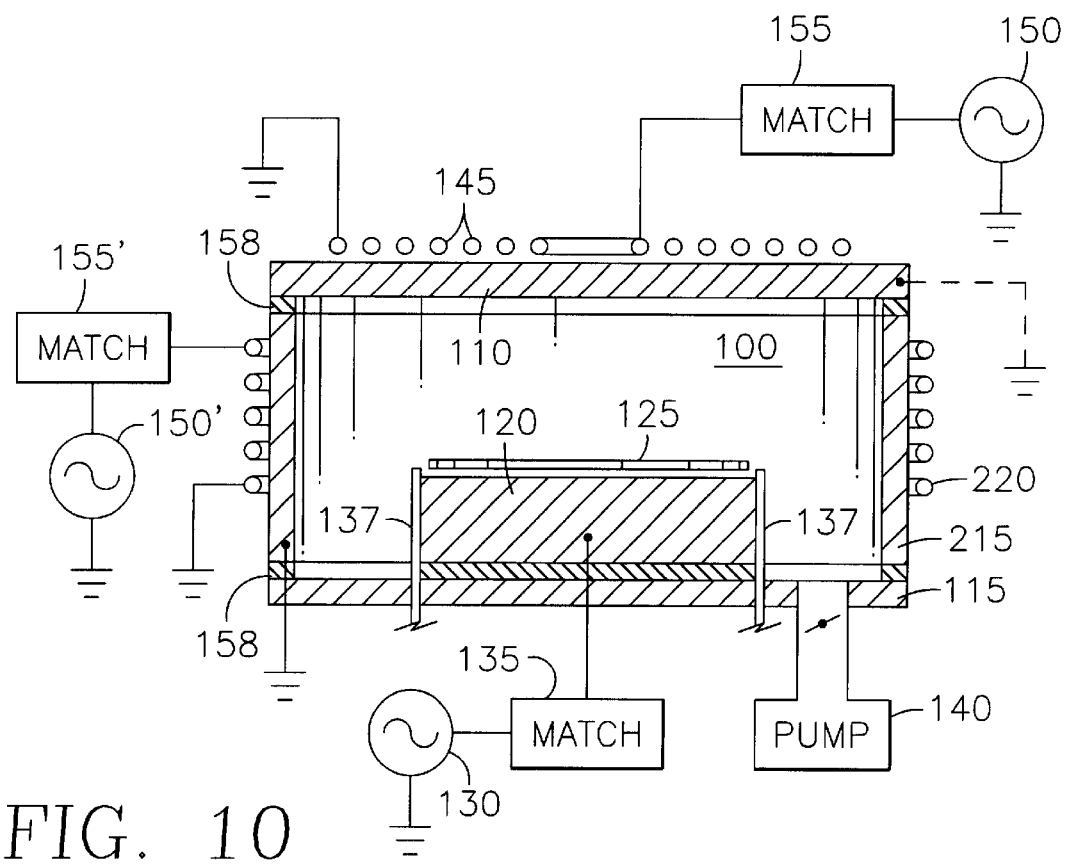
FIG. 10 illustrates and embodiment combining the silicon ceiling and overhead inductive antenna with the silicon side wall and the inductive side coil wound thereabout.
Figure 11:
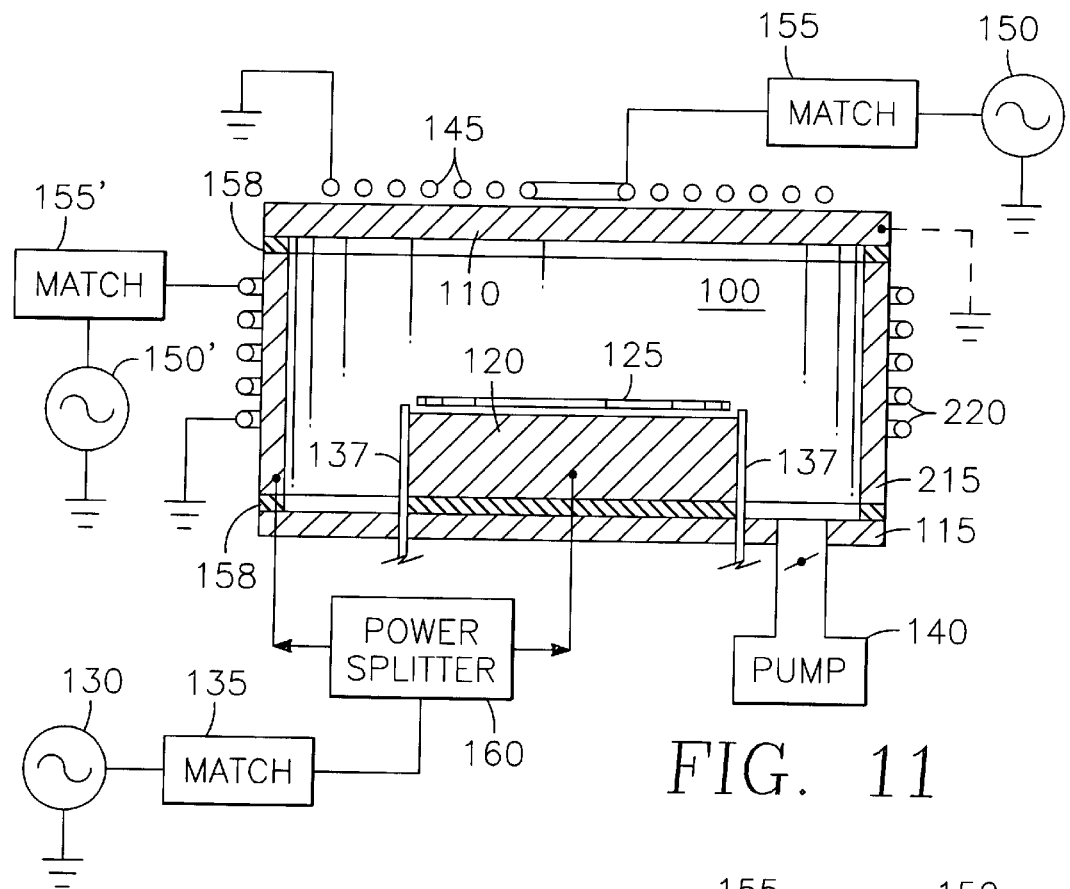
FIG. 11 illustrates an embodiment corresponding to that of FIG. 10 employing power splitting between the silicon side wall and the wafer pedestal.
Figure 12:
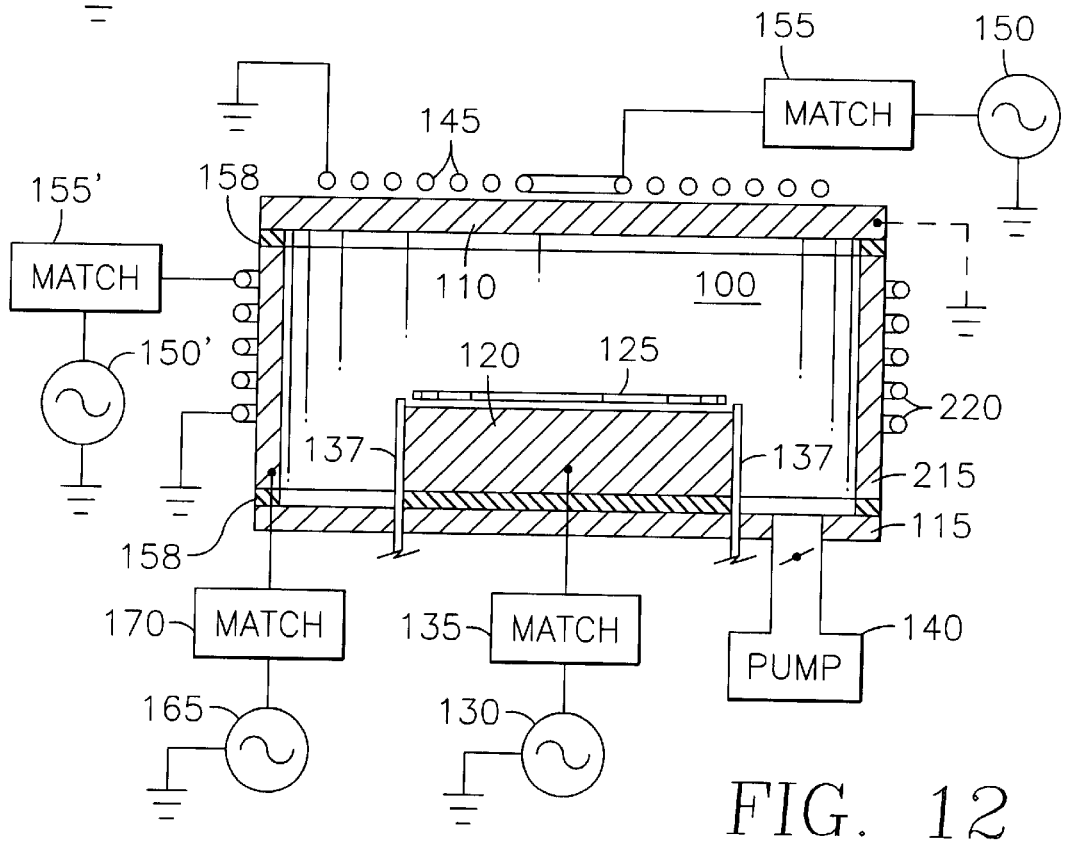
FIG. 12 illustrates an embodiment in which the silicon ceiling, the silicon side wall, the overhead inductive antenna and the side inductive antenna are separately driven with RF power.

In the embodiment of FIG. 7, the side wall 105 is replaced by a silicon side wall 215 and inductive coupling is provided by a coil inductor 220 wound around the exterior of the silicon side wall 215 and connected to the plasma source power generator 150' through the impedance match circuit 155'. In FIG. 7, the silicon side wall 215 is grounded. As in the embodiment of FIG. 4, FIG. 8 illustrates that the power splitter 160 may split RF power from the bias generator 130 between the pedestal 120 and the silicon side wall 215. As in the embodiment of FIG. 5, FIG. 9 shows how the silicon side wall 215 may be independently powered by the separated RF generator 165 through the match circuit 170. FIG. 10 shows how the silicon ceiling 110 and overhead coil antenna 145 of FIG. 1 may be combined with the silicon side wall 215 and side coil antenna 220 of FIG. 7. FIG. 11 illustrates how the power splitter 160 of FIG. 8 may be employed in the embodiment of FIG. 10 to split power from the bias generator 130 between the side wall 215 and the pedestal 120. FIG. 12 illustrates the combination of the embodiment of FIG. 9 with the overhead coil antenna 145 and silicon ceiling 110 of FIG. 1.

Figure 14:
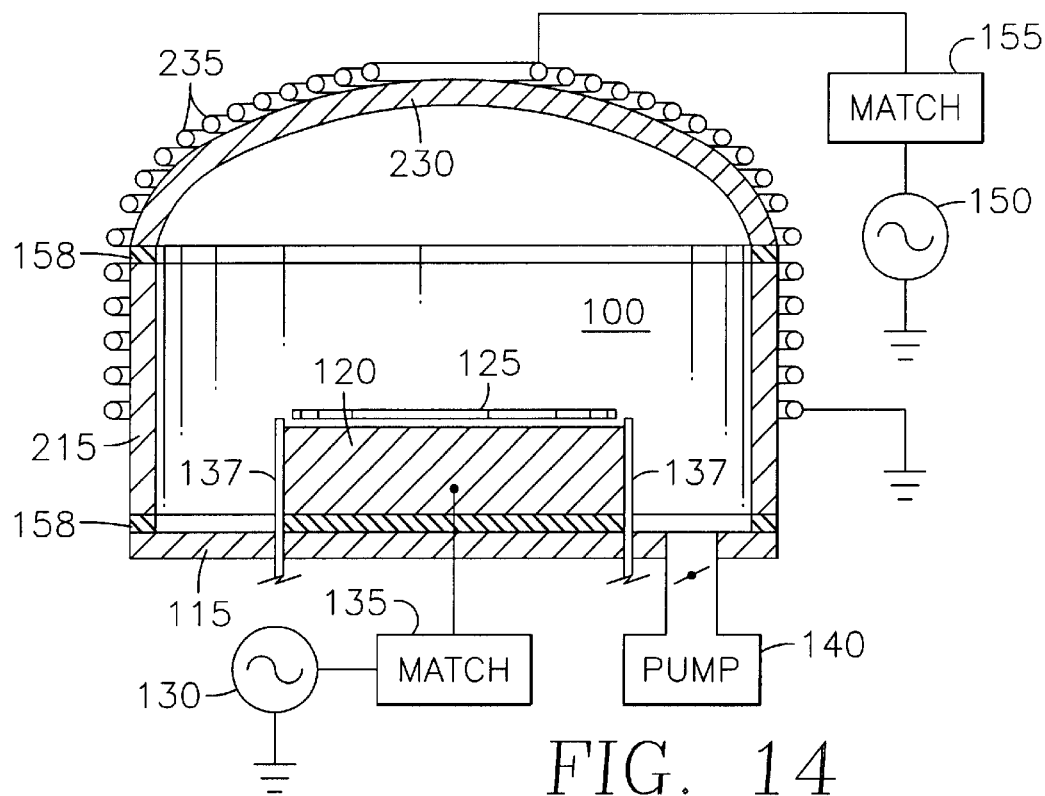
FIG. 14 illustrates an embodiment having a dome-shaped silicon ceiling and an overlying inductive antenna having a dome-shaped portion overlying the ceiling and continuing into a cylindrical portion wrapped around the cylindrical side wall.
Figure 15:
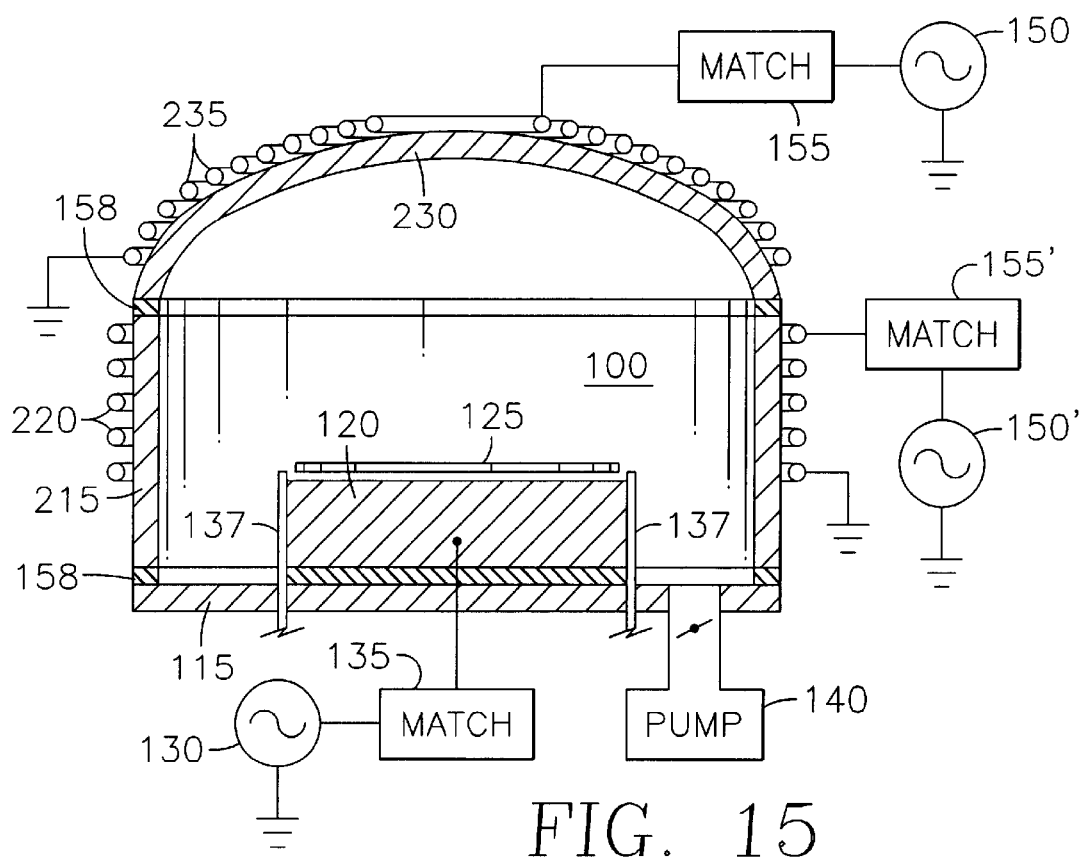
FIG. 15 illustrates and embodiment corresponding to that of FIG. 14 but in which the dome-shaped and cylindrical portions of the inductive antenna are isolated from one another and separately driven with RF power.

FIGS. 13A, 13B, 13C and 13D illustrate modifications of the embodiments of FIGS. 1, 4, 5 and 6, respectively, in which the planar silicon ceiling 110 and planar inductive coil antenna 145 have been replaced by a dome-shaped silicon ceiling 230 and a dome-shaped coil antenna 235, respectively. In one implementation, the dome-shaped coil antenna 235 is wound in a helix. FIG. 14 illustrates an embodiment in which the dome-shaped coil antenna 235 extends from near the top of the dome-shaped ceiling 230 and past the bottom of the dome-shaped ceiling 230 to wind around the side wall 105. In this case, at least that portion of the side wall 105 surrounded by the bottom portion of the coil antenna 235 would have to be a non-conductor such as quartz or a semiconductor such as silicon. FIG. 15 illustrates an embodiment corresponding to that of FIG. 10 in which the flat silicon ceiling 110 and the flat coil antenna 145 are replaced by the dome-shaped silicon ceiling 230 and the dome-shaped coil antenna 235 of FIG. 13A.

Figure 16:
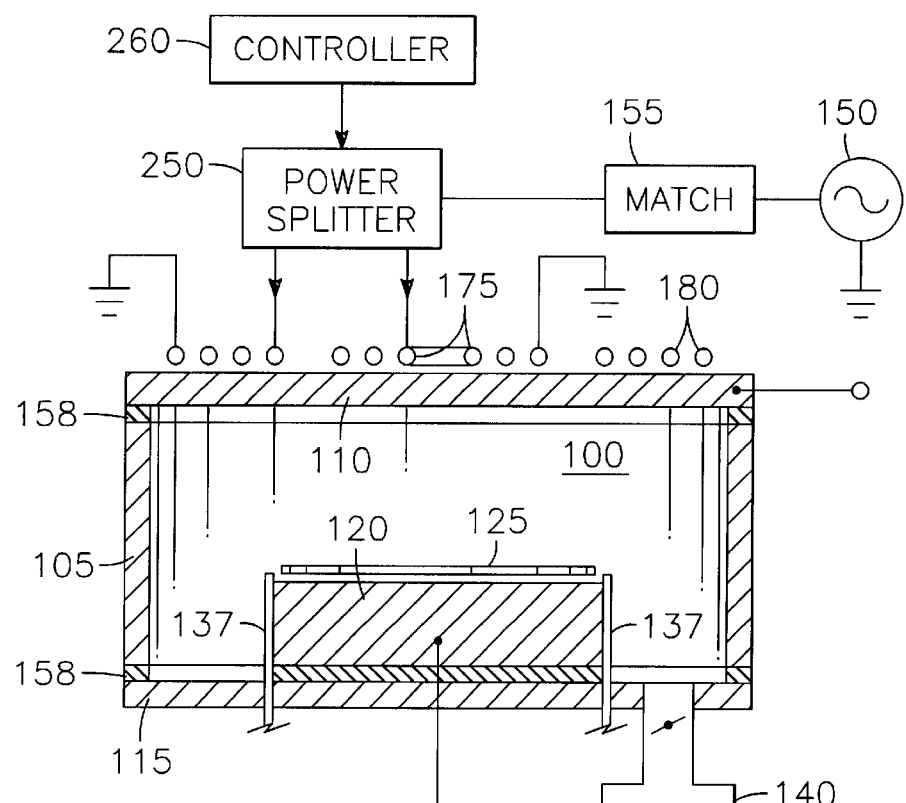
FIG. 16 illustrates an embodiment corresponding to that of FIG. 6 in which power from a common RF generator is split between the inner and outer inductive antennas.
Figure 18:
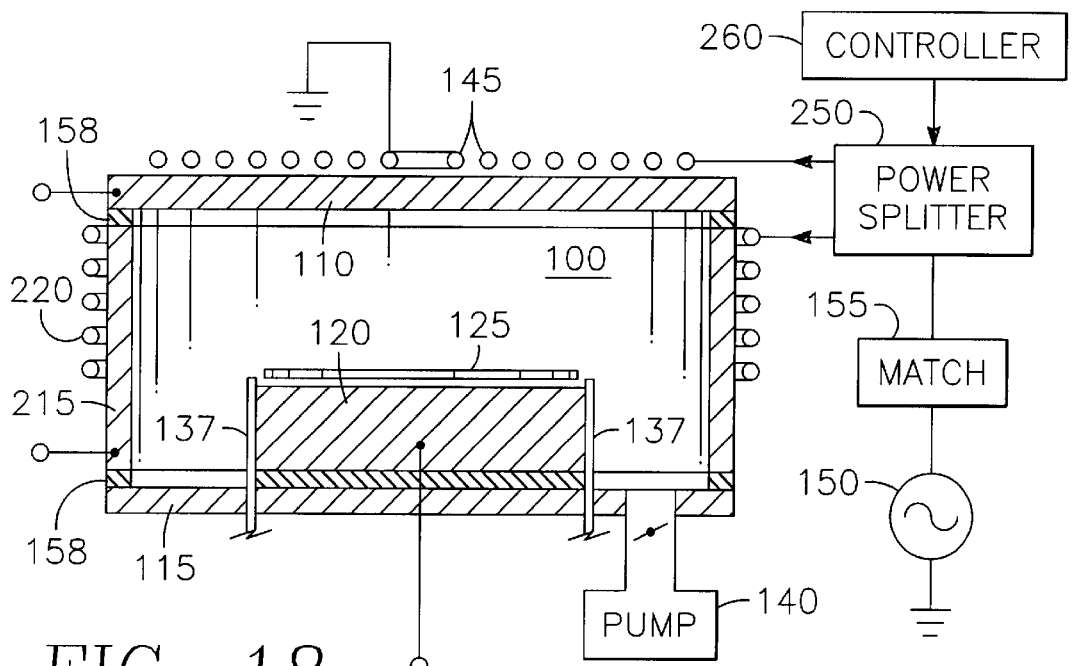
FIG. 18 illustrates an embodiment corresponding to that of FIG. 10 in which power from a common RF generator is split between the overhead inductive antenna and the side inductive antenna.
Figure 17A:
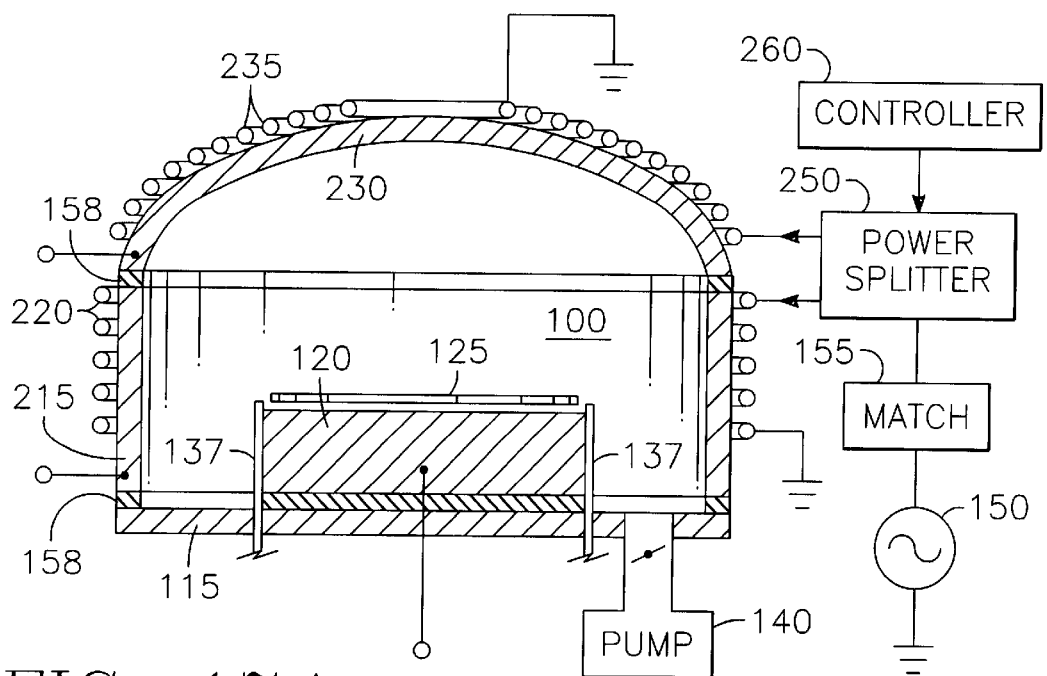
FIG. 17A illustrates an embodiment corresponding to that of FIG. 15 in which power from a common RF generator is split between the dome-shaped and cylindrical inductive antenna portions.
Figure 17B:
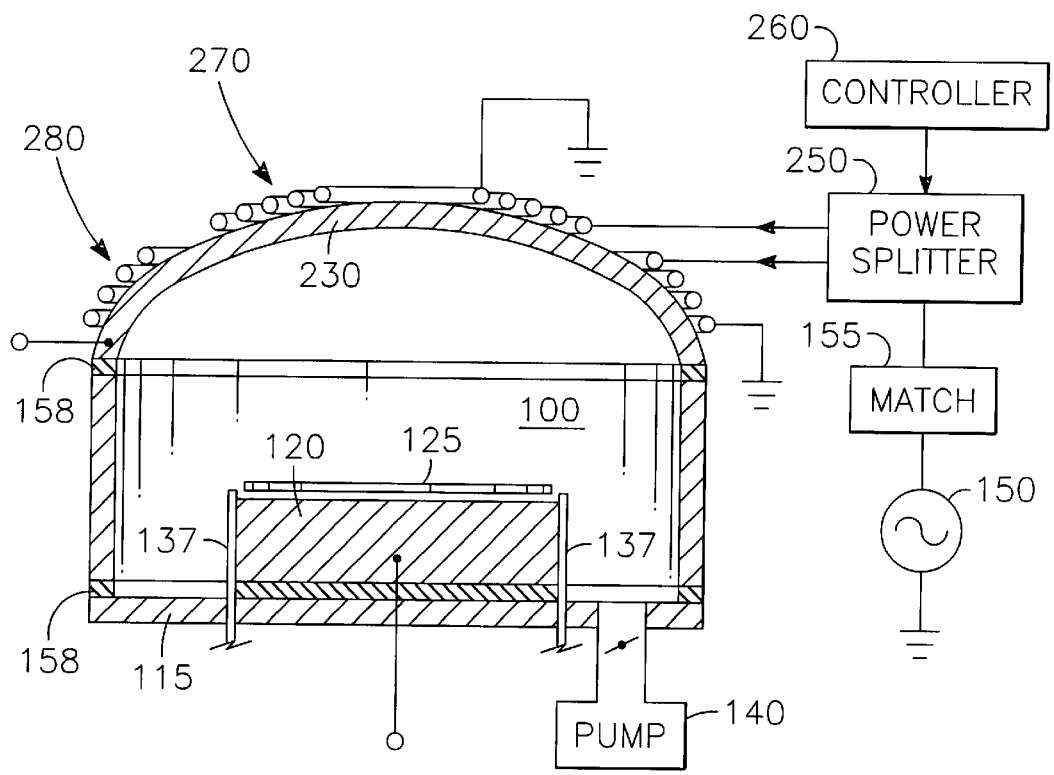
FIG. 17B illustrates an embodiment having separate inner and outer dome-shaped inductive antennas between which power from a common RF generator is split.

FIG. 16 illustrates how a power splitter 250 can be employed to split power from the plasma source RF power generator 150 between the inner and outer coil antennas 175, 180 overlying the silicon ceiling 110 of FIG. 6. An RF power splitter is disclosed in U.S. Pat. No. 5,349,313 to Collins et al. As disclosed in the co-pending Collins et al. patent application incorporated by reference above, a controller 260 can vary the power ratio between the inner and outer coil antennas 175, 180 to compensate for any difference between the plasma ion densities over the wafer center and the plasma ion density over the wafer periphery. FIG. 17A illustrates an embodiment corresponding to that of FIG. 15 in which the power splitter 250 splits RF power from the plasma source power generator 150 between the side coil 220 and the dome-shaped overhead coil 235. FIG. 17B illustrates an embodiment with the dome-shaped silicon ceiling 230 having an inner (upper) dome-shaped coil 270 and an outer (lower) dome-shaped coil 280. The power splitter 250 splits RF power from the plasma source power generator 150 between the inner and outer dome-shaped coils 270, 280. The silicon ceiling 230 and the wafer pedestal 120 of FIG. 17B may be connected in accordance with any one of the embodiments of FIGS. 13A, 13B or 13C. FIG. 18 shows how the power splitter 250 can split power from the plasma source RF power generator 150 between the overhead coil antenna 145 and the side coil antenna 220 of FIG. 10.

Figure 19:
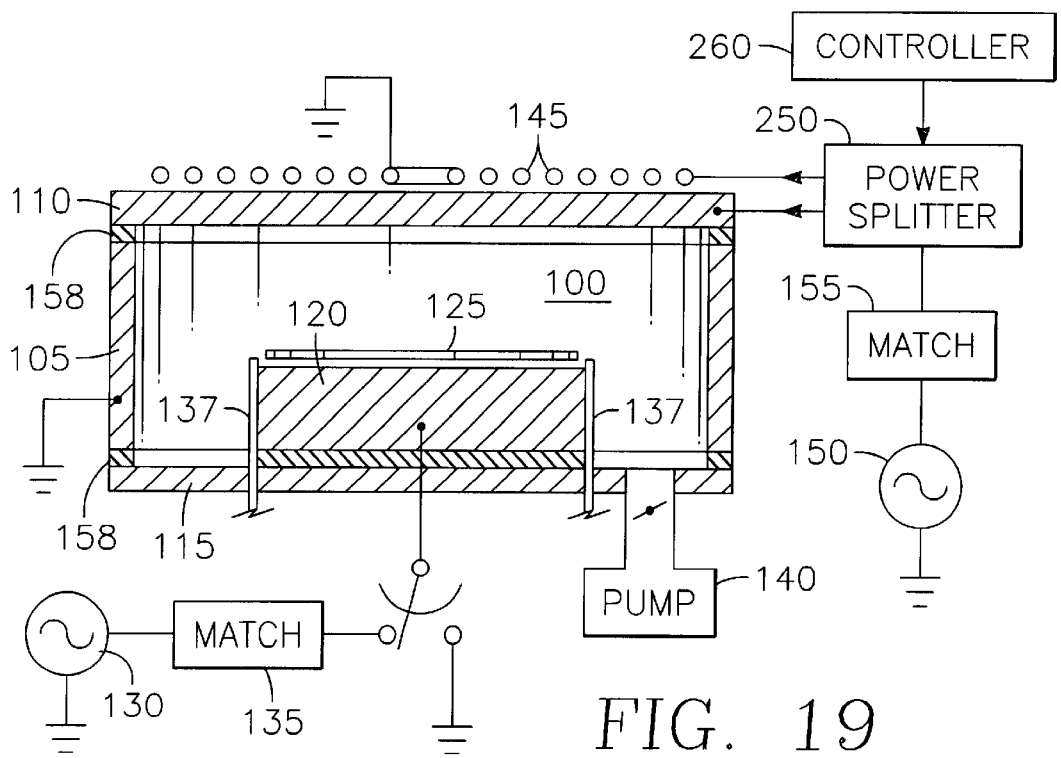
FIG. 19 illustrates an embodiment corresponding to that of FIG. 1 in which power from a common RF generator is split between the overhead inductive antenna and the silicon ceiling.
Figure 20:
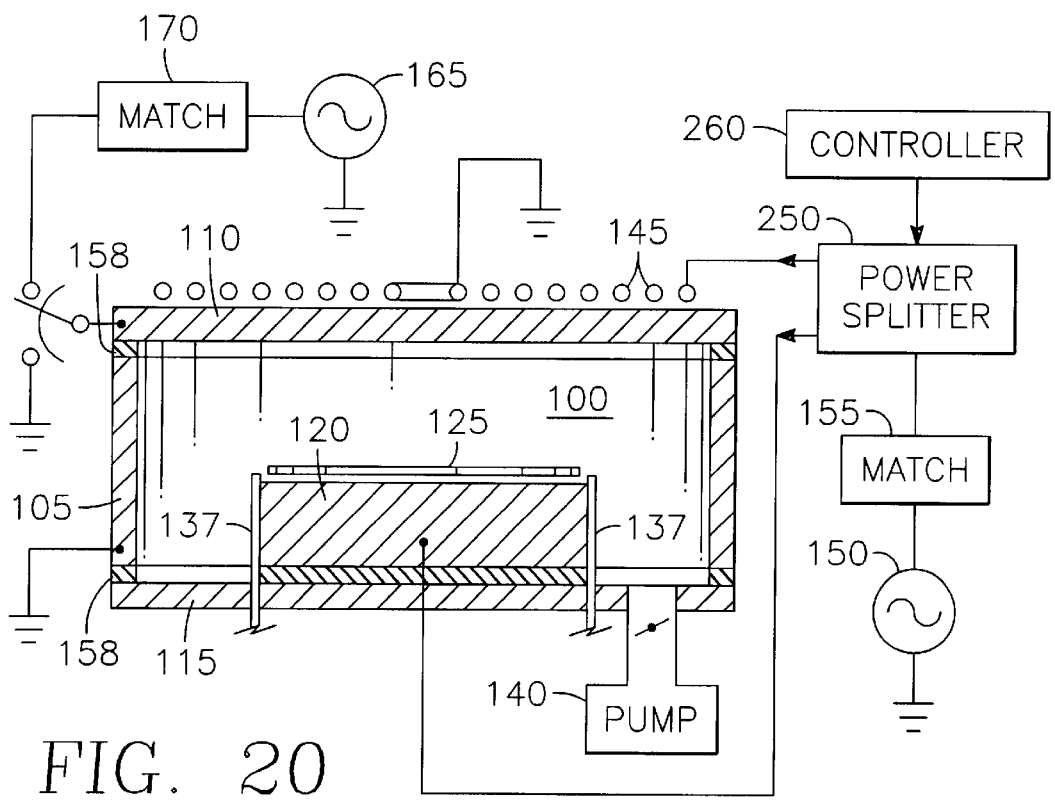
FIG. 20 illustrates an embodiment corresponding to that of FIG. 1 in which power from a common RF generator is split between the overhead inductive antenna and the wafer pedestal.
Figure 21:
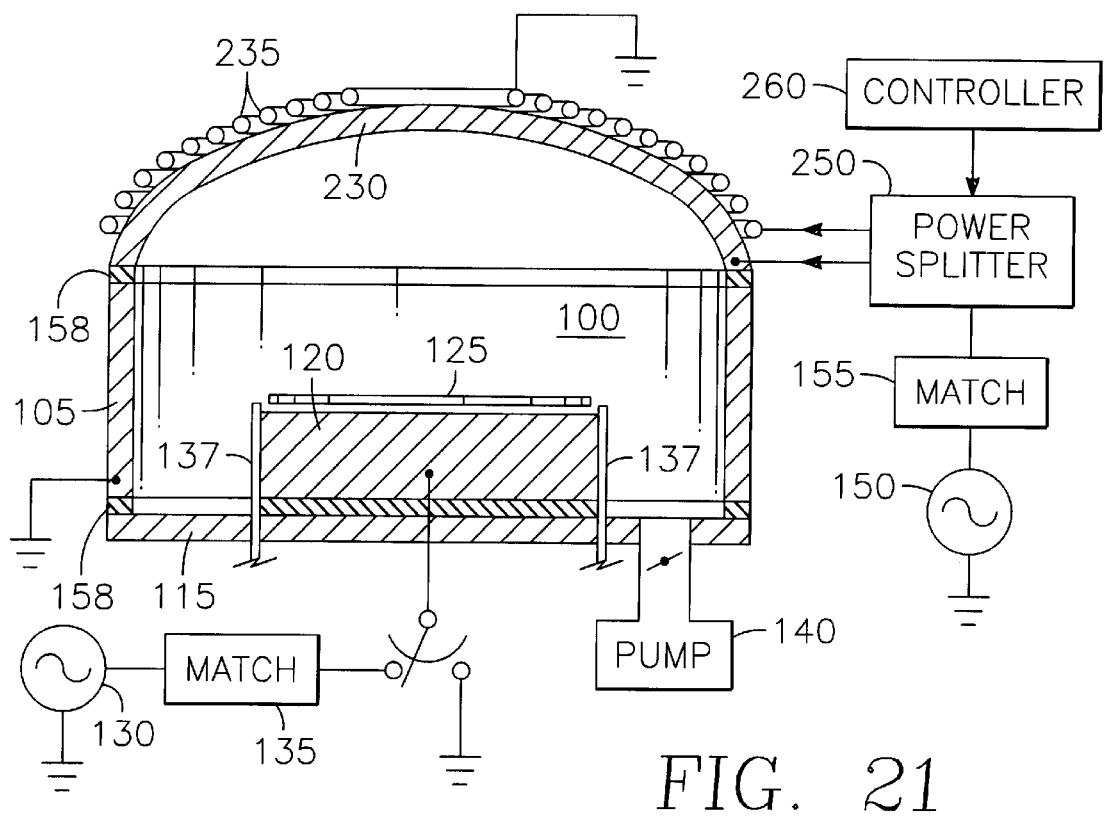
FIG. 21 illustrates an embodiment corresponding to that of FIG. 13A having a dome-shaped ceiling in which power from a common RF generator is split between the overhead inductive antenna and the dome-shaped silicon ceiling.
Figure 22:
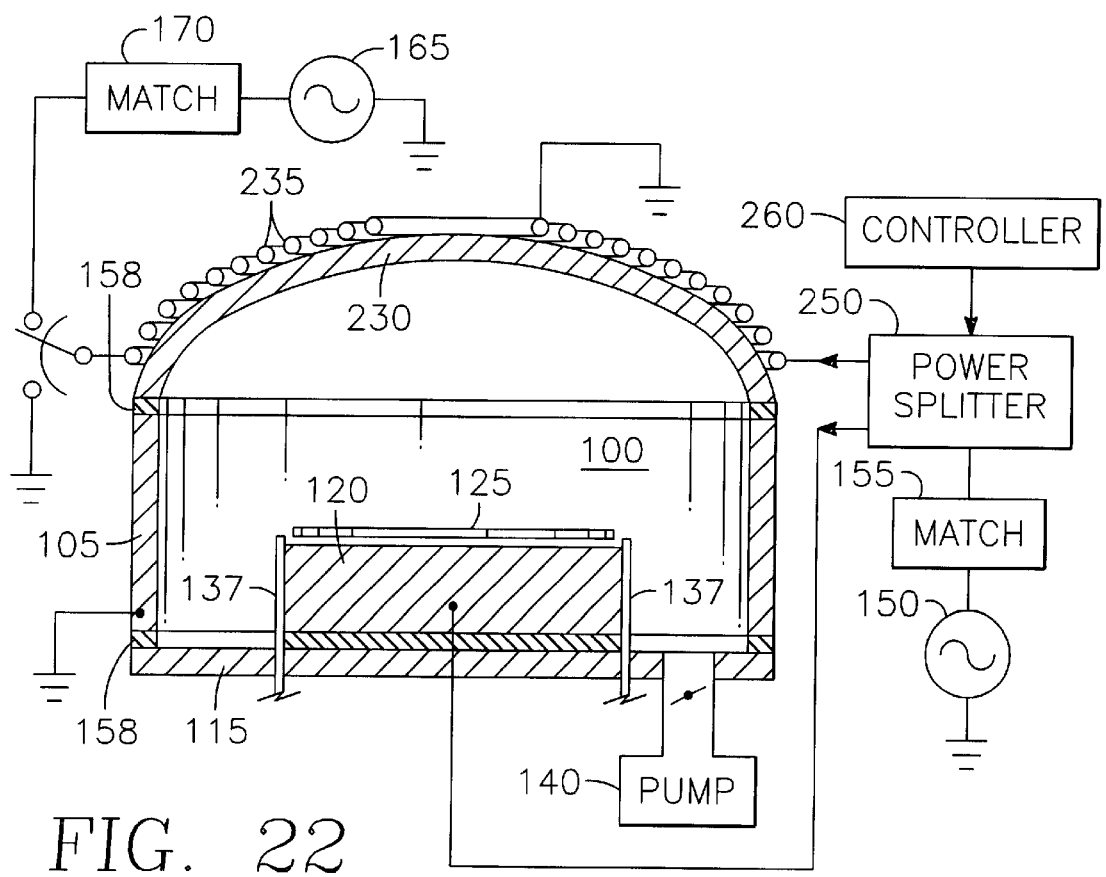
FIG. 22 illustrates an embodiment corresponding to that of FIG. 13A having a dome-shaped ceiling in which power from a common RF generator is split between the overhead inductive antenna and the wafer pedestal.

FIG. 19 illustrates how the power splitter 250 can split power from the plasma source RF generator 150 between the overhead coil antenna 145 and the silicon ceiling 110. In the embodiment of FIG. 19, the wafer pedestal 120 can either be grounded are connected to the bias RF power generator 130 through the impedance match circuit 135. FIG. 20 illustrates how the power splitter 250 can split power from the RF generator 150 between the overhead coil antenna 145 and the wafer pedestal 120. In the embodiment of FIG. 20, the silicon ceiling 110 can either be grounded or can be connected to the separate RF power generator 165 through the match circuit 170. FIG. 21 is an embodiment corresponding to that of FIG. 19 but employing the dome-shaped silicon ceiling 230 and the dome-shaped coil antenna 235 in lieu of the flat silicon ceiling 110 and the planar coil antenna 145 of FIG. 19. FIG. 22 is an embodiment corresponding to that of FIG. 20 but employing the dome-shaped silicon ceiling 230 and the dome-shaped coil antenna 235 in lieu of the flat silicon ceiling 110 and the planar coil antenna 145 of FIG. 20.

Figure 23:
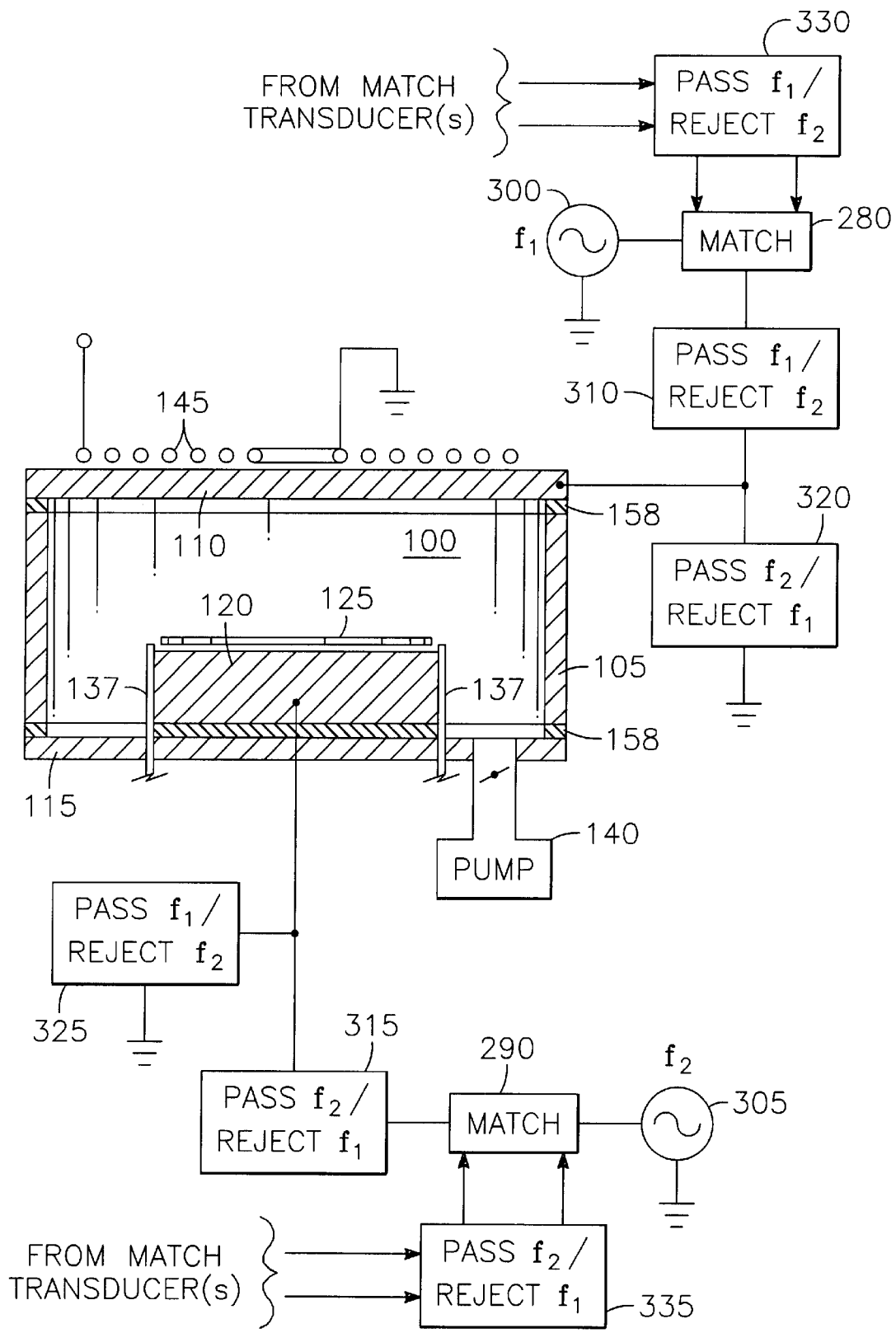
FIG. 23 illustrates an embodiment in which the wafer pedestal and the silicon ceiling are separately driven with RF power and each serves as the counter electrode for the other.

FIG. 23 illustrates an embodiment in which the silicon ceiling 110 and the wafer pedestal 120 are each the RF ground return for the other. The ceiling and pedestal 110, 120 are driven through respective impedance match circuits 280, 290 by respective independent RF power generators 300, 305 of respective RF frequencies $f_1$ and $f_2$ through respective RF isolation filters 310, 315 and are each connected to ground through respective ground RF filters 320, 325. The isolation filters 310, 315 prevent the RF energy from either one of the RF power generators 300, 305 from reaching the other. The ground RF filters 320, 325 permit each one of the ceiling and pedestal 110, 120 to return to ground the RF power radiated across the chamber 100 by the other. At the same time, the ground RF filters 320, 325 prevent the RF power applied to either one of the ceiling and pedestal 110, 120 from being shorted directly to ground. Specifically, the isolation filter 310 connected between the silicon ceiling 110 and the RF power generator 300 of frequency $f_1$ passes RF power at the frequency $f_1$ and blocks RF power at the frequency $f_2$. The isolation filter 315 connected between the wafer pedestal 120 and the RF power generator 305 of frequency $f_2$ passes RF power at the frequency $f_2$ and blocks RF power at the frequency $f_1$. The ground filter 320 connected between the silicon ceiling 110 and ground passes RF power at the frequency $f_2$ and blocks RF power at the frequency $f_1$. The ground filter 325 connected between the wafer pedestal 120 and ground passes RF power at the frequency $f_1$ and blocks RF power at the frequency $f_2$.

The impedance match circuits 280, 290 are of the conventional type discussed previously herein and employ voltage and current sensors or impedance match transducers (not shown) in the conventional manner to measure actual input impedance. In order to prevent the RF power from either one of the two RF generators 300, 305 from interfering with the operation of the impedance match circuit of the other, respective match isolation filters 330, 335 are connected between the impedance match transducers and the transducer inputs to the impedance match circuits 280, 290, respectively. The match isolation filter 330 at the input to the $f_1$ match circuit 280 passes RF power at the frequency $f_1$ and blocks RF power at the frequency $f_2$. The match isolation filter 335 at the input to the $f_2$ match circuit 290 passes RF power at the frequency $f_2$ and blocks RF power at the frequency $f_1$.

The various RF filters 310, 315, 320, 325, 330, 335 may be constructed of passive reactive components (capacitors and inductors) using techniques well-known in the art. If the two frequencies $f_1$, $f_2$ are widely separated (e.g., by an octave), then the various RF filters 310, 315, 320, 325, 330, 335 can be suitable high-pass and low-pass filters with the suitably selected cut-off frequencies. Otherwise, if the two frequencies $f_1$, $f_2$ are not sufficiently separated, then the various RF filters 310, 315, 320, 325, 330, 335 should be bandpass or band reject filters centered at the appropriate frequencies.

Figure 13A:
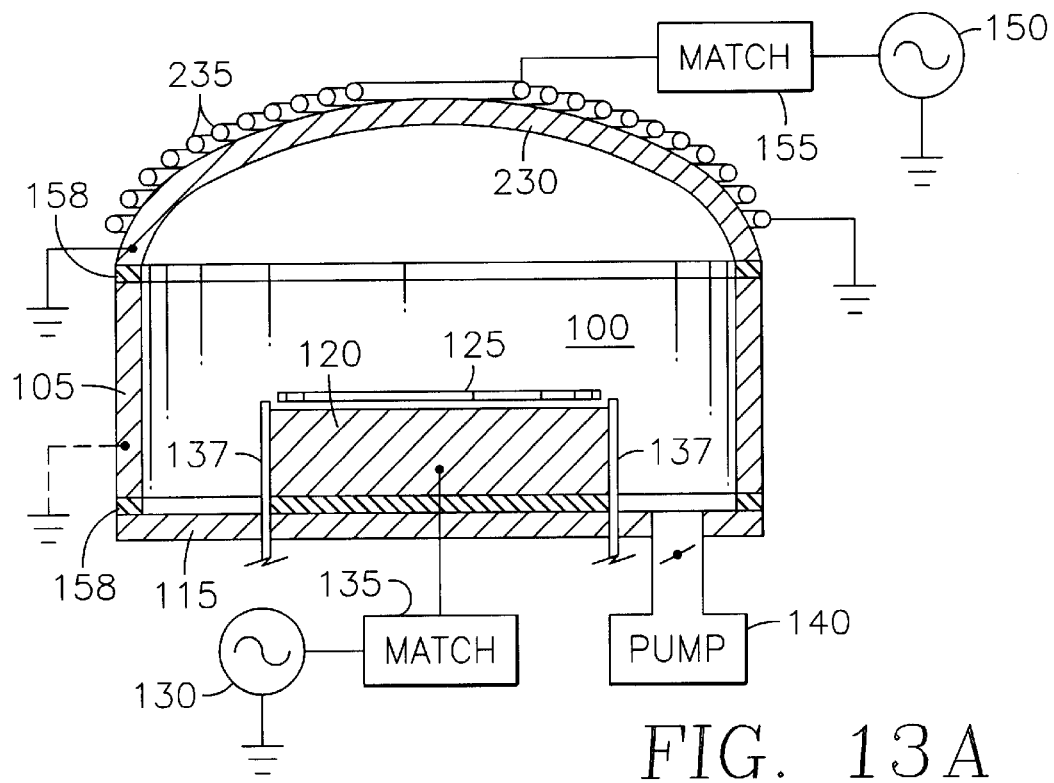
FIG. 13A illustrates an embodiment corresponding to that of FIG. 1 employing a dome-shaped silicon ceiling.
Figure 13B:
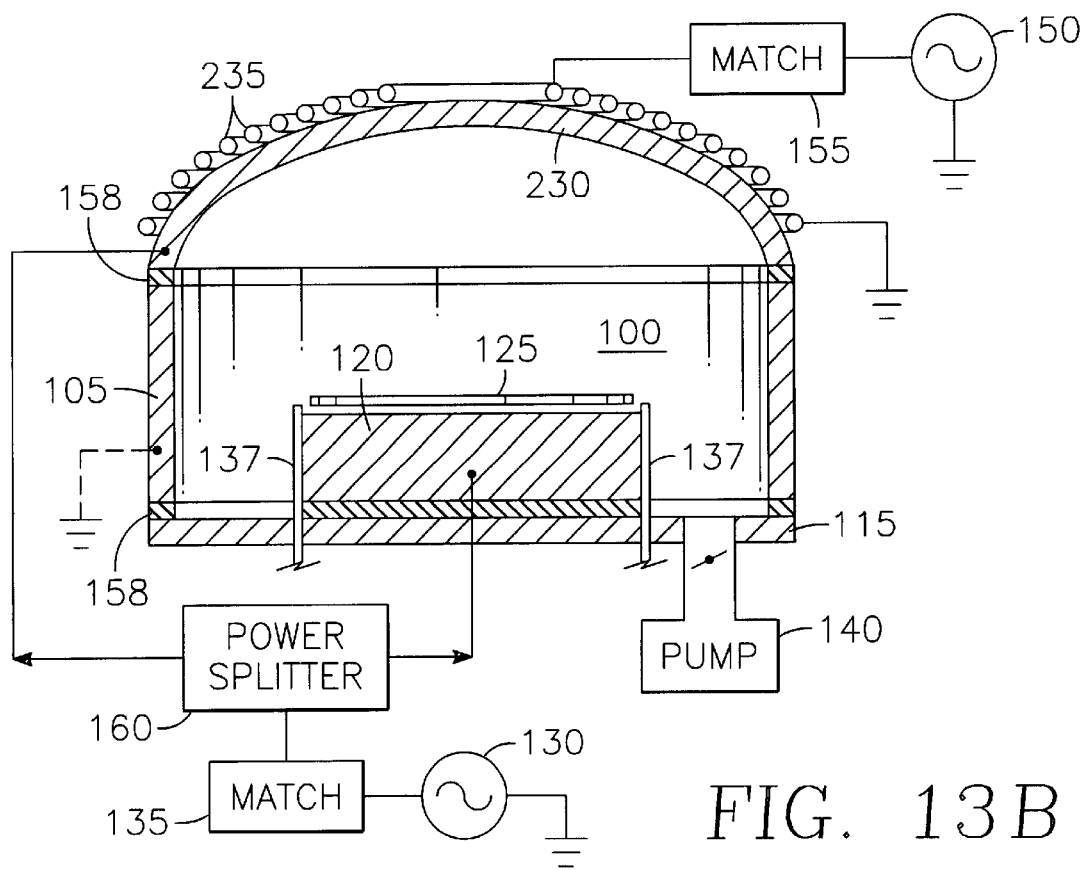
FIG. 13B illustrates an embodiment corresponding to that of FIG. 4 employing a dome-shaped silicon ceiling.
Figure 13C:
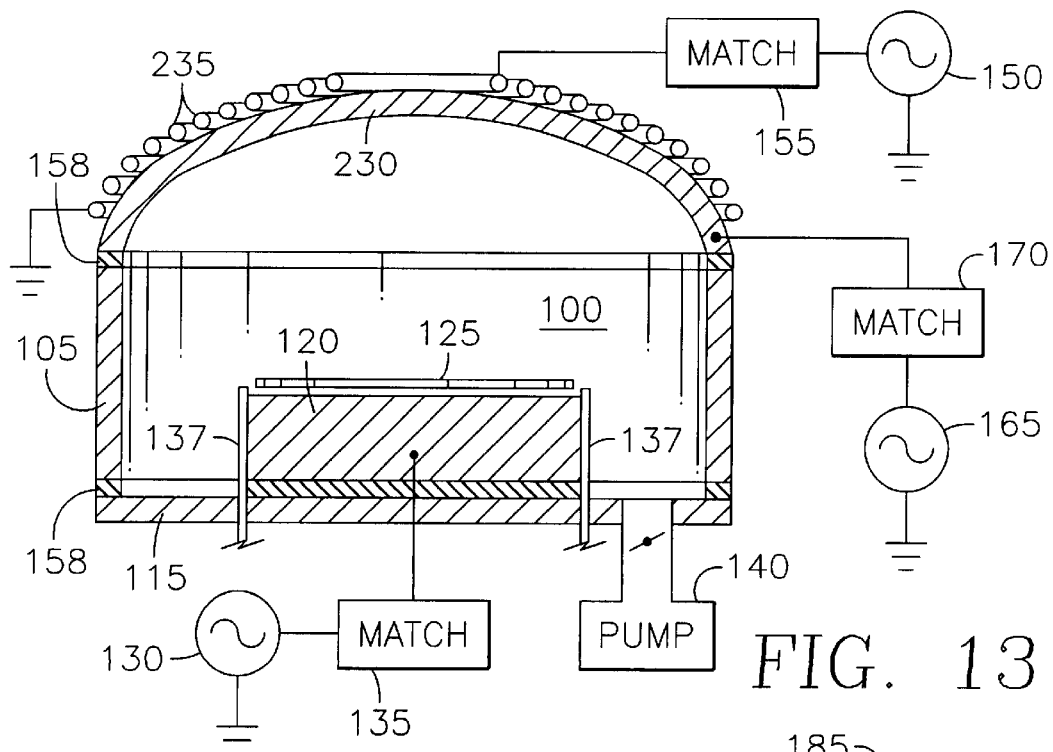
FIG. 13C illustrates an embodiment corresponding to that of FIG. 5 employing a dome-shaped silicon ceiling.
Figure 13D:
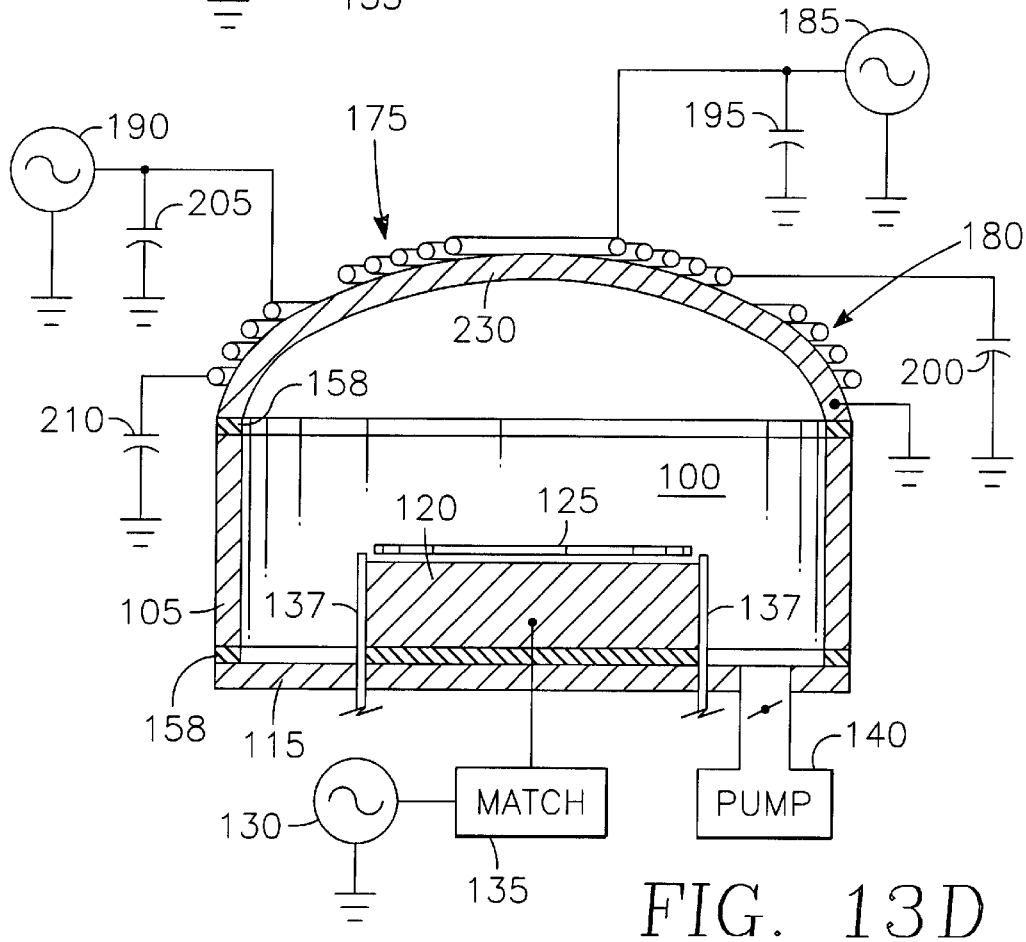
FIG. 13D illustrates an embodiment corresponding to that of FIG. 6 employing a dome-shaped silicon ceiling.
Figure 24:
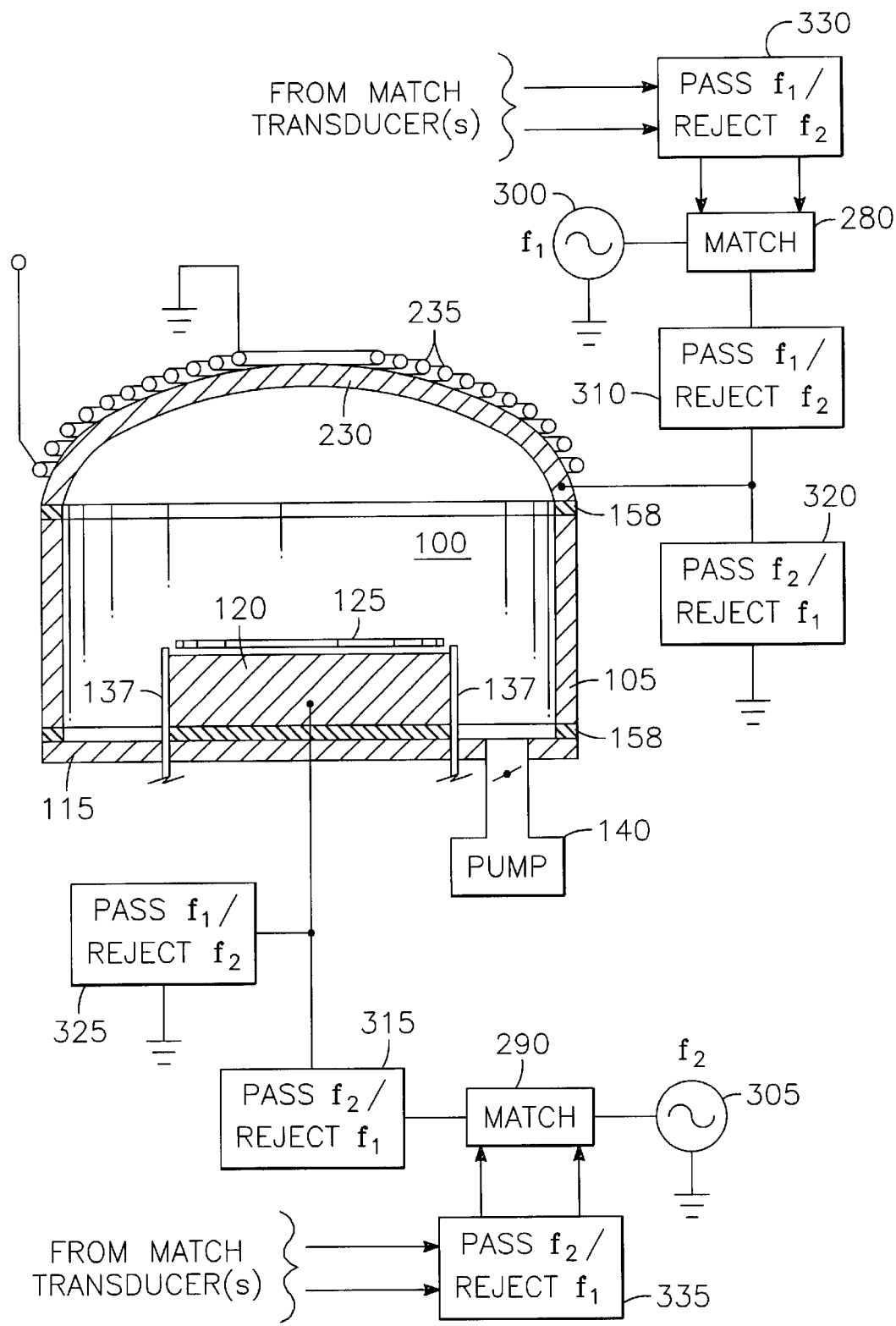
FIG. 24 illustrates and embodiment corresponding to that of FIG. 23 in which the silicon ceiling is dome-shaped.

FIG. 24 illustrates an embodiment corresponding to that of FIG. 23 but employing the dome-shaped silicon ceiling 230 and dome-shaped coil antenna 235 of FIG. 13A in lieu of the flat silicon ceiling 110 and planar coil antenna 145 of FIG. 23.

Figure 25A:
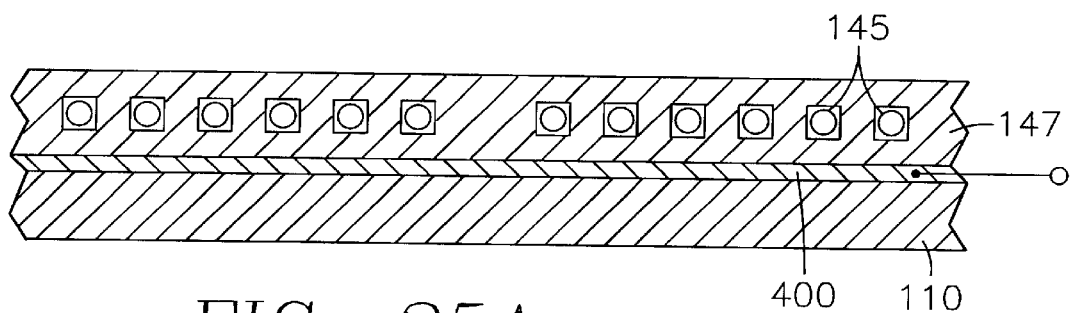
FIG. 25A is a side view of an embodiment of the silicon ceiling including a conductive back plane.
Figure 25B:
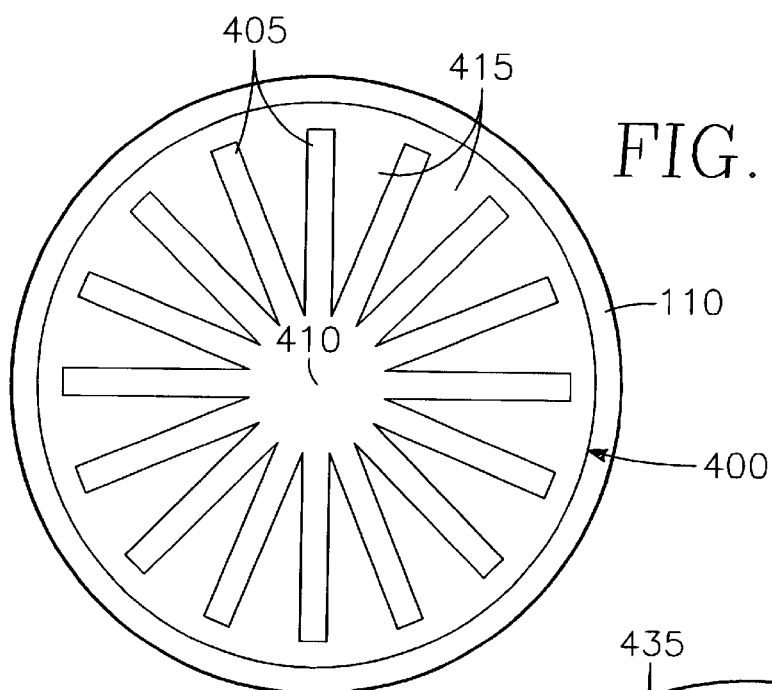
FIG. 25B is a top view of one embodiment of the conductive back plane.
Figure 25C:
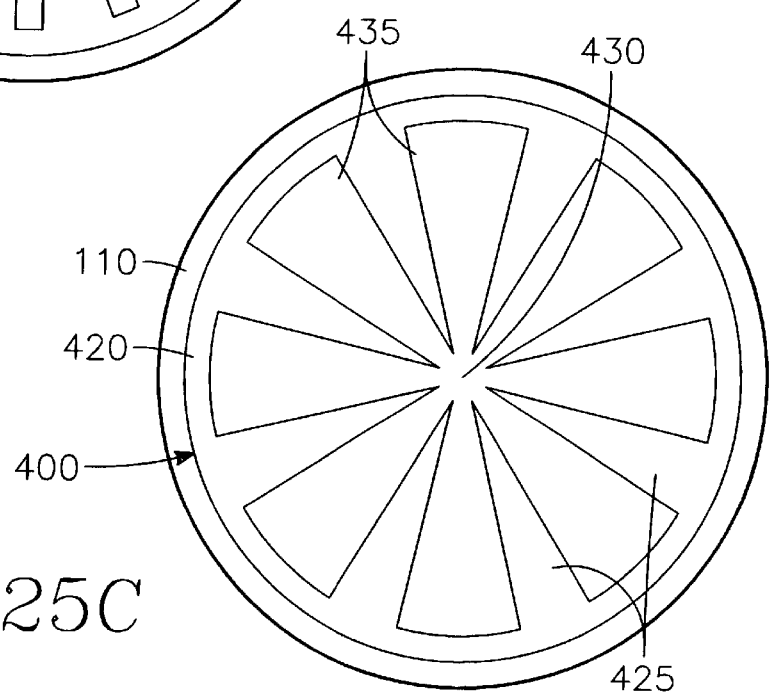
FIG. 25C is a top view of another embodiment of the conductive back plane.

FIG. 25A illustrates the use of a conductive backplane 400 on the upper side or back surface of the silicon ceiling 110. The electrical potential (e.g., ground or, alternatively, the output of an RF generator) to be applied to the silicon ceiling 110 is applied directly to the conductive backplane 400 for uniform distribution across the back surface of the ceiling 110. The backplane 400 may be of any highly conductive material such as aluminum or copper, for example. Moreover, the backplane 400 must have sufficient openings or apertures to prevent the formation of eddy currents by the inductive RF field of the overhead coil antenna 145 which would block transmission of the RF inductive field through the backplane 400. For example, the top view of FIG. 25B illustrates that the conductive backplane 400 may be in the shape of a star, with plural conductive arms 405 extending radially from a conductive center 410. Preferably, the spaces or apertures 415 between the conductive arms 405 are of a characteristic width on the order of the thickness of the silicon ceiling 110. This feature provides uniform current distribution and vertical current flow through the silicon ceiling 110. The center connected arms of the embodiment of FIG. 25B may be referable in the case of silicon laminated on ceramic for ease of fabrication. FIG. 25C illustrates an alternative embodiment of the conductive backplane 400 which consists of an outer conductive annulus 420 with plural conductive arms 425 extending from the conductive annulus 420 radially inwardly toward an imaginary center point 430. The apertures 435 between the conductive arms 425 are of a characteristic width on the order of the thickness of the silicon ceiling 110, as shown in FIG. 25C. Preferably, electrical contact is made along the entire annulus 420. Preferably, the outer conductive annulus 420 is beyond the effective radial range of the RF inductive field.

Figure 26:
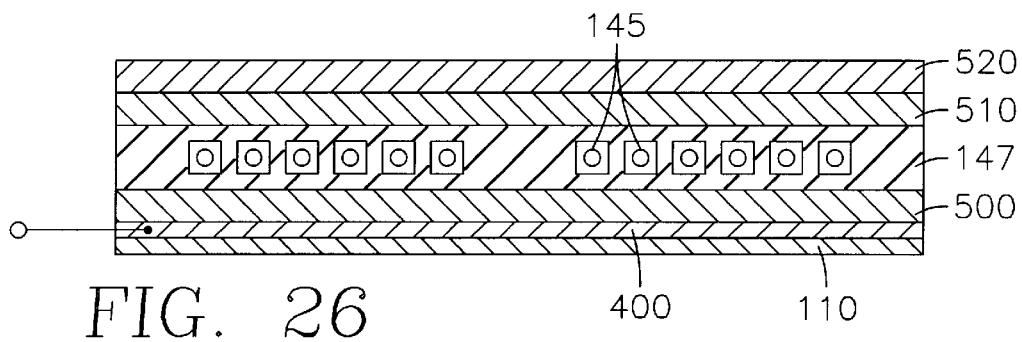
FIG. 26 is a side view of an embodiment of the silicon ceiling which is bonded to a supportive substrate.
Figure 27:
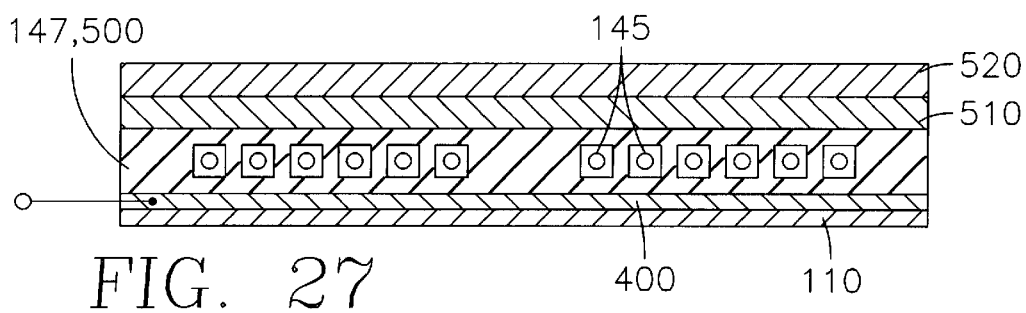
FIG. 27 is a side view of an embodiment corresponding to that of FIG. 26 in which the supportive substrate is an insulative holder of the overhead inductive antenna.

Preferably, the silicon ceiling is about 1 inch (2.54 cm) thick for a 13 inch (32 cm) diameter wafer to provide structural integrity and an anti-implosion safety factor in excess of 10. However, to significantly reduce the thickness of the silicon ceiling (e.g., to a fraction of an inch), FIG. 26 illustrates how the silicon ceiling 110 and its backplane 400 may be bonded to a strong support substrate 500 such as a ceramic disk. The overhead inductive coil antenna holder 147 is placed over the substrate 500. In order to control the temperature of the silicon ceiling 110, a heater layer 510 is placed on top of the antenna holder 147 and a cooling plate 520 is placed on top of the heater layer 510. FIG. 27 illustrates how the role of the substrate 500 and the role of the antenna holder 147 may be merged into a single member by employing a strong material such as a ceramic in the antenna holder 147 and bonding the silicon ceiling 110 with its conductive backplane 400 directly to the antenna holder 147.

Figure 28:
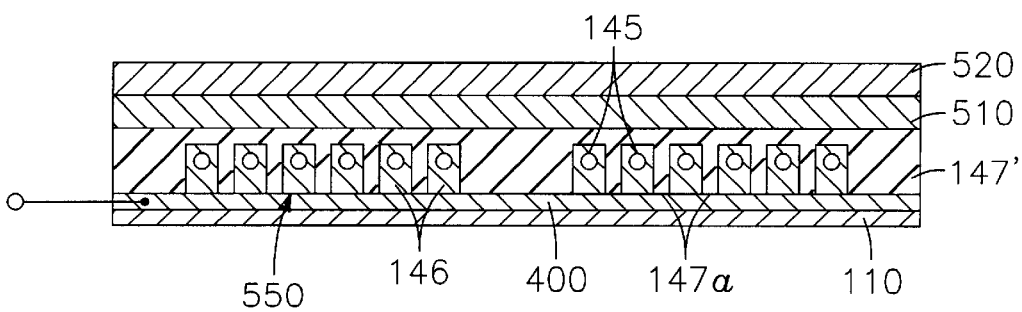
FIG. 28 is a side view of an embodiment of the invention in which the antenna holder is conductive.
Figure 29:
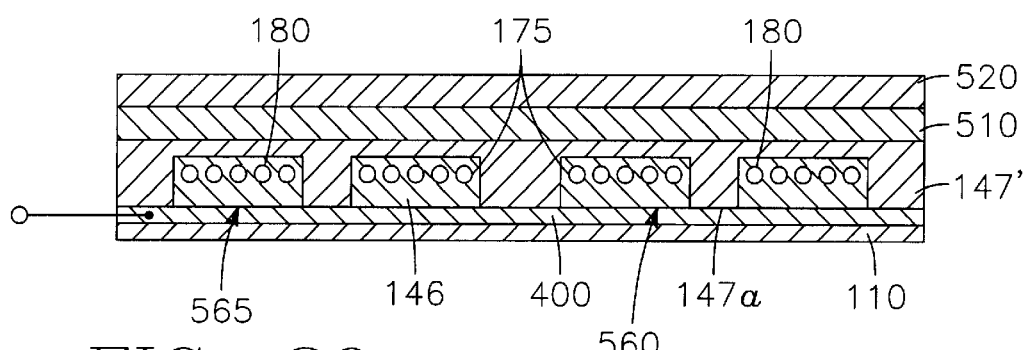
FIG. 29 is a side view of an embodiment corresponding to that of FIG. 28 in which the conductive antenna holder has a pair of annular apertures containing the inner and outer overhead inductive antennas.

FIG. 28 illustrates an embodiment of the invention employing an alternative antenna holder 147' consisting of a conductor such as aluminum or copper, for example. In this embodiment, an insulating material 146 is provided between the windings of the inductive coil antenna 145 and the conductive antenna holder 147'. In order to prevent the conductive antenna holder 147' from blocking the RF inductive field of the coil antenna 145, each turn of the antenna 145 nests within a groove-shaped aperture 550 in the antenna holder 147', each aperture 550 opening to the bottom surface 147a of the conductive antenna holder 147'. The conductive antenna holder 147' of FIG. 28 may also serve as the conductive backplane for the silicon ceiling 110 as well as the strong supportive substrate for the ceiling 110, in which case the silicon ceiling 110 is bonded directly to the conductive antenna holder 147' of FIG. 28. However, a preferable option is to interpose the star-shaped conductive backplane 400 between the silicon ceiling 110 and the conductive backplane 147' of FIG. 28. FIG. 29 illustrates another embodiment of the conductive antenna holder 147' having a pair of wide concentric annular apertures 560, 565 in which respective ones of the inner and outer coil antennas 175, 180 of FIGS. 6 or 16 nest. The annular apertures 560, 565 open at the bottom surface 147a of the antenna holder so that there is no blockage of the RF induction field. In this embodiment, as FIG. 28, the conductive antenna holder can also serve as the conductive backplane for the silicon antenna (in lieu of the star-shaped conductive backplane 400) and as the strong supportive substrate for the silicon ceiling 110 (in lieu of the supportive substrate 500) and therefore may bonded directly to the silicon ceiling 110. Preferably, however, the star-shaped conductive backplane is interposed between the conductive antenna holder 147' and the silicon ceiling 110 and is bonded with the silicon ceiling 110 to the antenna holder 147'.

Figure 30A:
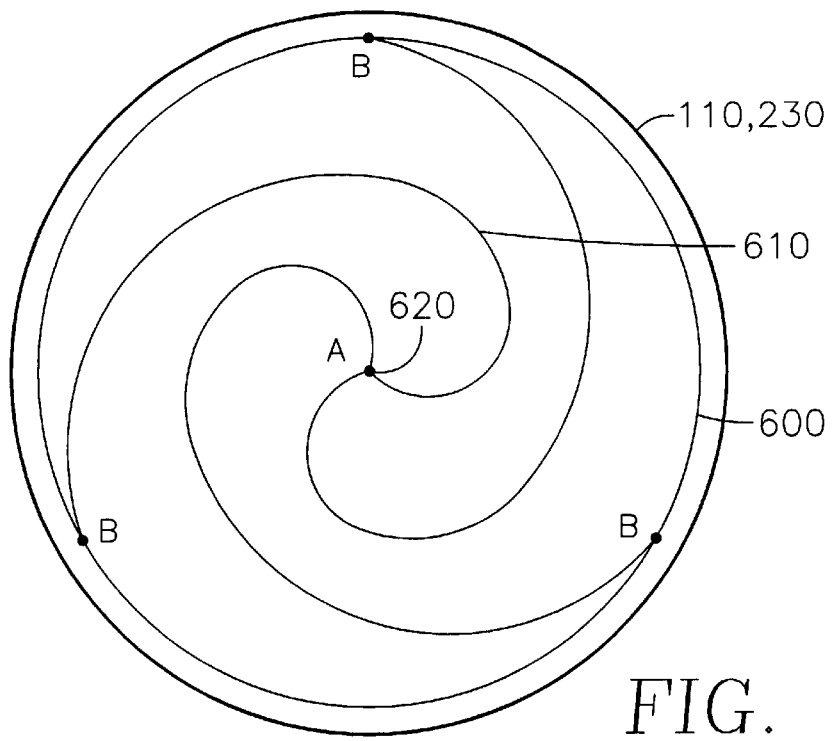
FIG. 30A is a top view of a non-concentric embodiment of the overhead inductive antenna.
Figure 30B:
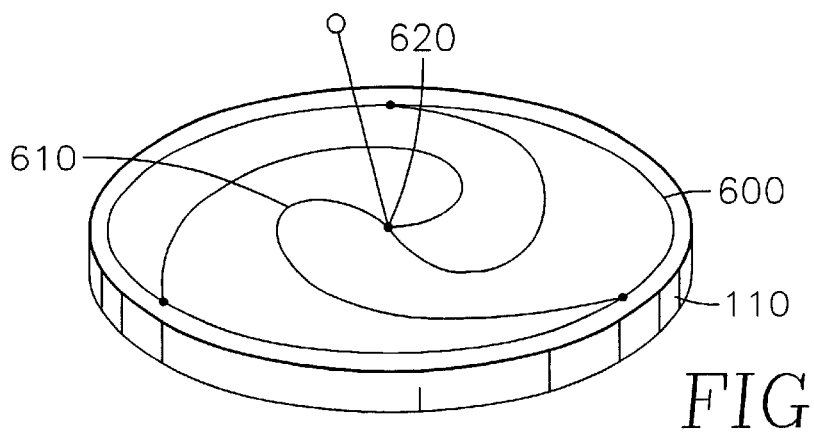
FIGS. 30B and 30C are side views of alternative implementations of the inductive antenna of FIG. 30A having planar and dome-shaped shapes, respectively.
Figure 30C:
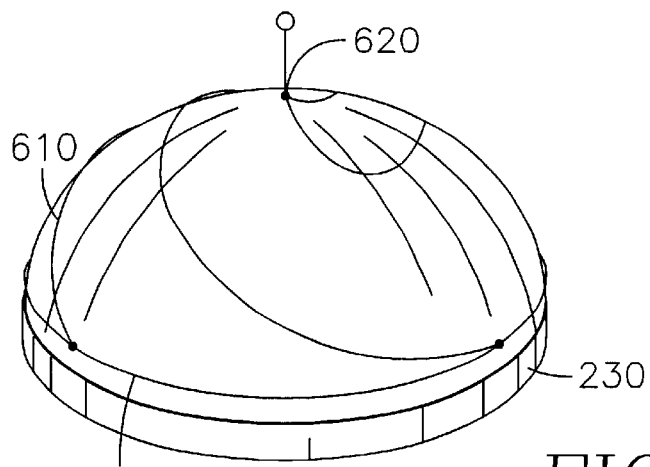

The overhead coil antenna 145 has been described above as consisting of a single concentric spiral winding or of inner and outer concentric spiral windings 175, 180. FIGS. 30A, 30B and 30C illustrate an alternative design of the overhead coil antenna 145 having non-concentric windings. Specifically, in FIG. 30A there is an outer circular conductor 600 which is of very low inductance and low resistance so as to be at least nearly equipotential along its entire circumference. Plural spiral conductors 610 radiate inwardly in involute paths from the outer conductor 600 to a center point 620 joining all of the spiral conductors 610. Plasma source RF power (from the RF generator 150) is applied between the outer conductor 600 and the center point 620. As illustrated in FIG. 30B, the involute spiral conductors 610 lie in a plane, while FIG. 30C illustrates an alternative embodiment for use with the dome-shaped ceiling 230 in which the involute spiral conductors 610 form a dome. A dome shape, such as the dome shapes employed in the various embodiments disclosed in this specification may be non-linear or hemispherical or conical or a rotation of some arcuate curve such as a conical section or the combination of two different radii (as disclosed earlier in this specification).

Figure 31A:
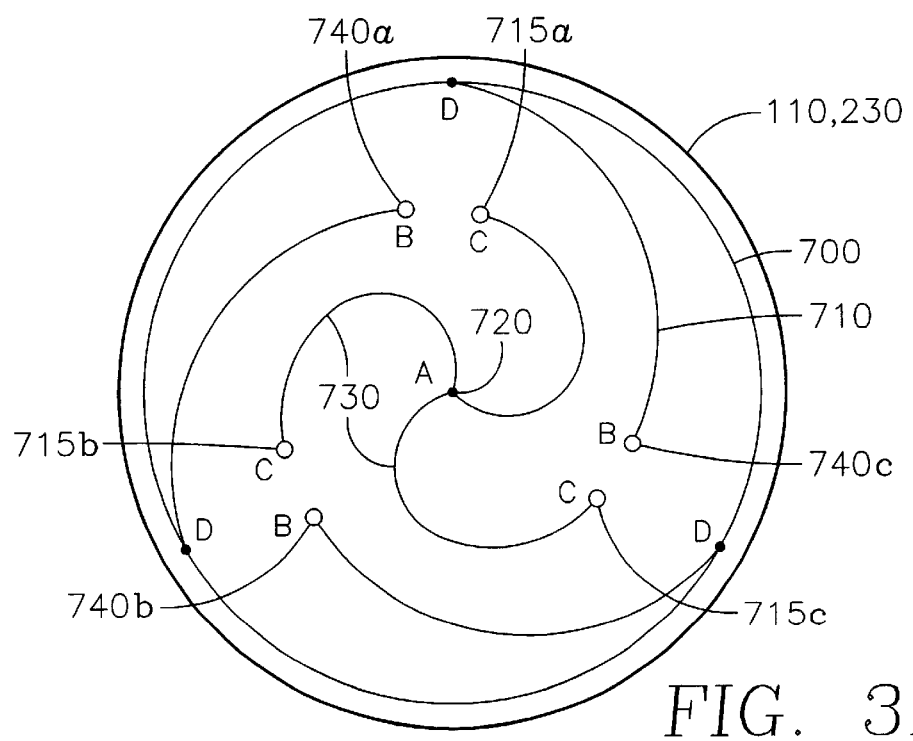
FIG. 31A is a top view of another non-concentric embodiment of the overhead inductive antenna.
Figure 31B:
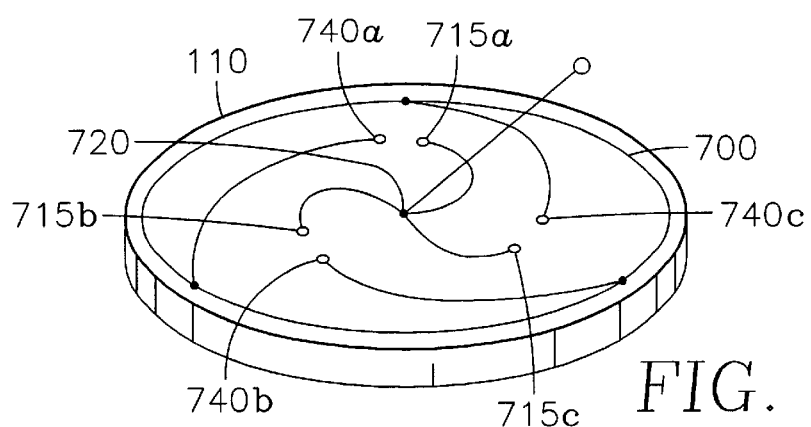
FIGS. 31B and 31C are side views of alternative implementations of the inductive antenna of FIG. 31A having planar and dome shapes, respectively.
Figure 31C:
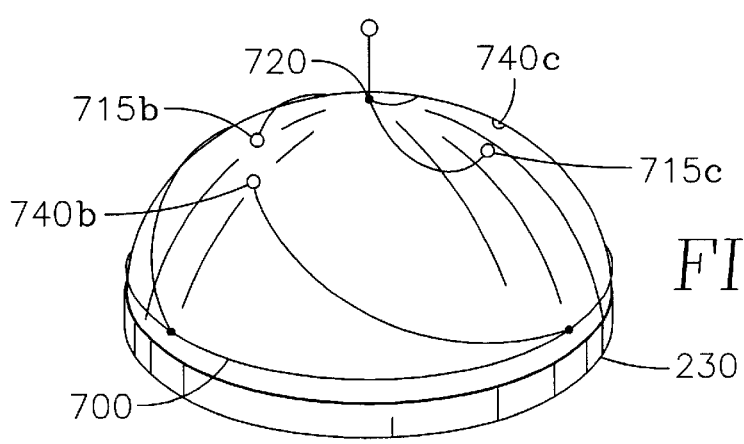

FIGS. 31A, 31B and 31C illustrate another non-concentric embodiment of the overhead coil antenna. FIG. 31B corresponds to the planar case while FIG. 31C corresponds to the dome-shaped case. An outer circular conductor 700 has plural arcuate conductive arms 710 radiating inwardly therefrom terminating at ends 715A, 715B, 715C. A center point 720 has plural arcuate conductive arms 730 radiating outwardly therefrom and terminating at ends 740A, 740B, 740C. As employed in the embodiment of FIG. 16, RF power from one output of the power splitter 250 of FIG. 16 is applied between the outer circular conductor 700 and the ends 715, while RF power from the other output of the power splitter 250 is applied between the center point 720 and the ends 740.

Figure 32:
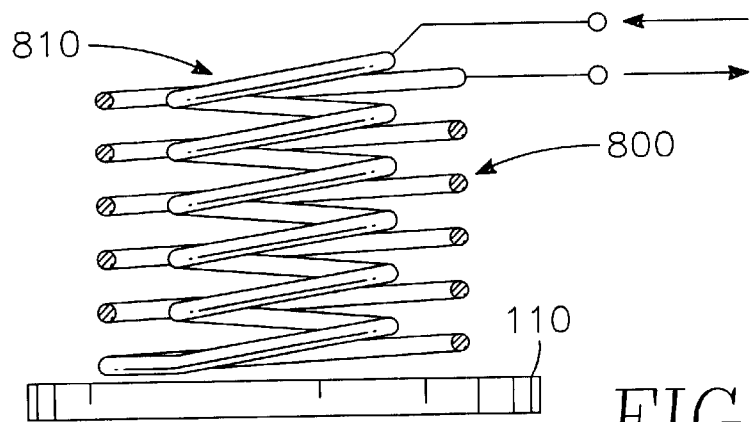
FIG. 32 is a cross-sectional side view of a dual cylindrical helix embodiment of the overhead inductive antenna.
Figure 33:
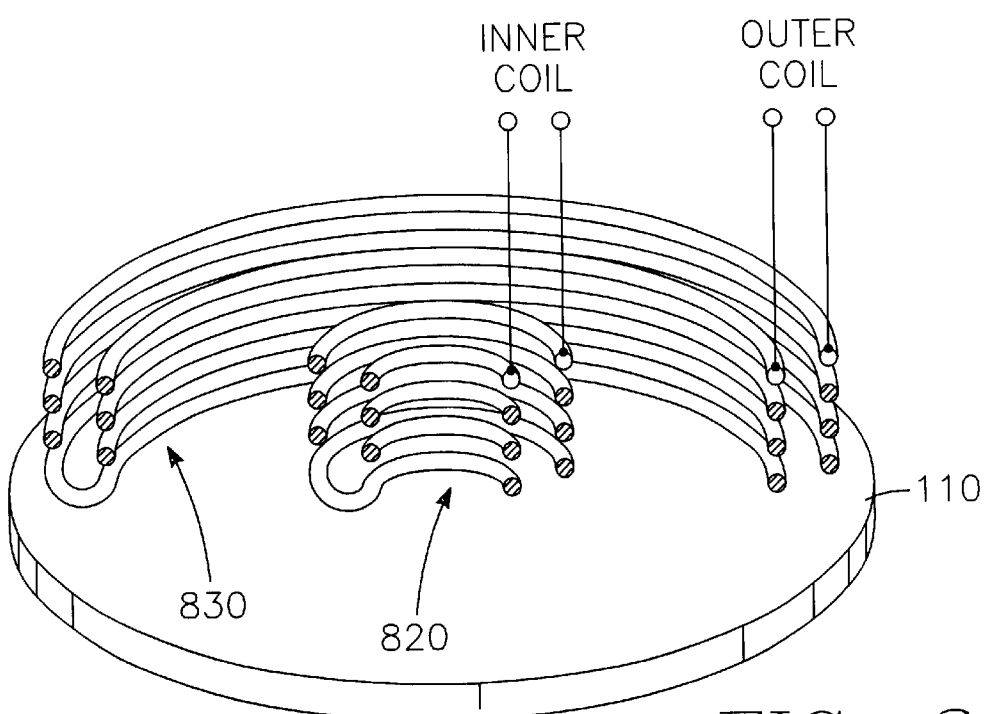
FIG. 33 is a cross-sectional side view of a pair of concentric cylindrical helix inductive antennas of the type illustrated in FIG. 32 for the inner and outer antennas of FIG. 16.

The conductor of the inductive antenna may follow any suitable three-dimensional path. For example, FIG. 32 illustrates a non-planar or 3-dimensional embodiment of the coil antenna 145 consisting of dual concentric cylindrical helical windings, namely an outer cylindrical helix 800 and an inner cylindrical helix 810 all formed with the same conductor. FIG. 33 illustrates how a pair of dual concentric cylindrical helical windings of the type illustrated in FIG. 32, namely an inner dual concentric cylindrical helical winding 820 and an outer dual concentric cylindrical helical winding 830 can be employed as the inner and outer windings of the overhead inductive antenna in the embodiment of FIG. 16, in lieu of the inner and outer planar windings 175, 180 of FIG. 16.

Figure 34:
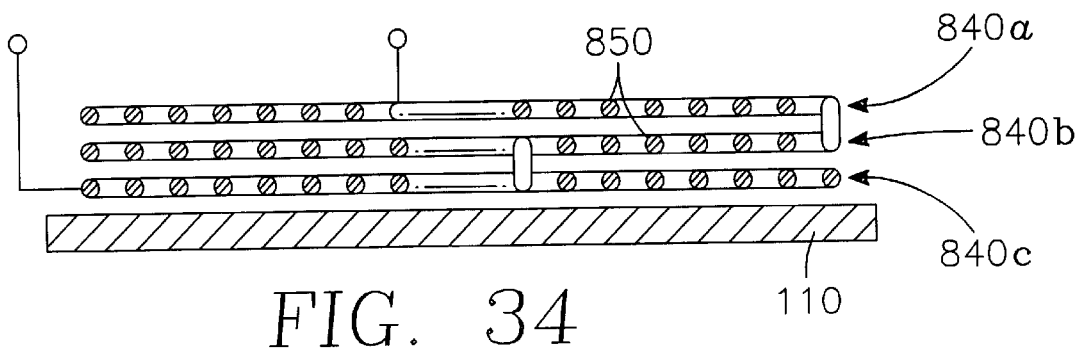
FIG. 34 is a cross-sectional side view of an embodiment of the overhead inductive antenna consisting a layers of inductive antennas.

FIG. 34 illustrates another non-planar embodiment of the inductive antenna 145 of FIG. 1 consisting of stacked layers 840a, 840b, 840c of spiral windings 850.

As mentioned previously herein, one factor that can give rise to plasma etch processing differences between the wafer center and the wafer periphery non-uniform etch precursor gas distribution. Such non-uniformity in gas distribution arises from the introduction of the gas from the side of wafer pedestal through the gas inlets 137, so that there is relatively more etchant precursor gas near the wafer periphery and relatively less etchant precursor gas near the wafer center. This problem is addressed in the embodiment of the silicon ceiling 110 of FIGS. 35A, 35B, 35C, 35D and 35E, which includes a center gas feed system built into the silicon ceiling 110 for introducing the etch precursor gas directly over the wafer in a symmetrical manner relative to the wafer center.

Figure 35A:
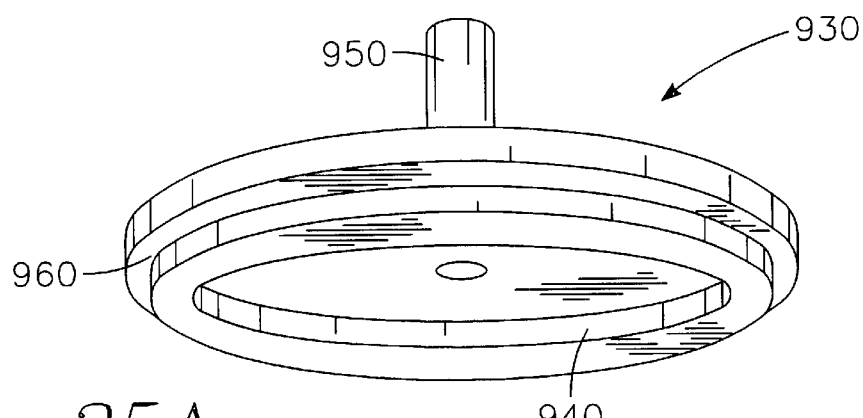
Figure 35B:
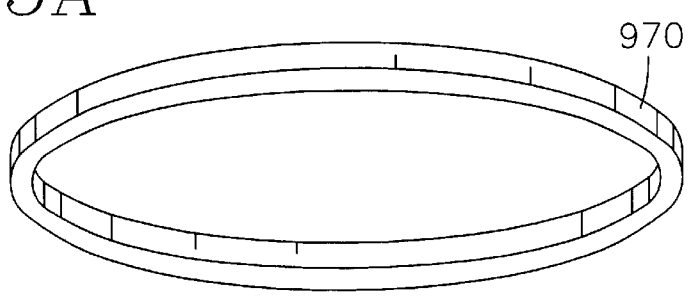
Figure 35D:
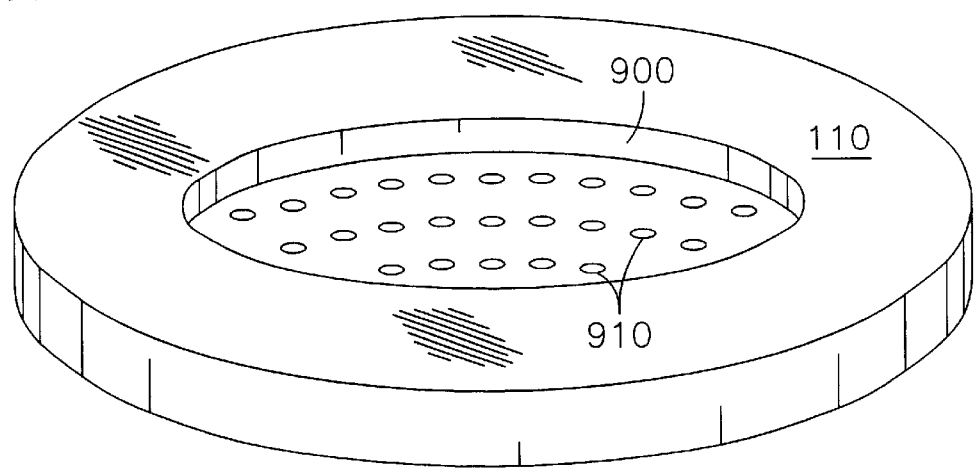
Figure 35C:
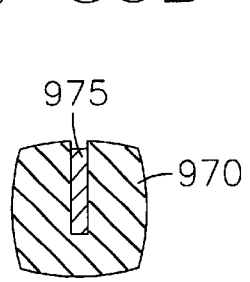
Figure 35E:
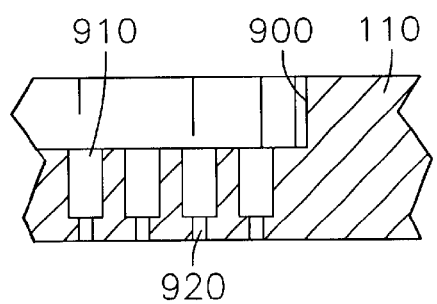

Referring to FIG. 35D, the 1-inch thick silicon ceiling 110 has an approximately 0.33-inch deep 3.5-inch diameter counterbored opening 900 in its top surface. Preferably, as shown in FIG. 35E, about twenty-two symmetrically placed 0.20-inch diameter holes 910 are drilled down from the top surface of the counterbore opening 900 through about 80% of the thickness of the ceiling 110. Small 0.030-inch diameter holes 920 concentric with the larger holes 910 are laser-drilled from the bottom surface of the silicon ceiling 110. As shown in FIGS. 35A and 35B, a disk-shaped gas feed top 930 fits snugly within the counterbore opening 900 in the top surface of the silicon ceiling 110. The bottom surface of the gas feed top 930 has an approximately 0.01-inch deep 3.3-inch diameter counterbore opening 940 therein which forms a gas distribution manifold. A center gas feed pipe 950 passes through the center of the gas feed top 930 and opens into the counterbore opening 940. The bottom peripheral corner of the gas feed top has a step 960 cut out therein, the step 960 being 0.143-inch deep and extending 0.075-inch radially inwardly. The step 960 creates a circumferential pocket into which an annular teflon seal 970 having dimensions matching those of the step 960 snugly fits. Preferably, the teflon seal 970 has a U-shaped cross-section, as illustrated in FIG. 35C. An annular steel wire stiffener 975 within the teflon seal 970 provides stiffness for the seal 970.

The center gas feed silicon ceiling of FIGS. 35A–E can be employed as the silicon ceiling 110 in the embodiment of FIG. 16 in combination with the independently adjustable inner and outer inductive coil antennas 175, 180 controlled through the power splitter 250 by the electrical controller 260. The advantage is that the reactor's center-to-edge etch uniformity is enhanced by the uniform etchant precursor gas distribution across the wafer surface achieved with the center gas feed silicon ceiling 110 of FIGS. 35A–E, and any residual center-to-edge etch non-uniformity can be precisely compensated by judiciously adjusting, using the controller 260, the relative proportion of power levels applied to the inner and outer coil antennas 175, 180 in the manner disclosed in the co-pending application of Collins et al. referred to above. As a result, the wafer center-to-edge etch uniformity is optimized to a degree not attainable in the prior art without sacrificing etch profile, etch selectivity and etch rate at very small feature sizes.

Figure 36A:
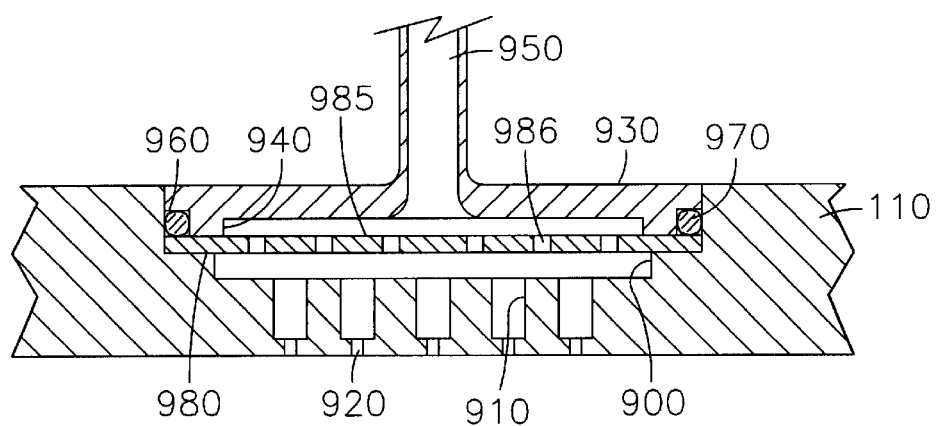
FIG. 36A is a cross-sectional view of another embodiment of the center gas feed silicon ceiling having a pair of gas plenums separated by a silicon wafer baffle.

FIG. 36A illustrates another preferred embodiment of the center gas feed silicon ceiling which better protects the gas feed top from the plasma. In this embodiment, a shoulder 980 is provided along the circumferential edge of the counterbore opening 900 in the silicon ceiling 110. A silicon wafer 985 rests on the shoulder 980 and separates into two separate chambers the counterbore opening 900 in the top of the silicon ceiling 110 and the counterbore opening 940 in the bottom of the gas feed top 930. The silicon wafer 985 has plural gas feed holes 986 drilled therethrough which are all laterally displaced from the gas feed holes 910 in the silicon ceiling 110. The interposition of the silicon wafer 985 in this manner eliminates any direct-line path to the gas feed top 930 for plasma ions diffusing upwardly from the chamber through the holes 920. This feature better protects the top 930 from attack by the plasma. The top 930 is either a material such as a semiconductor or a dielectric which does not appreciably attenuate the RF inductive field, or, if its diameter is less than the diameter of the center null of the inductive antenna, may be a conductor such as stainless steel.

Figure 36B:
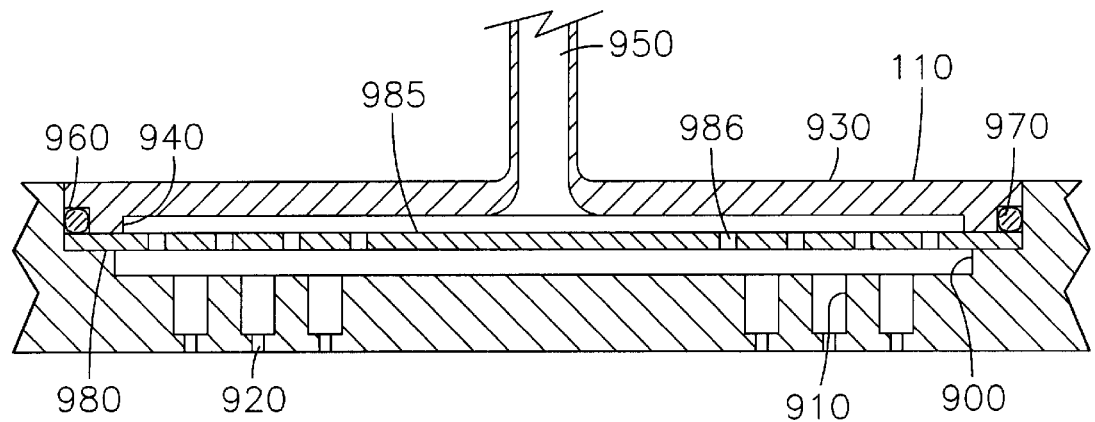
FIG. 36B illustrates an alternative embodiment corresponding to FIG. 36A.

In the embodiments of FIGS. 35A–E and 36A, the gas feed holes 910, 920 are grouped about the center of the ceiling 110. However, in either embodiment the holes 910, 920 may be distributed from the center out to the periphery, if desired, or may be grouped about the periphery instead of the center. This is illustrated in FIG. 36B, in which the gas feed holes 910, 920 are distributed about the periphery of the ceiling 110.

Figure 37A:
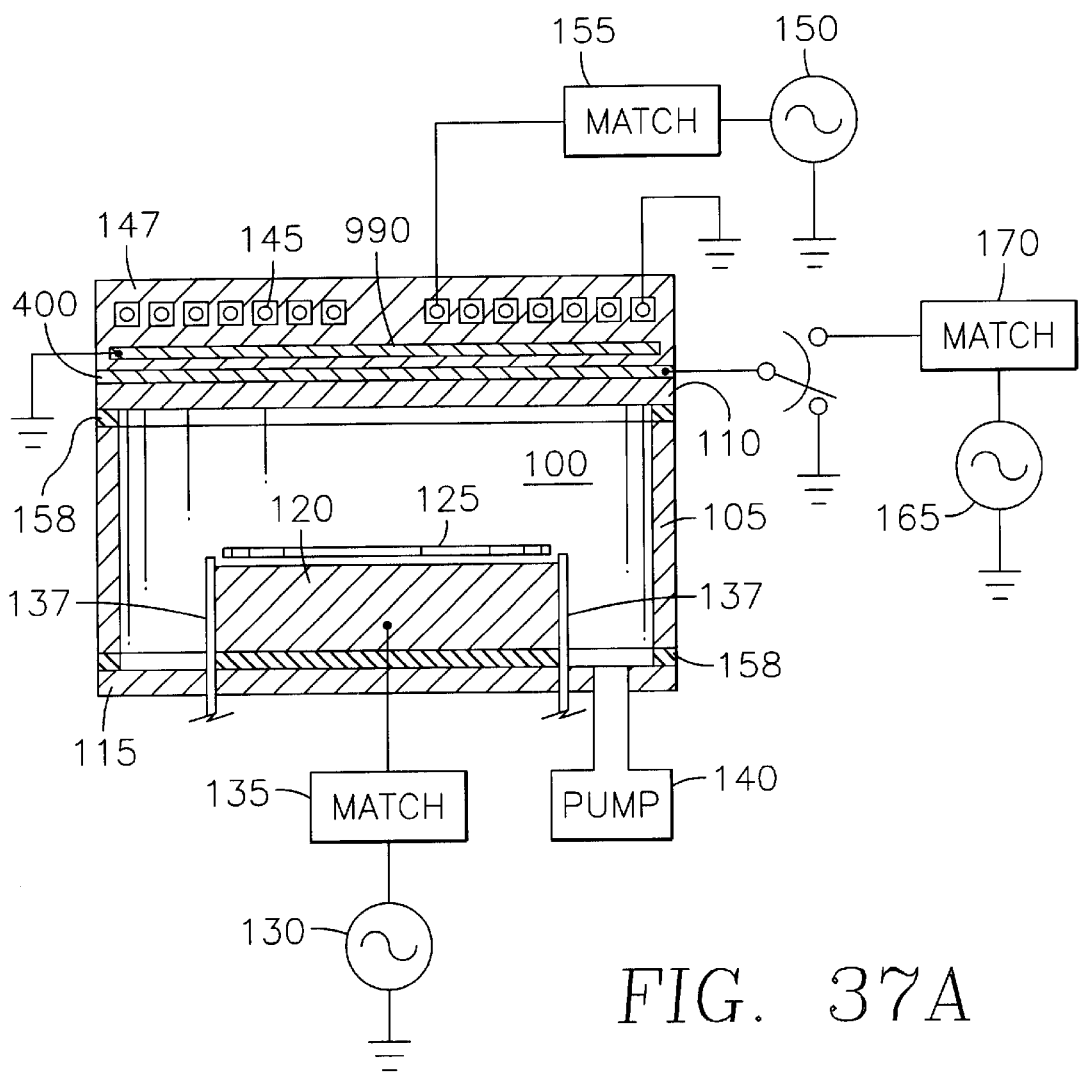
FIG. 37A illustrates how a Faraday shield may be included in the embodiment of FIG. 1.
Figure 37B:
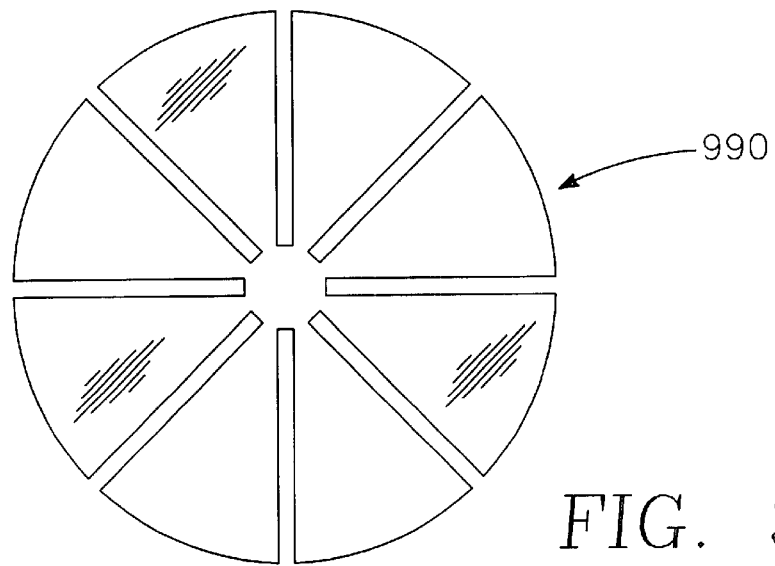
FIG. 37B is a top view of the Faraday shield of FIG. 37A.
Figure 38A:
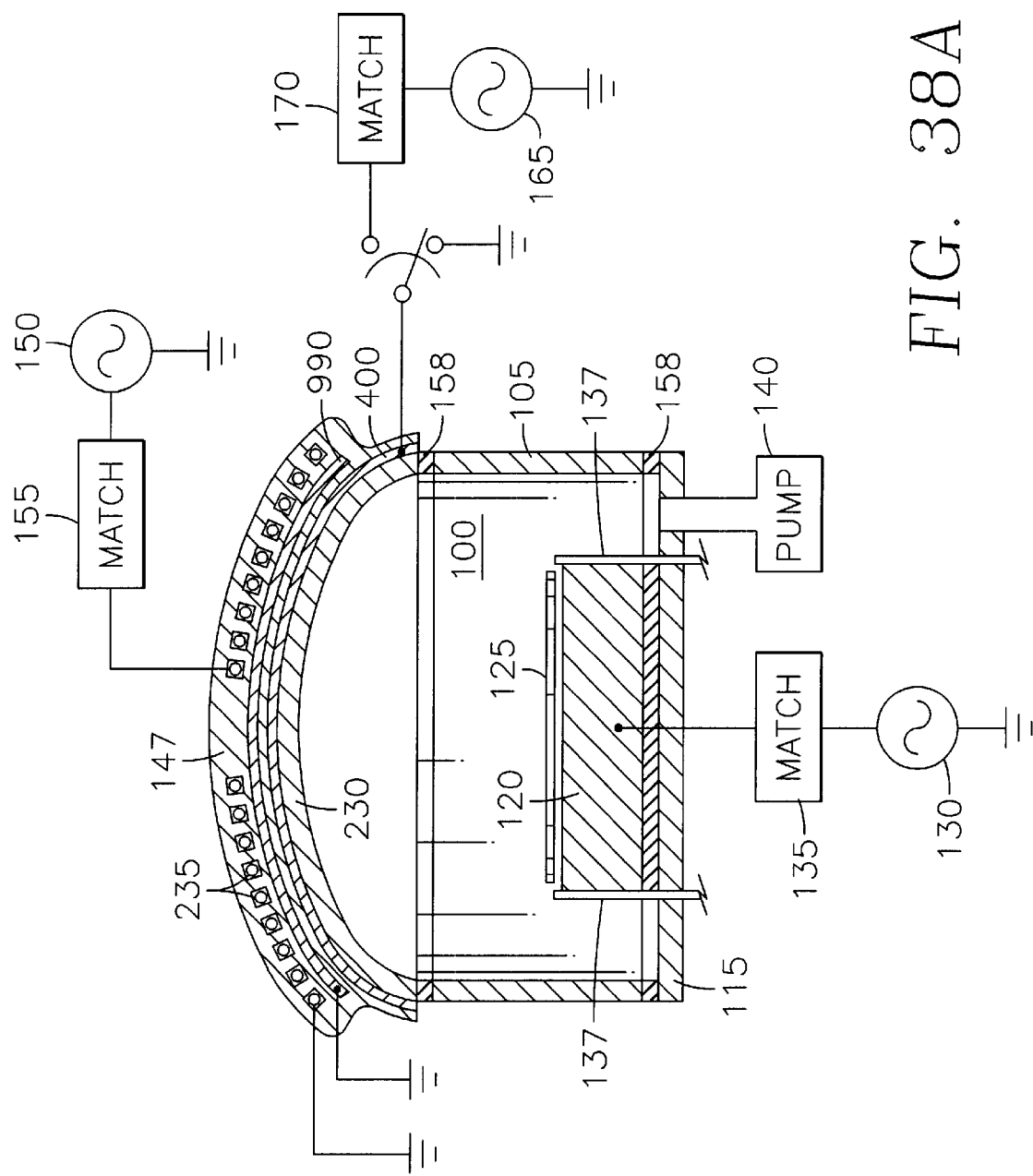
FIG. 38A illustrates how a Faraday shield may be included in the embodiment of FIG. 10 having a dome-shaped ceiling.
Figure 38B:
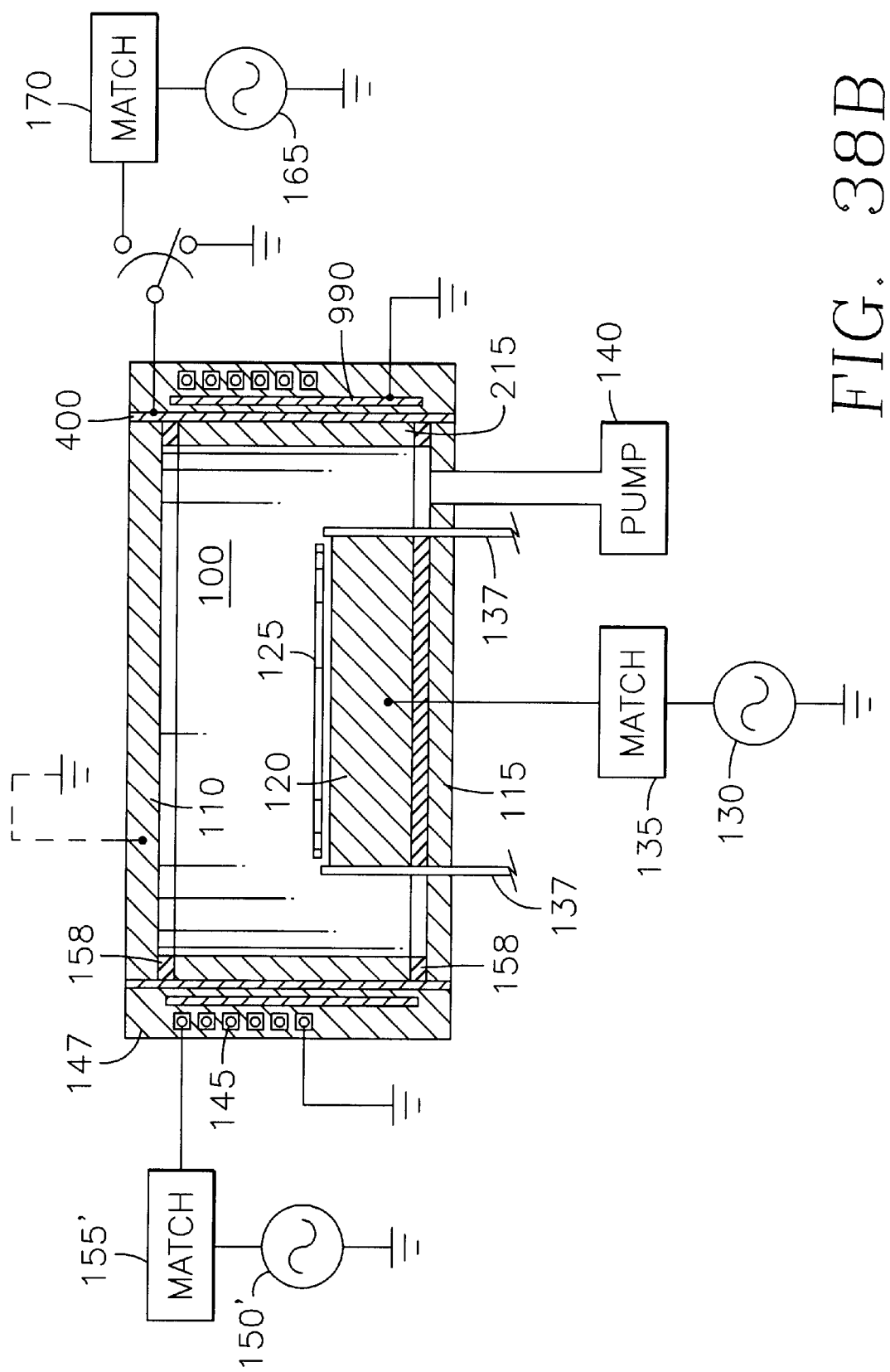
FIG. 38B illustrates how a Faraday shield may be included in the embodiments of FIGS. 7–9 having a cylindrical semiconductor window electrode and inductive antenna.
Figure 40:
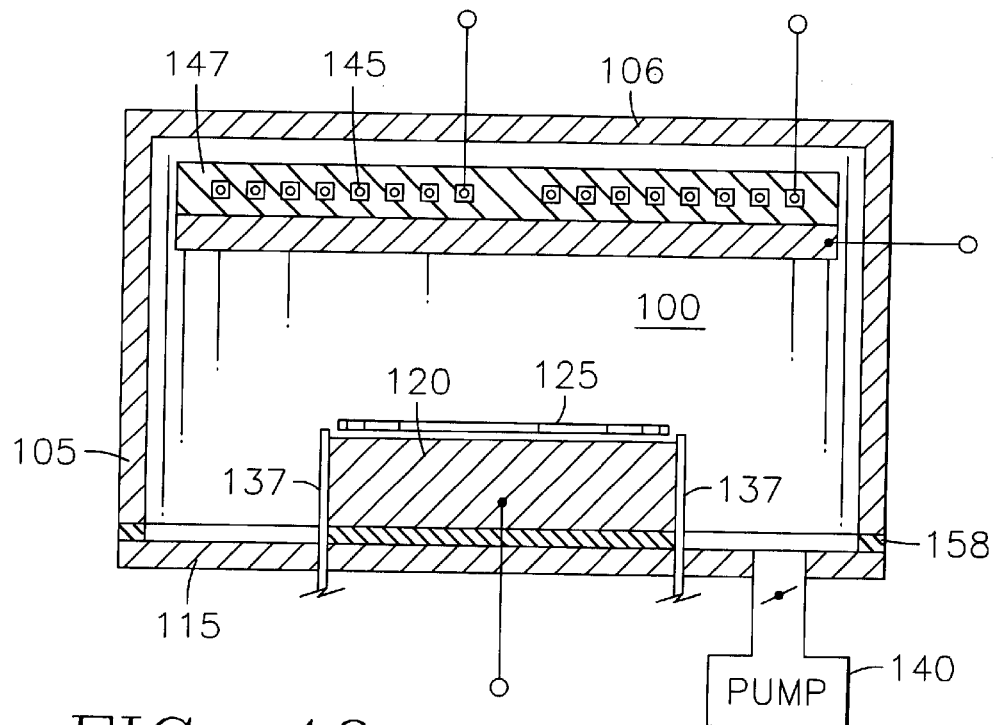
FIG. 40 illustrates an alternative embodiment in which the semiconductor window and inductive antenna are inside the reactor chamber.
Figure 41A:
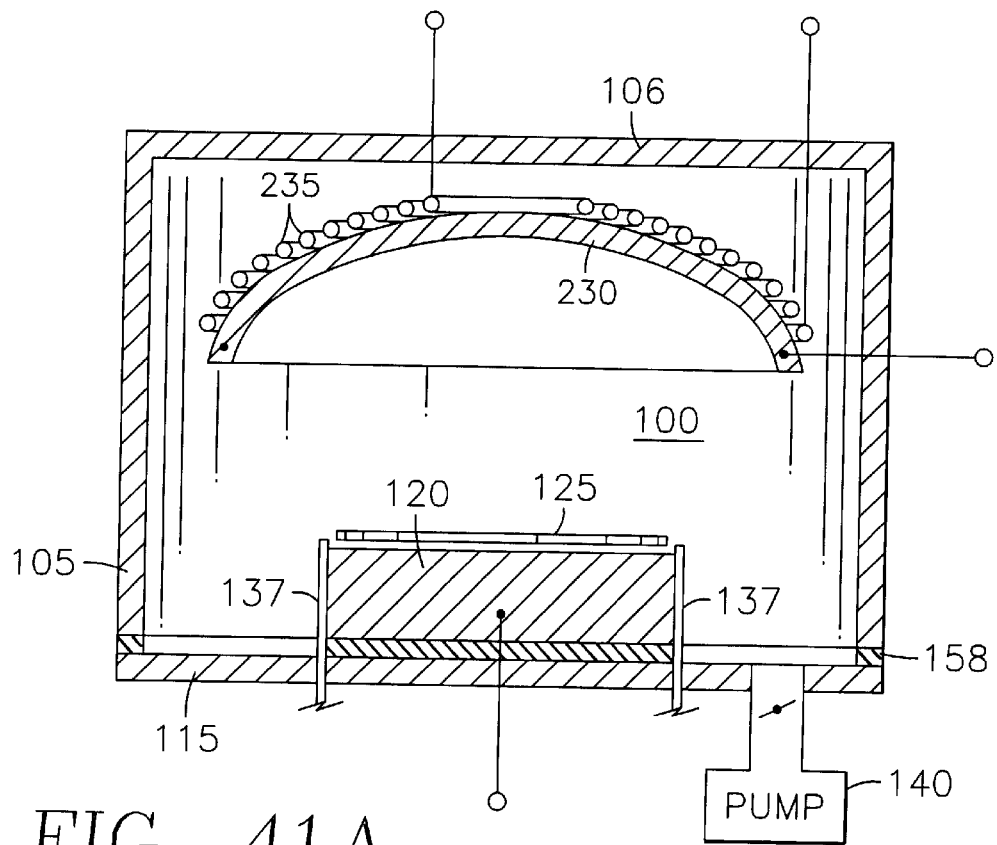
FIG. 41A illustrates an embodiment corresponding to FIG. 40 in which the semiconductor window is dome-shaped.
Figure 41B:
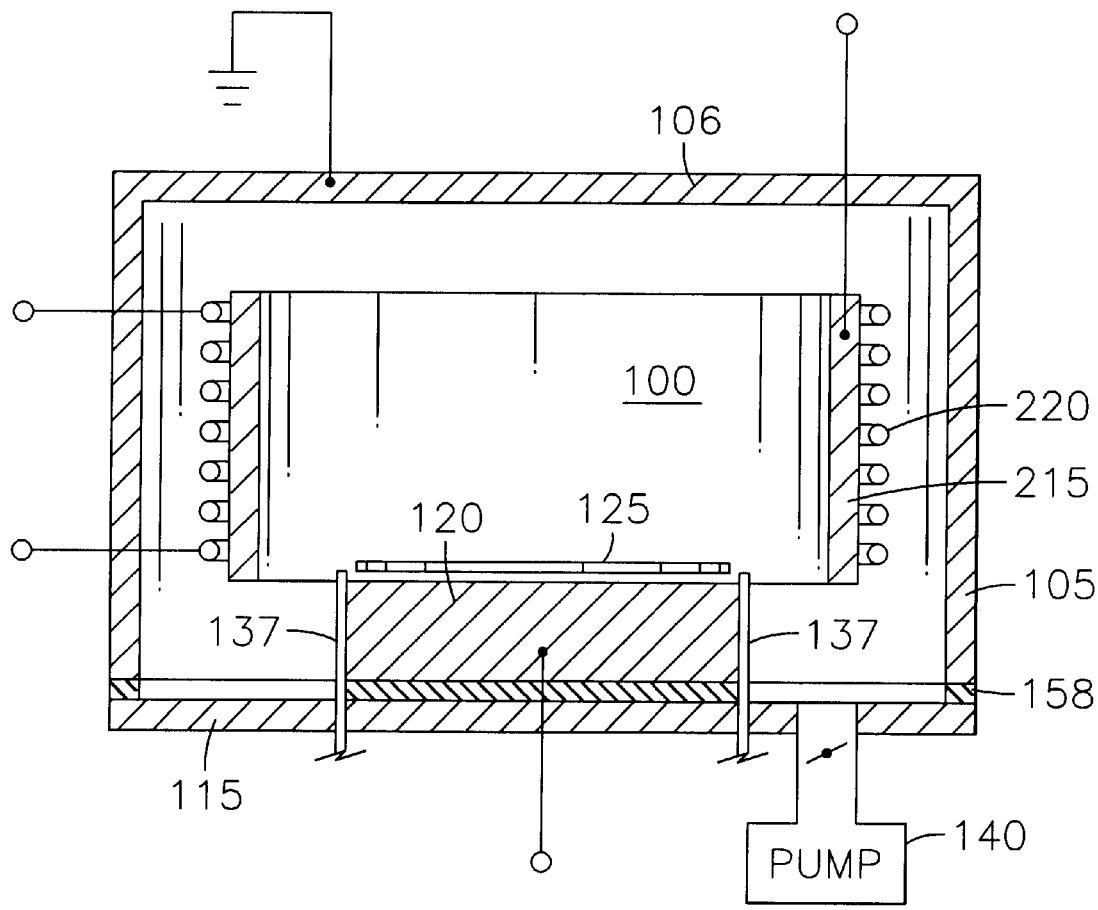
FIG. 41B illustrates an embodiments corresponding to FIG. 40 in which the semiconductor window is cylindrical and the inductive coil is cylindrical.

FIG. 37A illustrates a modification applicable to any of the embodiments employing a flat silicon ceiling 110, such as, for example, the embodiment of FIG. 1, in which an insulated grounded Faraday shield 990 is interposed between the overhead inductive antenna 145 and the silicon ceiling 110. The Faraday shield is of the conventional type whose shape is best shown in the top view of FIG. 37B and is used to reduce capacitive coupling from the inductive antenna 145 to the plasma. FIG. 38A illustrates a modification applicable to any of the embodiments employing a dome-shaped silicon ceiling 230, such as, for example, the embodiment of FIG. 13A, in which an insulated grounded Faraday shield 990 is interposed between the overhead inductive antenna 145 and the silicon ceiling 230. FIG. 38B illustrates an embodiment corresponding to the embodiments of FIGS. 7–9 having a cylindrical side semiconductor window electrode 215 and a cylindrical side inductive antenna 220, with the additional feature of a cylindrical Faraday shield 990' interposed between the inductive antenna 220 and the cylindrical semiconductor window electrode 215.

FIG. 39A is a proportional drawing illustrating a preferred arrangement of the elements described previously herein in a plasma etch reactor. FIG. 39B is a cross-section of a tube-shaped conductor employed in implementing the overhead inductive antenna, the interior volume of the tube being used to pump a coolant such as water.

Each of the foregoing embodiments has been described as employing an electrical connection of the semiconductor window to an electrical potential such as an RF power source or ground, thereby employing the semiconductor window as an electrode. However, such an electrical connection and the use of the semiconductor window as an electrode is not necessary. In fact, the semiconductor window may be allowed to float electrically and left unconnected, rather than being employed as an electrode. It would nevertheless provide certain advantages even though not necessarily functioning as an electrode. One advantage is that the semiconductor material (e.g., silicon) of the semiconductor window is less liable to be a source of contamination, in comparison with other materials (e.g., quartz or aluminum) typically employed in or near the ceiling of a typical plasma reactor. Another advantage is that the semiconductor window is a scavenger for fluorine. Thus, the semiconductor window can function simultaneously both as a shield for the inductive antenna and as a scavenger for fluorine.

Any of the embodiments described above may be modified by placing both the semiconductor window electrode and its overlying coil inductor inside the chamber. In this modification, the semiconductor window electrode is not part of the chamber enclosure but rather rests under the ceiling of the enclosure. For a planar semiconductor window electrode of the type employed in the embodiments of FIGS. 1, 4–12, 16, 18–20, 23 and 37A, FIG. 40 illustrates the planar semiconductor window electrode 110 and the planar inductive antenna 145 inside the chamber 100 under and separate from a chamber ceiling 106. For a curved or dome-shaped semiconductor window electrode of the type employed in the embodiments of FIGS. 13A–15, 17A, 17B, 21, 22, 24 and 38, FIG. 41 illustrates the dome-shaped semiconductor window electrode 230 and the conformal inductive antenna 235 inside the chamber 100 under the chamber ceiling 106. For a cylindrical semiconductor window as employed in the embodiments of FIGS. 7–9, FIG. 41B illustrates a cylindrical semiconductor window 230' and cylindrical inductive antenna 235' inside the chamber 100.

Figure 42:
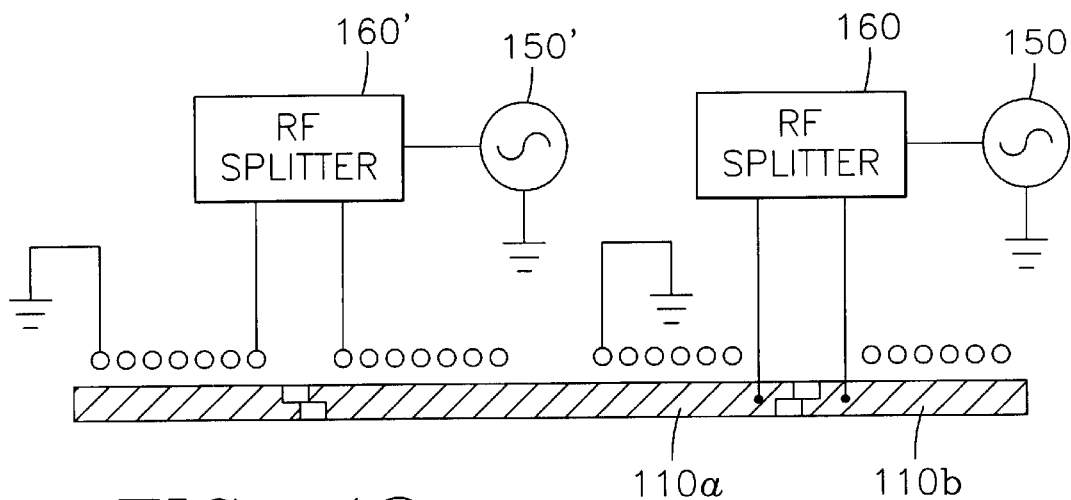
FIGS. 42 and 43 illustrate, respectively, side and top views of a segmented version of the semiconductor window electrode.
Figure 43:
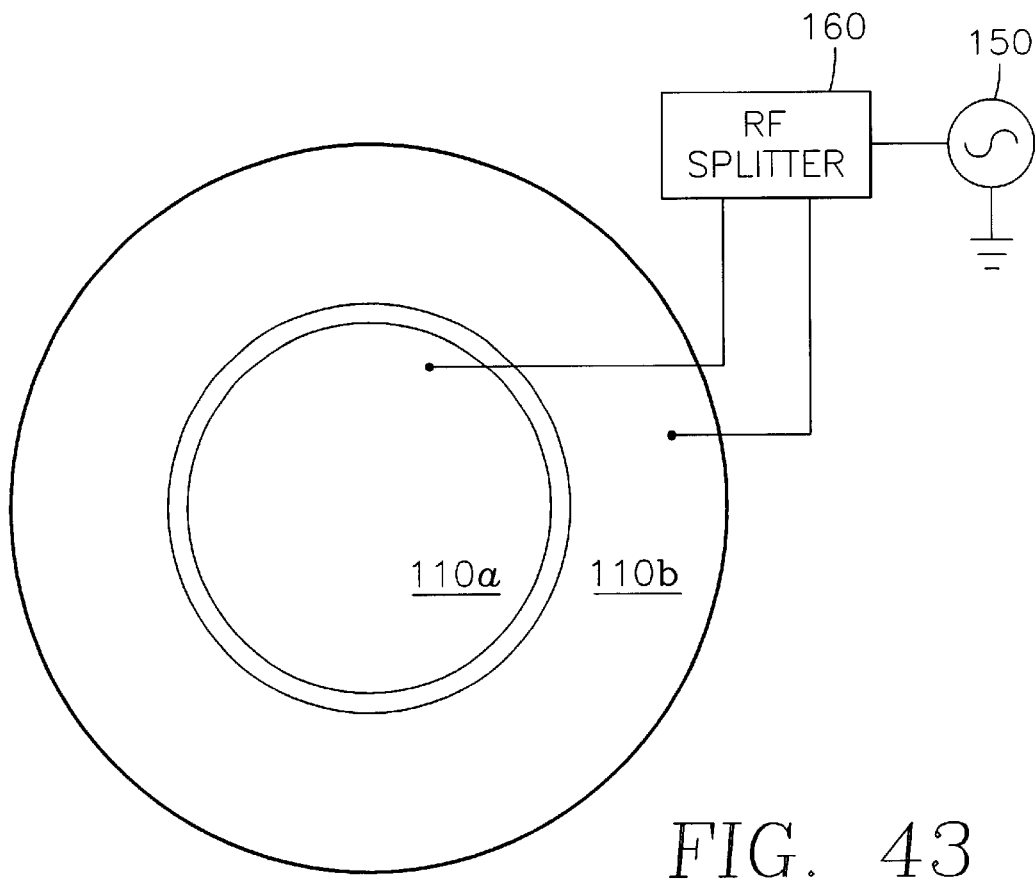

While the semiconductor window of each of the foregoing embodiments has been illustrated as a monolithic structure, in accordance with one modification the semiconductor window may be segmented into plural members. Specifically, in FIGS. 42 and 43 the planar semiconductor window 110' (corresponding to the planar semiconductor window electrode 110 of FIG. 1 or 40, for example) is comprised of a center disk 110a and a peripheral annulus 110b surrounding and concentric with the disk 110a. Preferably, the disk 110a and annulus 110b are of the same semiconductor material such as silicon or any one of the other exemplary semiconductor materials suggested above. In one embodiment, the relative center-to-edge etch performance is adjusted by applying different levels of RF power to the annulus 110a and disk 110b as desired. This is best accomplished by employing a single RF source 150 feeding an RF power splitter 160 having respective RF power outputs applied to the disk 110a and annulus 110b. This requires a third terminal (e.g., a grounded electrode) such as conductive side wall connected to RF ground (not shown in FIG. 42). If, for example, the etch rate near the center of the wafer were greater than at that near wafer periphery, the RF power splitter 160 could be adjusted to apply more RF power to the center disk 110a and relatively less to the peripheral annulus 110b of the semiconductor window. Moreover, for even greater control over the center-to-edge etch performance, the split inner and outer inductive antenna sections of FIGS. 6, 13D, 16 or 17B may be combined with the split semiconductor window electrodes 110a, 110b. Specifically, FIG. 42 illustrates the inner and outer inductive antennas 175, 180 of FIG. 16 combined with the inner disk 110a and outer annulus 110b of the semiconductor window electrode. As in FIG. 16, the power splitter 250 has separate RF power outputs connected to respective ones of the inner and outer inductive antennas 175, 180.

Figure 44:
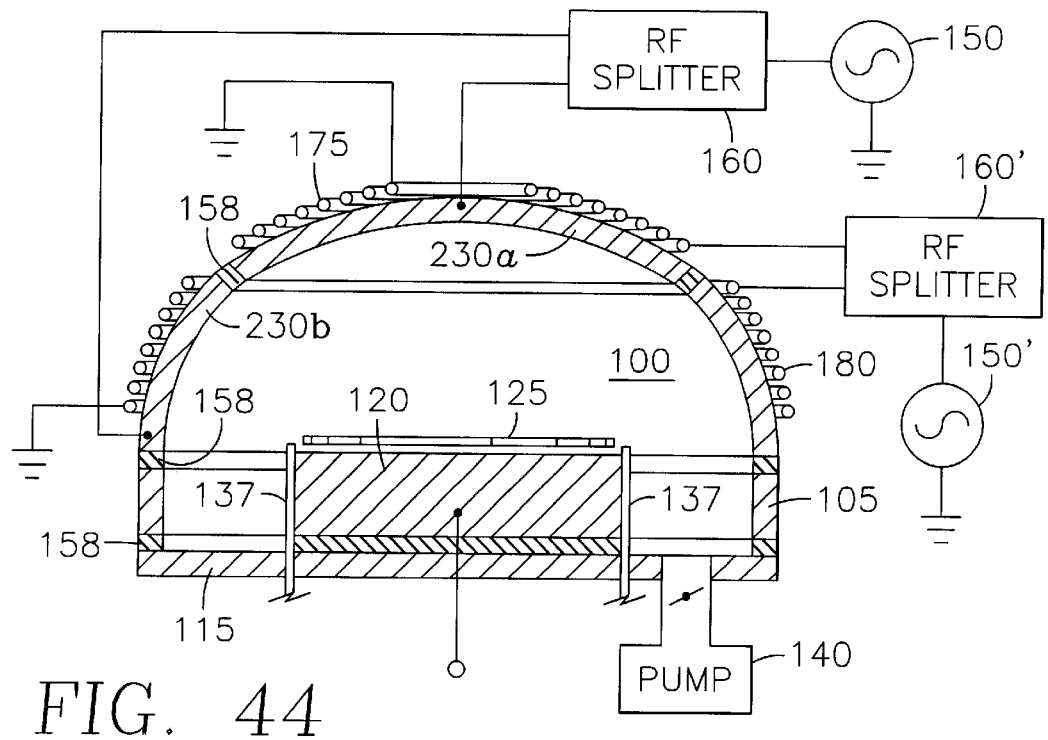
FIG. 44 illustrates an embodiment corresponding to that of FIG. 42 in which the semiconductor window is dome-shaped.
Figure 45:
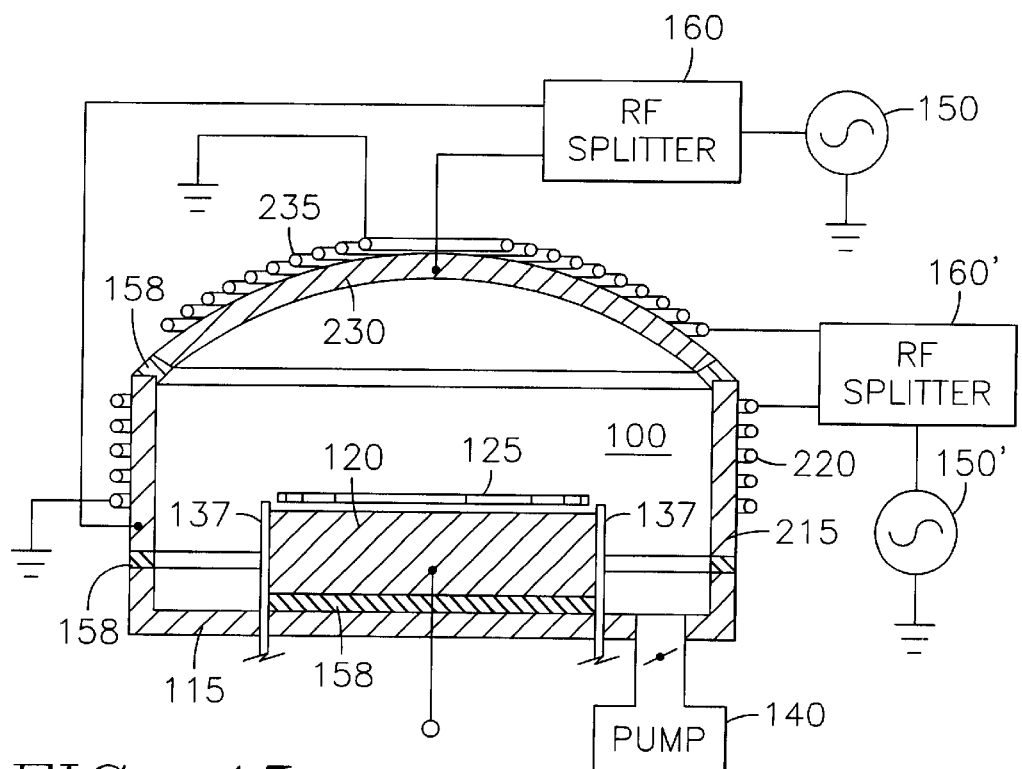
FIG. 45 illustrates an embodiment in which RF power is split between the semiconductor window electrode and a sidewall electrode, which itself may be a segmented portion of the semiconductor window electrode.

FIG. 44 illustrates an embodiment corresponding to FIG. 42 in which the split semiconductor window electrode is arcuate or dome-shaped. In FIG. 44, the semiconductor window electrode center disk 110a corresponds to the center portion of a dome while the semiconductor window electrode peripheral annulus 110b corresponds to the outer portion of a dome and a contiguous cylinder at the circumferential base of the dome. FIG. 45 illustrates a modification of the embodiment of FIG. 44 in which the curvature of the dome nearly disappears so that the center disk 110a is virtually planar while the annulus 110b is virtually a cylindrical side wall.

Figure 46:
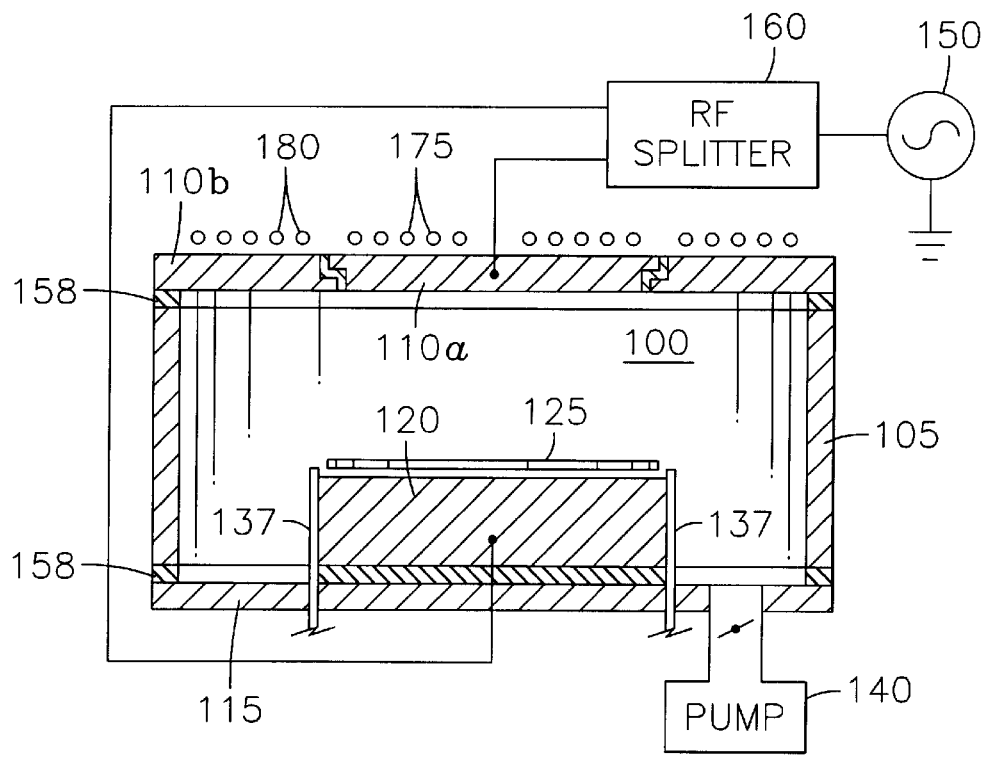
FIGS. 46 and 47 illustrate modifications of the embodiments of FIGS. 42 and 44 in which the outer segment of the semiconductor window electrode is grounded and RF power is split between the center segment of the semiconductor window electrode and the wafer pedestal.
Figure 47:
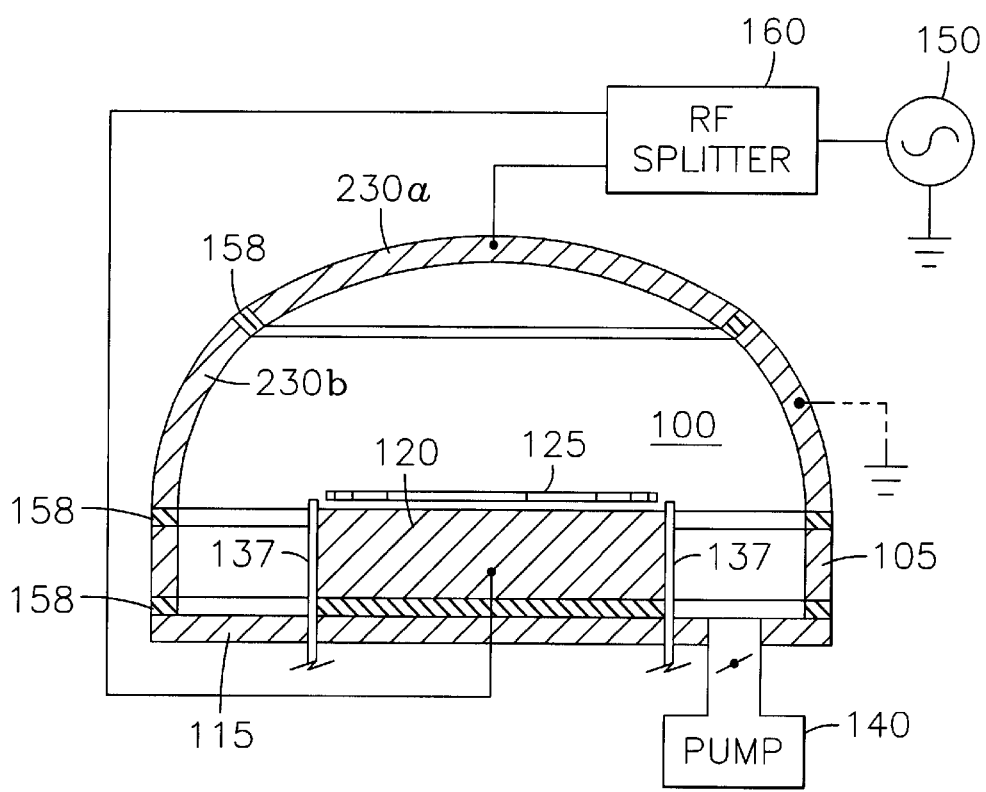

While the third terminal requisite for the RF power splitting of FIGS. 42–45 has been described as a grounded side wall, in accordance with another modification the third terminal may be the semiconductor window peripheral annulus 110b while the RF power is split between the semiconductor window center disk 110a and some other entity such as the wafer pedestal 120. FIGS. 46 and 47 illustrate how this latter modification changes the embodiments of FIGS. 42 and 44, respectively. Such a modification carried out on the embodiment of FIG. 45 results in an embodiment corresponding to that of FIG. 13B. In the embodiments of FIGS. 46 and 47, the RF power splitter 250 has one of its RF power outputs connected to the semiconductor window center disk 110a and its other output connected to the wafer pedestal 120, while the semiconductor window peripheral annulus 110b is grounded.

The effective plasma interaction area of the semiconductor window may be changed to change the ratio of the effective plasma interaction areas of the semiconductor window and the wafer/wafer pedestal. There are three regimes for this area ratio:

(1) Symmetrical: the effective plasma interaction areas are about the same (the area ratio being about 1), so that both the wafer and the semiconductor window electrode have the same plasma RF current density and the same RF and DC sheath voltage magnitudes;

(2) Not fully assymetrical: the area ratio lies in a range from 1 to a factor between 2 and 4, so that the current density and RF and DC sheath voltage magnitudes at the smaller area electrode are greater than at the larger area electrode and change significantly with further increases in the area ratio;

(3) Fully assymetrical: the area ratio exceeds a factor between 2 and 4 and the current density and RF and DC sheath voltage magnitudes do not change significantly with further increases in the area ratio, a saturation condition having been reached.

In the last case (i.e., case 3), the greater sheath voltage drop and RF current density appears at either the semiconductor window electrode or the wafer/wafer pedestal, whichever one has the smaller effective plasma interaction area. Raising the RF current density and sheath voltage drop in this manner has the same effect as raising the RF bias applied to one element (semiconductor window or wafer/pedestal) whose interaction area was reduced. As for the semiconductor window, such an change affects the rate of sputtering of scavenger material into the plasma and affects the rate of polymerization on the surface of the semiconductor electrode. As for the wafer/pedestal, such a change affects processing parameters normally affected by changes in applied bias RF power such as etch rate, etch profile and etch selectivity, for example.

The same principles apply when adjusting the ratio of effective plasma interaction areas in reactors having more than two electrodes. For example, in the embodiment of FIGS. 23 and 24, there are, in effect, four electrodes reduced to two by using electrodes which drive at one frequency and ground at another. Each pair of drive/ground electrodes is analyzed separately, with the change area ratio having the same effects as outlined in the previous paragraph. As another example, in embodiments such as FIGS. 4–12 in which a third electrode such as the cylindrical side wall is connected to a potential such as ground or another RF source, the same analysis applies, except that the apportionment of the ground return current between the grounded electrode (e.g., the cylindrical side wall) and the other terminal connected to an RF power source is determined by dynamic factors such as the phase difference between the two driven terminals as well as the effective plasma interaction area ratio. In order to maintain a constant predetermined phase difference between the two RF-driven electrodes, the invention disclosed in U.S. Pat. No. 5,349,313 by Kenneth S. Collins et al. may be employed.

The ability to establish a desired phase relationship between a pair of RF-driven elements (electrodes or inductive antennas) may be employed to apportion RF power thereto. For example, in the embodiments such as FIGS. 16, 17A, 17B and 18 employing segmented inductive antenna portions, power apportionment as between the two segmented antenna portions is described above as being accomplished by varying the magnitudes of the RF voltages applied to the respective antenna portions. However, power apportionment may also be changed by changing the phase angle between the RF voltages applied to the different antenna portions. Likewise, in the embodiments such as FIGS. 42–47 employing segmented semiconductor window portions, power apportionment as between the two segmented semiconductor window portions is described above as being accomplished by varying the magnitudes of the RF voltages applied to the respective semiconductor window portions. However, power apportionment may also be changed by changing the phase angle between the RF voltages applied to the different semiconductor window portions.

While the invention has been described by specific reference to preferred embodiments, it is understood that variations and modifications thereof may be made without departing from the true spirit and scope of the invention.

What is claimed is:

1. A plasma reactor for processing a workpiece, said reactor comprising:
   a reactor enclosure defining a processing chamber;
   a base within said chamber for supporting said workpiece during processing thereof;
   a semiconductor window electrode overlying said base;
   a gas inlet system for admitting a plasma precursor gas into said chamber;
   an electrical terminal coupled to said semiconductor window electrode;
   an inductive antenna adjacent one side of said semiconductor window electrode opposite said base for coupling power into the interior of said chamber through said semiconductor window electrode; and
   wherein said electrical terminal of said semiconductor window electrode is grounded so that said semiconductor window electrode provides a uniform ground plane relative to said workpiece.

2. A plasma reactor for processing a workpiece, said reactor comprising:
   a reactor enclosure defining a processing chamber;
   a base within said chamber for supporting said workpiece during processing thereof;
   a semiconductor window electrode overlying said base;
   a gas inlet system for admitting a plasma precursor gas into said chamber;
   an electrical terminal coupled to said semiconductor window electrode;
   an inductive antenna adjacent one side of said semiconductor window electrode opposite said base for coupling power into the interior of said chamber through said semiconductor window electrode;
   a plasma source RF power generator coupled to said inductive antenna for supplying power for said inductive field; and
   a plasma bias RF power generator coupled to said workpiece, wherein said electrical terminal of said semiconductor window electrode is connected to a counter potential of said bias RF power generator.

3. The plasma of claim 2 wherein said counter potential of said bias RF power generator is ground.

4. A plasma reactor for processing a workpiece, said reactor comprising:
   a reactor enclosure defining a processing chamber;
   a base within said chamber for supporting said workpiece during processing thereof;
   a semiconductor window electrode overlying said base;
   a gas inlet system for admitting a plasma precursor gas into said chamber;
   an electrical terminal coupled to said semiconductor window electrode;
   an inductive antenna adjacent one side of said semiconductor window electrode opposite said base for coupling power into the interior of said chamber through said semiconductor window electrode;
   wherein said workpiece is a planar substrate, said semiconductor window electrode comprises a ceiling portion of said reactor enclosure substantially parallel to and overlying said planar substrate, and said inductive antenna overlies said ceiling portion and faces said planar substrate through said semiconductor window electrode;
   a power splitter having one output coupled to said semiconductor window electrode and another output coupled to said substrate and an input for receiving power from a common source; and
   wherein said ceiling portion is one of:
      (a) planar, and
      (b) dome-shaped.

5. A plasma reactor for processing a workpiece, said reactor comprising:
   a reactor enclosure defining a processing chamber;
   a base within said chamber for supporting said workpiece during processing thereof;
   a semiconductor window electrode overlying said base;
   a gas inlet system for admitting a plasma precursor gas into said chamber;
   an electrical terminal coupled to said semiconductor window electrode;
   an inductive antenna adjacent one side of said semiconductor window electrode opposite said base for coupling power into the interior of said chamber through said semiconductor window electrode;
   wherein said workpiece is a planar substrate, said semiconductor window electrode comprises a ceiling portion of said reactor enclosure substantially parallel to and overlying said planar substrate, and said inductive antenna overlies said ceiling portion and faces said planar substrate through said semiconductor window electrode;

a first power source coupled to said semiconductor window electrode and a second power source coupled to said planar substrate; and wherein said ceiling portion is one of:
(a) planar, and
(b) dome-shaped.

6. A plasma reactor for processing a workpiece, said reactor comprising:

a reactor enclosure defining a processing chamber;

a base within said chamber for supporting said workpiece during processing thereof;

a semiconductor window electrode overlying said base;

a gas inlet system for admitting a plasma precursor gas into said chamber;

an electrical terminal coupled to said semiconductor window electrode;

an inductive antenna adjacent one side of said semiconductor window electrode opposite said base for coupling power into the interior of said chamber through said semiconductor window electrode;

wherein said workpiece is a planar substrate, said semiconductor window electrode comprises a ceiling portion of said reactor enclosure substantially parallel to and overlying said planar substrate, and said inductive antenna overlies said ceiling portion and faces said planar substrate through said semiconductor window electrode;

wherein said inductive antenna comprises an inner antenna portion overlying a center of said planar substrate and an outer antenna portion overlying a periphery of said planar substrate and electrically separated from said inner antenna portion, said reactor further comprising:

a first power source node coupled to said inner antenna portion;

a second power source node coupled to said outer antenna portion; and wherein said ceiling portion is one of:
(a) planar, and
(b) dome-shaped.

7. A plasma reactor for processing a workpiece, said reactor comprising:

a reactor enclosure defining a processing chamber;

a base within said chamber for supporting said workpiece during processing thereof;

a semiconductor window electrode overlying said base;

a gas inlet system for admitting a plasma precursor gas into said chamber;

an electrical terminal coupled to said semiconductor window electrode;

an inductive antenna adjacent one side of said semiconductor window electrode opposite said base for coupling power into the interior of said chamber through said semiconductor window electrode;

wherein said workpiece is a planar substrate, said semiconductor window electrode comprises a ceiling portion of said reactor enclosure substantially parallel to and overlying said planar substrate, and said inductive antenna overlies said ceiling portion and faces said planar substrate through said semiconductor window electrode;

a power splitter having one output coupled to said planar substrate and another output coupled to said inductive antenna and an input for receiving power from a common source; and wherein said electrical terminal of said semiconductor window electrode is connected to RF ground.

8. A plasma reactor for processing a workpiece, said reactor comprising:

a reactor enclosure defining a processing chamber;

a base within said chamber for supporting said workpiece during processing thereof;

a semiconductor window electrode overlying said base;

a gas inlet system for admitting a plasma precursor gas into said chamber;

an electrical terminal coupled to said semiconductor window electrode;

an inductive antenna adjacent one side of said semiconductor window electrode opposite said base for coupling power into the interior of said chamber through said semiconductor window electrode;

wherein said workpiece is a planar substrate, said semiconductor window electrode comprises a ceiling portion of said reactor enclosure substantially parallel to and overlying said planar substrate, and said inductive antenna overlies said ceiling portion and faces said planar substrate through said semiconductor window electrode;

a power splitter having one output coupled to said planar substrate and another output coupled to said inductive antenna and an input for receiving power from a common source; and wherein said ceiling portion is one of:
(a) planar, and
(b) dome-shaped.

9. A plasma reactor for processing a workpiece, said reactor comprising:

a reactor enclosure defining a processing chamber;

a base within said chamber for supporting said workpiece during processing thereof;

a semiconductor window electrode overlying said base;

a gas inlet system for admitting a plasma precursor gas into said chamber;

an electrical terminal coupled to said semiconductor window electrode;

an inductive antenna adjacent one side of said semiconductor window electrode opposite said base for coupling power into the interior of said chamber through said semiconductor window electrode;

wherein said semiconductor workpiece is a planar substrate, said semiconductor window electrode comprises a sidewall portion of said reactor enclosure substantially perpendicular to and surrounding a periphery of said substrate and said inductive antenna is adjacent said sidewall portion;

a bias RF power source coupled to said planar substrate, said electrical terminal of said semiconductor electrode being connected so as to enable said semiconductor window electrode to be a counter electrode to the bias RF power source coupled to said planar substrate; and wherein said electrical terminal of said semiconductor window electrode is connected to ground to provide a ground plane for said planar substrate.

10. A plasma reactor for processing a workpiece, said reactor comprising:

a reactor enclosure defining a processing chamber;

a base within said chamber for supporting said workpiece during processing thereof;

a semiconductor window electrode overlying said base;

a gas inlet system for admitting a plasma precursor gas into said chamber;

an electrical terminal coupled to said semiconductor window electrode;

an inductive antenna adjacent one side of said semiconductor window electrode opposite said base for coupling power into the interior of said chamber through said semiconductor window electrode;

wherein said semiconductor workpiece is a planar substrate, said semiconductor window electrode comprises a sidewall portion of said reactor enclosure substantially perpendicular to and surrounding a periphery of said substrate and said inductive antenna is adjacent said sidewall portion;

a power splitter having one output coupled to said semiconductor window electrode and another output coupled to said planar substrate and an input for receiving power from a common source; and a plasma source RF power generator coupled to said inductive antenna.

11. A plasma reactor for processing a workpiece, said reactor comprising:

a reactor enclosure defining a processing chamber;

a base within said chamber for supporting said workpiece during processing thereof;

a semiconductor window electrode overlying said base;

a gas inlet system for admitting a plasma precursor gas into said chamber;

an electrical terminal coupled to said semiconductor window electrode;

an inductive antenna adjacent one side of said semiconductor window electrode opposite said base for coupling power into the interior of said chamber through said semiconductor window electrode;

wherein said semiconductor workpiece is a planar substrate, said semiconductor window electrode comprises a sidewall portion of said reactor enclosure substantially perpendicular to and surrounding a periphery of said substrate and said inductive antenna is adjacent said sidewall portion;

a power splitter having one output coupled to said semiconductor window electrode and another output coupled to said inductive antenna and an input for receiving power from a common source; and a bias RF power generator coupled to said planar substrate.

12. A plasma reactor for processing a workpiece, said reactor comprising:

a reactor enclosure defining a processing chamber;

a base within said chamber for supporting said workpiece during processing thereof;

a semiconductor window electrode overlying said base;

a gas inlet system for admitting a plasma precursor gas into said chamber;

an electrical terminal coupled to said semiconductor window electrode;

an inductive antenna adjacent one side of said semiconductor window electrode opposite said base for coupling power into the interior of said chamber through said semiconductor window electrode;

wherein said semiconductor workpiece is a planar substrate, said semiconductor window electrode comprises a sidewall portion of said reactor enclosure substantially perpendicular to and surrounding a periphery of said substrate and said inductive antenna is adjacent said sidewall portion;

a power splitter having one output coupled to said planar substrate and another output coupled to said inductive antenna and an input for receiving power from a common source; and wherein said electrical terminal of said semiconductor window electrode is connected to RF ground.

13. A plasma reactor for processing a workpiece, said reactor comprising:

a reactor enclosure defining a processing chamber;

a base within said chamber for supporting said workpiece during processing thereof;

a semiconductor window electrode overlying said base;

a gas inlet system for admitting a plasma precursor gas into said chamber;

an electrical terminal coupled to said semiconductor window electrode;

an inductive antenna adjacent one side of said semiconductor window electrode opposite said base for coupling power into the interior of said chamber through said semiconductor window electrode;

wherein said semiconductor workpiece is a planar substrate, said semiconductor window electrode comprises a sidewall portion of said reactor enclosure substantially perpendicular to and surrounding a periphery of said substrate and said inductive antenna is adjacent said sidewall portion;

a power splitter having one output coupled to said planar substrate and another output coupled to said inductive antenna and an input for receiving power from a common source; and an independent RF power generator coupled to said electrical terminal of said semiconductor window.

14. A plasma reactor for processing a workpiece, said reactor comprising:

a reactor enclosure defining a processing chamber;

a base within said chamber for supporting said workpiece during processing thereof;

a semiconductor window electrode overlying said base;

a gas inlet system for admitting a plasma precursor gas into said chamber;

an electrical terminal coupled to said semiconductor window electrode;

an inductive antenna adjacent one side of said semiconductor window electrode opposite said base for coupling power into the interior of said chamber;

wherein said workpiece is a planar substrate, said semiconductor window electrode comprises a ceiling portion of said reactor enclosure substantially parallel to and overlying said planar substrate, and said inductive antenna overlies said ceiling portion and faces said planar substrate through said semiconductor window electrode;

a side semiconductor window electrode plate comprising a sidewall portion of said reactor enclosure substantially perpendicular to and surrounding a periphery of said substrate;

a side inductive antenna element adjacent said sidewall portion; and a bias RF power source coupled to said substrate, said electrical terminal of said semiconductor window electrode being connected so as to enable said semiconductor window electrode to be a counter electrode to the bias RF power source coupled to said substrate.

15. The plasma reactor of claim 14 wherein said electrical terminal of said semiconductor window electrode is connected to ground to provide a ground plane parallel to and over said planar substrate.

16. The reactor of claim 14 wherein said ceiling portion is one of:
   (a) planar, and
   (b) dome-shaped.

17. A plasma reactor for processing a workpiece, said reactor comprising:
   a reactor enclosure defining a processing chamber;
   a base within said chamber for supporting said workpiece during processing thereof;
   a semiconductor window electrode overlying said base;
   a gas inlet system for admitting a plasma precursor gas into said chamber;
   an electrical terminal coupled to said semiconductor window electrode;
   an inductive antenna adjacent one side of said semiconductor window electrode opposite said base for coupling power into the interior of said chamber through said semiconductor window electrode;
   wherein said workpiece is a planar substrate, said semiconductor window electrode comprises a ceiling portion of said reactor enclosure substantially parallel to and overlying said planar substrate, and said inductive antenna overlies said ceiling portion and faces said planar substrate through said semiconductor window electrode;
   a side semiconductor window electrode plate comprising a sidewall portion of said reactor enclosure substantially perpendicular to and surrounding a periphery of said substrate;
   a side inductive antenna element adjacent said sidewall portion; and
   a power splitter having one output coupled to said semiconductor window electrode and another output coupled to said substrate and an input for receiving power from a common source.

18. The reactor of claim 17 wherein said ceiling portion is one of:
   (a) planar, and
   (b) dome-shaped.

19. A plasma reactor for processing a workpiece, said reactor comprising:
   a reactor enclosure defining a processing chamber;
   a base within said chamber for supporting said workpiece during processing thereof;
   a semiconductor window electrode overlying said base;
   a gas inlet system for admitting a plasma precursor gas into said chamber;
   an electrical terminal coupled to said semiconductor window electrode;
   an inductive antenna adjacent one side of said semiconductor window electrode opposite said base for coupling power into the interior of said chamber through said semiconductor window electrode;
   wherein said workpiece is a planar substrate, said semiconductor window electrode comprises a ceiling portion of said reactor enclosure substantially parallel to and overlying said planar substrate, and said inductive antenna overlies said ceiling portion and faces said planar substrate through said semiconductor window electrode;
   a side semiconductor window electrode plate comprising a sidewall portion of said reactor enclosure substantially perpendicular to and surrounding a periphery of said substrate;
   a side inductive antenna element adjacent said sidewall portion; and
   a first power source coupled to said semiconductor window electrode and a second power source coupled to said planar substrate.

20. The reactor of claim 19 wherein said ceiling portion is one of:
   (a) planar, and
   (b) dome-shaped.

21. A plasma reactor for processing a workpiece, said reactor comprising:
   a reactor enclosure defining a processing chamber;
   a base within said chamber for supporting said workpiece during processing thereof;
   a semiconductor window electrode overlying said base;
   a gas inlet system for admitting a plasma precursor gas into said chamber;
   an electrical terminal coupled to said semiconductor window electrode;
   an inductive antenna adjacent one side of said semiconductor window electrode opposite said base for coupling power into the interior of said chamber through said semiconductor window electrode;
   wherein said workpiece is a planar substrate, said semiconductor window electrode comprises a ceiling portion of said reactor enclosure substantially parallel to and overlying said planar substrate, and said inductive antenna overlies said ceiling portion and faces said planar substrate through said semiconductor window electrode;
   wherein said inductive antenna comprises an inner antenna portion overlying a center of said planar substrate and an outer antenna portion overlying a periphery of said planar substrate and electrically separated from said inner antenna portion, said reactor further comprising:
   a first power source node coupled to said inner antenna portion; and
   a second power source node coupled to said outer antenna portion; and
   a power splitter having one output coupled to said first power source node of said inner inductive antenna portion and another output coupled to said second power source node of said outer inductive antenna portion, and an input for receiving power from a common source.

22. The reactor of claim 21 wherein said ceiling portion is one of:
   (a) planar, and
   (b) dome-shaped.

23. A plasma reactor for processing a workpiece, said reactor comprising:
   a reactor enclosure defining a processing chamber;
   a base within said chamber for supporting said workpiece during processing thereof;

a semiconductor window electrode overlying said base;

a gas inlet system for admitting a plasma precursor gas into said chamber;

an electrical terminal coupled to said semiconductor window electrode;

an inductive antenna adjacent one side of said semiconductor window electrode opposite said base for coupling power into the interior of said chamber through said semiconductor window electrode;

a side semiconductor window electrode plate comprising a sidewall portion of said reactor enclosure generally perpendicular to and surrounding a periphery of said substrate;

a side inductive antenna element adjacent said sidewall portion; and a power splitter having one output coupled to said inductive antenna overlying said ceiling portion and another output coupled to said inductive antenna element adjacent said sidewall portion, and an input for receiving power from a common source.

24. The reactor of claim 23 wherein said ceiling portion is one of:
   (a) planar, and
   (b) dome-shaped.

25. A plasma reactor for processing a workpiece, said reactor comprising:
   a reactor enclosure defining a processing chamber;
   a base within said chamber for supporting said workpiece during processing thereof;
   a semiconductor window electrode overlying said base;
   a gas inlet system for admitting a plasma precursor gas into said chamber;
   an electrical terminal coupled to said semiconductor window electrode;
   an inductive antenna adjacent one side of said semiconductor window electrode opposite said base for coupling power into the interior of said chamber through said semiconductor window electrode;
   wherein said semiconductor window and said workpiece are separately driven with RF power;
   wherein said workpiece is a counter electrode for said semiconductor window electrode; and
   wherein said semiconductor window electrode is a counter electrode for said workpiece.

26. The reactor of claim 25 further comprising:
   a first RF power source of a first frequency coupled to said semiconductor window electrode;
   a second RF power source of a second frequency coupled to said workpiece;
   a first ground pass filter connected between RF ground and said semiconductor window electrode, said first ground pass filter blocking RF power around said first frequency and passing RF power around said second frequency; and
   a second ground pass filter coupled between RF ground and said workpiece, said second filter blocking RF power around said second frequency and passing RF power around said first frequency.

27. The reactor of claim 26 further comprising:
   a first isolation filter connected between said first RF power source and said semiconductor window electrode for blocking RF power near said second frequency; and
   a second isolation filter connected between said second RF power source and said workpiece for block RF power near said first frequency.

28. The reactor of claim 26 wherein said semiconductor window electrode comprises a ceiling portion of said enclosure facing said workpiece and is one of:
   (a) planar, and
   (b) dome-shaped.

29. A plasma reactor for processing a workpiece, said reactor comprising:
   a reactor enclosure defining a processing chamber;
   a base within said chamber for supporting said workpiece during processing thereof;
   a semiconductor window electrode overlying said base;
   a gas inlet system for admitting a plasma precursor gas into said chamber;
   an electrical terminal coupled to said semiconductor window electrode;
   an inductive antenna adjacent one side of said semiconductor window electrode opposite said base for coupling power into the interior of said chamber; and
   a conductive backplane lying on an external surface of said semiconductor window electrode, said conductive backplane being connected directly to said electrical terminal, said conductive electrode comprising plural apertures therein for admitting an induction field of said inductive antenna through said conductive backplane.

30. The reactor of claim 29 wherein said conductive backplane comprises plural conductive radial arms separated by said apertures.

31. The reactor of claim 29 wherein said apertures have a characteristic width on the order of approximately a thickness of said semiconductor window electrode.

32. A plasma reactor for processing a workpiece, said reactor comprising:
   a reactor enclosure defining a processing chamber;
   a base within said chamber for supporting said workpiece during processing thereof;
   a semiconductor window electrode overlying said base;
   a gas inlet system for admitting a plasma precursor gas into said chamber;
   an electrical terminal coupled to said semiconductor window electrode;
   an inductive antenna adjacent one side of said semiconductor window electrode opposite said base for coupling power into the interior of said chamber through said semiconductor window electrode; and
   a structurally supportive substrate bonded to an exterior surface of said semiconductor window electrode.

33. The reactor of claim 32 further comprising a conductive backplane between said window electrode and said supportive substrate, said conductive backplane being connected directly to said electrical terminal, said conductive backplane comprising plural apertures therein for admitting an induction field of said inductive antenna through said conductive backplane.

34. The reactor of claim 32 wherein said structurally supportive substrate comprises an antenna holder supporting said inductive antenna.

35. The reactor of claim 34 further comprising a conductive backplane between said window electrode and said antenna holder, said conductive backplane being connected directly to said electrical terminal, said conductive electrode comprising plural apertures therein for admitting an induction field of said inductive antenna through said conductive backplane.

36. The reactor of claim 35 wherein said antenna holder comprises an insulating material.

37. The reactor of claim 34 wherein said antenna holder comprises a conductive material, said reactor further comprising an insulating layer between said inductive antenna and said conductive antenna holder.

38. The reactor of claim 37 wherein said conductive antenna holder functions as a conductive backplane on an exterior surface of said semiconductor window electrode.

39. The reactor of claim 37 wherein:
said inductive antenna comprises an elongate conductor extended in an arcuate path; and
said conductive antenna holder comprises an elongate groove extending in said arcuate path and holding said elongate conductor, said groove being open at a surface of said conductive antenna holder facing said semiconductor window electrode.

40. The reactor of claim 37 wherein:
said conductive antenna holder comprises an recess in a surface of said conductive antenna holder facing said semiconductor window electrode; and
said inductive antenna comprises plural elongate conductive turns held within said recess.

41. The reactor of claim 37 wherein:
said conductive antenna holder comprises an inner annular recess and an outer annular recess concentric with said inner recess in a surface of said conductive antenna holder facing said semiconductor window electrode; and
said inductive antenna comprises inner and outer sets annular concentric conductive windings held within respective ones of said inner and outer annular recesses.

42. The reactor of claim 37 further comprising a conductive backplane between said window electrode and said antenna holder, said conductive backplane being connected directly to said electrical terminal, said conductive electrode comprising plural apertures therein for admitting an induction field of said inductive antenna through said conductive backplane.

43. A plasma reactor for processing a workpiece, said reactor comprising:
a reactor enclosure defining a processing chamber;
a base within said chamber for supporting said workpiece during processing thereof;
a semiconductor window electrode overlying said base;
a gas inlet system for admitting a plasma precursor gas into said chamber;
an electrical terminal coupled to said semiconductor window electrode;
an inductive antenna adjacent one side of said semiconductor window electrode opposite said base for coupling power into the interior of said chamber through said semiconductor window electrode; and
wherein said inductive antenna comprises a non-concentrically arcuately extending elongate conductor.

44. The reactor of claim 43 wherein said non-concentrically arcuately extending elongate conductor comprises a center conductive element and plural spirals radiating outwardly from said center conductive element.

45. The reactor of claim 43 wherein said non-concentrically arcuately extending elongate conductor comprises a circumferential conductive element and plural spirals radiating inwardly from said circumferential conductive element.

46. The reactor of claim 43 wherein said non-concentrically arcuately extending elongate conductor comprises:

a center conductive element and plural spirals radiating outwardly from said center conductive element; and
a circumferential conductive element and plural spirals radiating inwardly from said circumferential conductive element.

47. The reactor of claim 43 wherein said semiconductor window electrode comprises a ceiling portion of said enclosure facing said workpiece and is one of:
(a) planar, and
(b) dome-shaped.

48. A plasma reactor for processing a workpiece, said reactor comprising:
a reactor enclosure defining a processing chamber;
a base within said chamber for supporting said workpiece during processing thereof;
a semiconductor window electrode overlying said base;
a gas inlet system for admitting a plasma precursor gas into said chamber;
an electrical terminal coupled to said semiconductor window electrode;
an inductive antenna adjacent one side of said semiconductor window electrode opposite said base for coupling power into the interior of said chamber through said semiconductor window electrode; and
wherein said inductive antenna comprises an elongate conductor extending in a non-planar path.

49. The reactor of claim 48 wherein said non-planar path comprises a three-dimensional helix.

50. The reactor of claim 48 wherein said non-planar path comprises dual concentric three-dimensional helical paths.

51. The reactor of claim 48 wherein said non-planar path comprises:
first dual concentric three-dimensional helical paths constituting an inner portion; and
second dual concentric three-dimensional helical paths constituting an outer portion concentric with said inner portion.

52. The reactor of claim 48 wherein said non-planar path comprises stacked spiral paths.

53. A plasma reactor for processing a workpiece, said reactor comprising:
a reactor enclosure defining a processing chamber;
a base within said chamber for supporting said workpiece during processing thereof;
a semiconductor window electrode overlying said base;
a gas inlet system for admitting a plasma precursor gas into said chamber;
an electrical terminal coupled to said semiconductor window electrode;
an inductive antenna adjacent one side of said semiconductor window electrode opposite said base for coupling power into the interior of said chamber through said semiconductor window electrode;
wherein said workpiece is a planar substrate, said semiconductor window electrode comprises a ceiling portion of said reactor enclosure substantially parallel to and overlying said planar substrate, and said inductive antenna overlies said ceiling portion and faces said planar substrate through said semiconductor window electrode; and
wherein said gas inlet system comprises a set of gas inlet ports through said semiconductor window electrode over said planar substrate.

54. The reactor of claim 53 further comprising:
a center gas feed top sealed onto an exterior surface of said semiconductor window electrode; and
a gas manifold formed between said center gas feed top and said semiconductor window electrode, said gas manifold encompassing said gas inlet ports.

55. The reactor of claim 54 further comprising:
a semiconductor baffle extending across said manifold and dividing said manifold into a pair of submanifolds, one of said sub-manifolds being adjacent said center gas feed top and the other of said sub-manifolds being adjacent said gas inlet ports; and
plural gas feed passages through said semiconductor baffle offset from said gas inlet ports.

56. A plasma reactor for processing a workpiece, said reactor comprising:
a reactor enclosure defining a processing chamber;
a base within said chamber for supporting said workpiece during processing thereof;
a semiconductor window electrode overlying said base;
a gas inlet system for admitting a plasma precursor gas into said chamber;
an electrical terminal coupled to said semiconductor window electrode;
an inductive antenna adjacent one side of said semiconductor window electrode opposite said base for coupling power into the interior of said chamber through said semiconductor window electrode; and
a grounded Faraday shield layer between and insulated from said inductive antenna and said semiconductor window electrode.

57. The reactor of claim 56 wherein said semiconductor window electrode, said inductive antenna and said Faraday shield layer are all one of:
(a) dome-shaped;
(b) cylindrical.

58. A plasma reactor for processing a workpiece, said reactor comprising:
a reactor enclosure defining a processing chamber;
a base within said chamber for supporting said workpiece during processing thereof;
a semiconductor window electrode overlying said base;
a gas inlet system for admitting a plasma precursor gas into said chamber;
an electrical terminal coupled to said semiconductor window electrode;
an inductive antenna adjacent one side of said semiconductor window electrode opposite said base for coupling power into the interior of said chamber through said semiconductor window electrode; and
wherein said semiconductor window electrode comprises silicon.

59. A plasma reactor for processing a workpiece, said reactor comprising:
a reactor enclosure defining a processing chamber;
a base within said chamber for supporting said workpiece during processing thereof;
a semiconductor window electrode overlying said base;
a gas inlet system for admitting a plasma precursor gas into said chamber;
an electrical terminal coupled to said semiconductor window electrode;
an inductive antenna adjacent one side of said semiconductor window electrode opposite said base for coupling power into the interior of said chamber through said semiconductor window electrode;
wherein said workpiece is a planar substrate, said semiconductor window electrode comprises a ceiling portion of said reactor enclosure substantially parallel to and overlying said planar substrate, and said inductive antenna overlies said ceiling portion and faces said planar substrate through said semiconductor window electrode; and
wherein said semiconductor electrode is within 1–20 centimeters of said planar substrate and is parallel therewith.

60. A plasma reactor for processing a workpiece, said reactor comprising:
a reactor enclosure defining a processing chamber;
a base within said chamber for supporting said workpiece during processing thereof;
a semiconductor window electrode overlying said base;
a gas inlet system for admitting a plasma recursor gas into said chamber;
an electrical terminal coupled to said semiconductor window electrode;
an inductive antenna adjacent one side of said semiconductor window electrode opposite said base for coupling power into the interior of said chamber through said semiconductor window electrode; and
at least one of:
(a) a heat sink thermally coupled to said semiconductor window for controlling a temperature of said semiconductor window;
(b) a cold sink thermally coupled to said semiconductor window for controlling a temperature of said semiconductor window.

61. A plasma reactor for processing a workpiece, said reactor comprising:
a reactor enclosure defining a processing chamber;
a base within said chamber for supporting said workpiece during processing thereof;
a semiconductor window electrode overlying said base;
a gas inlet system for admitting a plasma precursor gas into said chamber;
an electrical terminal coupled to said semiconductor window electrode;
an inductive antenna adjacent one side of said semiconductor window electrode opposite said base for coupling power into the interior of said chamber through said semiconductor window electrode; and
wherein said semiconductor window is comprised of a material containing silicon.

62. A plasma reactor for processing a workpiece, said reactor comprising:
a reactor enclosure defining a processing chamber;
a base within said chamber for supporting said workpiece during processing thereof;
a semiconductor window electrode overlying said base;
a gas inlet system for admitting a plasma precursor gas into said chamber;
an electrical terminal coupled to said semiconductor window electrode;
an inductive antenna adjacent one side of said semiconductor window electrode opposite said base for coupling power into the interior of said chamber through said semiconductor window electrode; and wherein said semiconductor window is a scavenger for fluorine.

63. The reactor of claim 53 wherein said gas inlet ports are substantially confined to a center portion of said semiconductor window electrode.

64. The reactor of claim 53 wherein said gas inlet ports are located near a peripheral portion of said semiconductor window electrode.

65. A plasma reactor for processing a workpiece, said reactor comprising:
 a reactor enclosure defining a processing chamber;
 a base within said chamber for supporting said workpiece during processing thereof;
 a semiconductor window electrode overlying said base;
 a gas inlet system for admitting a plasma precursor gas into said chamber;
 an electrical terminal coupled to said semiconductor window electrode;
 an inductive antenna adjacent one side of said semiconductor window electrode opposite said base for coupling power into the interior of said chamber through said semiconductor window electrode; and
 wherein said semiconductor window electrode is segmented into sub-portions.

66. The reactor of claim 65 wherein said subportions are concentric.

67. The reactor of claim 65 wherein said subportions comprise:
 a semiconductor window center disk; and
 a semiconductor window peripheral annulus concentric with said center disk.

68. The reactor of claim 67 further comprising an RF power splitter connected to receive RF power from a single source and having a pair of RF power outputs connected, respective ones of said pair of RF power outputs being connected to said semiconductor window center disk and semiconductor window peripheral annulus.

69. The reactor of claim 67 wherein said semiconductor window disk and semiconductor window annulus are conformal with a dome shape.

70. A plasma reactor for processing a workpiece, said reactor comprising:
 a reactor enclosure defining a processing chamber;
 a base within said chamber for supporting said workpiece during processing thereof;
 a semiconductor window electrode overlying said base;
 a gas inlet system for admitting a plasma precursor gas into said chamber;
 an electrical terminal coupled to said semiconductor window electrode;
 an inductive antenna adjacent one side of said semiconductor window electrode opposite said base for coupling power into the interior of said chamber through said semiconductor window electrode;
 wherein said workpiece is a planar substrate, said semiconductor window electrode comprises a ceiling portion of said reactor enclosure substantially parallel to and overlying said planar substrate, and said inductive antenna overlies said ceiling portion and faces said planar substrate through said semiconductor window electrode;
 wherein said inductive antenna comprises an inner antenna portion overlying a center of said planar substrate and an outer antenna portion overlying a periphery of said planar substrate and electrically separated from said inner antenna portion, said reactor further comprising:
 a first power source node coupled to said inner antenna portion;
 a second power source node coupled to said outer antenna portion; and
 wherein said semiconductor window electrode is segmented into concentric sub-portions comprising:
 a semiconductor window center disk, and
 a semiconductor window peripheral annulus concentric with said center disk.

71. The reactor of claim 21 wherein said semiconductor window electrode is segmented into concentric sub-portions comprising a semiconductor window center disk and a semiconductor window peripheral annulus concentric with said center disk, said reactor further comprising:
 a second RF power splitter connected to receive RF power from a single source and having a pair of RF power outputs connected, respective ones of said pair of RF power outputs being connected to said semiconductor window center disk and semiconductor window peripheral annulus.

72. The reactor of claim 71 wherein said semiconductor window and said inductive antenna are one of:
 (a) planar; and
 (b) dome-shaped.

73. The reactor of claim 71 wherein said semiconductor window center disk is planar and said semiconductor window peripheral annulus comprises a cylindrical side wall.

74. The reactor of claim 67 further comprising an RF power splitter having a pair of RF power outputs connected, respectively, to said semiconductor window center disk and said base whereby to split RF power from a single source between said disk and said base.

75. The reactor of claim 74 wherein said semiconductor window peripheral annulus provides an RF return path.

76. The reactor of claim 75 wherein said semiconductor window is grounded.

77. The reactor of claim 74 wherein said semiconductor window and said inductive antenna are one of:
 (a) planar; and
 (b) dome-shaped.

78. A plasma reactor for processing a workpiece, said reactor comprising:
 a reactor enclosure defining a chamber;
 a base within said chamber for supporting said workpiece;
 a semiconductor window overlying said base;
 an inductive antenna adjacent a side of said semiconductor window opposite said base;
 wherein said inductive antenna is outside of said chamber; and
 wherein said semiconductor window forms a portion of said reactor enclosure.

79. A plasma reactor for processing a planar substrate, said reactor comprising:
 a reactor enclosure defining a processing chamber;
 a base within said chamber for supporting said planar substrate during processing thereof;
 a semiconductor window overlying said base;
 a gas inlet system comprising a set of gas inlet ports through said semiconductor window electrode over said planar substrate for admitting a plasma precursor gas into the portion of said chamber overlying said planar substrate;

an inductive antenna overlying said semiconductor window for coupling power into the interior of said chamber through said semiconductor window, said inductive antenna comprising:
 (a) an inner antenna portion overlying a center of said planar substrate, and
 (b) an outer antenna portion overlying a periphery of said planar substrate and electrically separated from said inner antenna portion so as to be separately controllable.

80. The reactor of claim 79 further comprising:

a power splitter having one output coupled to said inner antenna portion and another output coupled to said outer antenna portion, and an input for receiving power from a common source; and a controller regulating said power splitter to apportion of RF power between said inner and outer antenna portions so as to optimize process uniformity across the surface of said planar substrate.

81. The reactor of claim 80 wherein said ceiling portion is one of:
 (a) planar, and
 (b) dome-shaped.

82. A plasma reactor for processing a planar substrate, said reactor comprising:

a reactor enclosure defining a processing chamber;

a base within said chamber for supporting said planar substrate during processing thereof;

a semiconductor window overlying said base, said semiconductor window comprising:
 (a) an inner window portion overlying a center of said planar substrate, and
 (b) an outer window portion overlying a periphery of said planar substrate and electrically separated from said inner window portion so as to be separately controllable;

a gas inlet system comprising a set of gas inlet ports through said semiconductor window electrode over said planar substrate for admitting a plasma precursor gas into the portion of said chamber overlying said planar substrate; and an inductive antenna overlying said semiconductor window for coupling power into the interior of said chamber through said semiconductor window.

83. The reactor of claim 82, wherein said inductive antenna comprises:
 (a) an inner antenna portion overlying a center of said planar substrate, and
 (b) an outer antenna portion overlying a periphery of said planar substrate and electrically separated from said inner antenna portion so as to be separately controllable.

* * * * *